United States Patent
Choe et al.

(10) Patent No.: US 9,548,123 B2
(45) Date of Patent: *Jan. 17, 2017

(54) OPERATING METHODS OF NONVOLATILE MEMORY DEVICES INCLUDING A GROUND SELECT TRANSISTOR AND FIRST AND SECOND DUMMY MEMORY CELLS

(71) Applicant: Samsung Electronics Co., Ltd., Suwon-si, Gyeonggi-do (KR)

(72) Inventors: Byeong-In Choe, Yongin-si (KR); Jaehoon Jang, Seongnam-si (KR); Kihyun Kim, Hwaseong-si (KR); Sunil Shim, Seoul (KR); Woonkyung Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/820,703

(22) Filed: Aug. 7, 2015

(65) Prior Publication Data

US 2015/0348636 A1 Dec. 3, 2015

Related U.S. Application Data

(63) Continuation of application No. 13/784,969, filed on Mar. 5, 2013, now Pat. No. 9,136,005, and a (Continued)

(30) Foreign Application Priority Data

Nov. 16, 2010 (KR) .......................... 10-2010-0114025
Mar. 5, 2012 (KR) .......................... 10-2012-0022344

(51) Int. Cl.
*G11C 16/00* (2006.01)
*G11C 7/00* (2006.01)
(Continued)

(52) U.S. Cl.
CPC ................. *G11C 16/14* (2013.01); *G11C 7/14* (2013.01); *G11C 16/0483* (2013.01);
(Continued)

(58) Field of Classification Search
CPC ..... G11C 16/14; G11C 16/10; G11C 16/0483; G11C 16/30; G11C 7/14; G11C 16/16; H01L 27/11582; H01L 29/7926
See application file for complete search history.

(56) References Cited

U.S. PATENT DOCUMENTS 6,262,926 B1   7/2001  Nakai
7,263,000 B2   8/2007  Hazama et al.
(Continued)

FOREIGN PATENT DOCUMENTS

CN          1691339 A      11/2005
JP         2002-150782      5/2002
(Continued)

*Primary Examiner* — J. H. Hur
(74) *Attorney, Agent, or Firm* — Myers Bigel, P.A.

(57) ABSTRACT

A nonvolatile memory device includes a substrate and a plurality of cell strings provided on the substrate, each cell string including a plurality of memory cells stacked in a direction perpendicular to the substrate. The methods may include applying a word line erase voltage to word lines connected to memory cells of the cell strings; floating ground selection lines connected to ground selection transistors of the cell strings and string selection lines connected to string selection transistors of the plurality of cell strings; applying a ground voltage to at least one lower dummy word line connected to at least one lower dummy memory cell between memory cells and a ground selection transistor in each of the plurality of cell strings; applying an erase voltage to the substrate; and floating the at least one lower dummy word line after applying of the erase voltage.

20 Claims, 50 Drawing Sheets

Related U.S. Application Data continuation-in-part of application No. 13/295,335, filed on Nov. 14, 2011, now Pat. No. 8,873,294.

(51) Int. Cl.
| | |
|---|---|
| *H01L 29/00* | (2006.01) |
| *H01L 27/11* | (2006.01) |
| *G11C 16/14* | (2006.01) |
| *G11C 7/14* | (2006.01) |
| *G11C 16/04* | (2006.01) |
| *G11C 16/30* | (2006.01) |
| *H01L 29/792* | (2006.01) |
| *H01L 27/115* | (2006.01) |
| *G11C 16/10* | (2006.01) |
| *G11C 16/16* | (2006.01) |

(52) U.S. Cl.
CPC .............. *G11C 16/10* (2013.01); *G11C 16/30* (2013.01); *H01L 27/11582* (2013.01); *H01L 29/7926* (2013.01); *G11C 16/16* (2013.01)

(56) References Cited

U.S. PATENT DOCUMENTS

| | | | |
|---|---|---|---|
| 7,304,892 B2 | 12/2007 | Lee | |
| 7,450,433 B2 | 11/2008 | Wan et al. | |
| 7,499,325 B2 | 3/2009 | Doyle et al. | |
| 7,924,622 B2 | 4/2011 | Lee et al. | |
| 8,004,900 B2 | 8/2011 | Dutta et al. | |
| 8,018,782 B2 | 9/2011 | Park et al. | |
| 8,134,873 B2 | 3/2012 | Choi et al. | |
| 8,837,228 B2* | 9/2014 | Nam | G11C 16/14 365/185.11 |
| 9,136,005 B2* | 9/2015 | Choe | G11C 16/14 |
| 9,281,070 B2* | 3/2016 | Nam | G11C 16/14 |
| 2006/0239077 A1 | 10/2006 | Park et al. | |
| 2007/0252201 A1 | 11/2007 | Kito et al. | |
| 2008/0137409 A1 | 6/2008 | Nakamura et al. | |
| 2008/0181020 A1 | 7/2008 | Yu et al. | |
| 2009/0046505 A1 | 2/2009 | Lee et al. | |
| 2009/0262576 A1 | 10/2009 | Moon et al. | |
| 2009/0287879 A1 | 11/2009 | Oh et al. | |
| 2010/0128522 A1 | 5/2010 | Choi et al. | |
| 2011/0149659 A1 | 6/2011 | Goda et al. | |
| 2011/0216603 A1 | 9/2011 | Han et al. | |

FOREIGN PATENT DOCUMENTS

| | | |
|---|---|---|
| KR | 1020070070477 A | 7/2007 |
| KR | 1020080024971 A | 3/2008 |
| KR | 1020090092942 A | 9/2009 |
| KR | 2009-0132890 A | 12/2009 |
| KR | 1020100010691 A | 2/2010 |
| KR | 1020100060274 A | 6/2010 |
| KR | 1020110100579 A | 9/2011 |

\* cited by examiner

Fig. 8

| SSL | Float |
|---|---|
| WL | Vwe |
| GSL | Float |
| Substrate | Vers |

Fig. 36

| SSL | Float |
|---|---|
| DWL2 | VSS → Float |
| WL1 ~ WL4 | VWE |
| DWL1 | VSS → Float |
| GSL | Float |
| Substrate | VERS |

Fig. 39

| SSL | VSS → Float |
|---|---|
| DWL2 | VSS → Float |
| WL1 ~ WL4 | VWE |
| DWL1 | VSS → Float |
| GSL | VSS → Float |
| Substrate | VERS |

Fig. 41

| Selected SSL | VCC |
|---|---|
| Unselected SSL | VSS |
| DWL2 | VPASSD |
| Selected WL | VPASS → VPGM |
| Unselected WL | VPASS |
| DWL1 | VPASSD |
| GSL | VSS |

OPERATING METHODS OF NONVOLATILE MEMORY DEVICES INCLUDING A GROUND SELECT TRANSISTOR AND FIRST AND SECOND DUMMY MEMORY CELLS

CROSS-REFERENCE TO RELATED APPLICATIONS

This application claims priority under 35 U.S.C. §120 as a continuation of U.S. patent application Ser. No. 13/784,969 filed Mar. 5, 2013 which is a continuation-in-part of U.S. patent application Ser. No. 13/295,335 filed Nov. 14, 2011 and claims priority under 35 U.S.C. §119 to Korean Patent Application No. 10-2012-0022344 filed Mar. 5, 2012, in the Korean Intellectual Property Office, and to Korean Patent Application No. 10-2010-0114025 filed Nov. 16, 2010 in the Korean Intellectual Property Office, the entire contents of which are hereby incorporated by reference.

BACKGROUND

The inventive concepts described herein relate to a semiconductor memory device, and more particularly, relate to an operating method of a nonvolatile memory device.

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

In recent, a semiconductor memory device with a three-dimensional array structure has been developed to improve the integrity of the semiconductor memory device.

SUMMARY

Some embodiments of the inventive concept disclosed herein include methods of operating a nonvolatile memory device. Such methods may include applying a word line erase voltage to word lines connected to memory cells of multiple cell strings provided on a substrate, ones of the cell strings including multiple memory cells stacked in a direction that is perpendicular to the substrate. Methods may further include floating multiple ground selection lines connected to ground selection transistors of the cell strings, floating multiple string selection lines connected to string selection transistors of the cell strings, and applying a ground voltage to at least one lower dummy word line connected to at least one lower dummy memory cell between memory cells and a ground selection transistor in each of the cell strings. An erase voltage may be applied to the substrate and the at least one lower dummy word line is floated after the erase voltage is applied to the substrate.

In some embodiments, floating the at least one lower dummy word line after applying the erase voltage to the substrate includes floating the at least one lower dummy word line when a voltage of the substrate reaches a reference voltage. Some embodiments provide that floating the at least one lower dummy word line after applying the erase voltage to the substrate includes floating the at least one lower dummy word line when the erase voltage is applied to the substrate and a time elapses from when the erase voltage is applied to the substrate.

Some embodiments include performing a program operation that includes applying a turn-off voltage to the ground selection line and applying a pass voltage to the at least one lower dummy word line.

Some embodiments include applying the ground voltage to at least one upper dummy word line connected to at least one upper dummy memory cell between memory cells and a string selection transistor in each of the cell strings and floating the at least one upper dummy word line after the erase voltage is applied to the substrate. Some embodiments provide that floating the at least one upper dummy word line after the erase voltage is applied to the substrate includes floating the at least one upper dummy word line when a voltage of the substrate reaches a reference voltage.

In some embodiments, floating the at least one upper dummy word line after the erase voltage is applied to the substrate includes floating the at least one upper dummy word line when the erase voltage is applied to the substrate and a time elapses.

Some embodiments provide that each of the cell strings includes a ground selection transistor, at least one lower dummy memory cell, memory cells, at least one upper dummy memory cell, and a string selection transistor that are sequentially stacked over the substrate in a direction perpendicular to the substrate.

Example embodiments of the inventive concept provide methods of operating a nonvolatile memory device which includes a substrate and a plurality of cell strings provided on the substrate, each cell string including a plurality of memory cells stacked in a direction perpendicular to the substrate. The methods may include applying a word line erase voltage to word lines connected to memory cells of the plurality of cell strings; floating ground selection lines connected to ground selection transistors of the plurality of cell strings and string selection lines connected to string selection transistors of the plurality of cell strings; applying a ground voltage to at least one lower dummy word line connected to at least one lower dummy memory cell between memory cells and a ground selection transistor in each of the plurality of cell strings; applying an erase voltage to the substrate; and floating the at least one lower dummy word line after applying of the erase voltage.

In example embodiments, floating the at least one lower dummy word line after applying of the erase voltage includes floating the at least one lower dummy word line when a voltage of the substrate reaches a reference voltage.

In example embodiments, floating the at least one lower dummy word line after applying of the erase voltage includes floating the at least one lower dummy word line when the erase voltage is applied to the substrate and a time elapses.

In example embodiments, at a program operation, a turn-off voltage is applied to the ground selection line and a pass voltage is applied to the at least one lower dummy word line.

In example embodiments, the methods further include applying a ground voltage to at least one upper dummy word line connected to at least one upper dummy memory cell between memory cells and a string selection transistor in each of the cell strings; and floating the at least one upper dummy word line after the erase voltage is applied to the substrate.

In example embodiments, the floating the at least one upper dummy word line after the erase voltage is applied to the substrate includes floating the at least one upper dummy word line when a voltage of the substrate reaches a reference voltage.

In example embodiments, the floating the at least one upper dummy word line after the erase voltage is applied to the substrate includes floating the at least one upper dummy word line when the erase voltage is applied to the substrate and a time elapses.

In example embodiments, each of the cell strings includes a ground selection transistor, at least one lower dummy memory cell, memory cells, at least one upper dummy memory cell, and a string selection transistor that are sequentially stacked over the substrate in a direction perpendicular to the substrate.

Example embodiments of the inventive concept also provide methods of operating a nonvolatile memory device which includes a substrate and multiple cell strings provided on the substrate, each cell string including multiple memory cells stacked in a direction perpendicular to the substrate. The methods may include applying a word line erase voltage to word lines connected to memory cells of the cell strings; applying a ground voltage to ground selection lines connected to ground selection transistors of the cell strings and string selection lines connected to string selection transistors of the cell strings; applying a ground voltage to at least one lower dummy word line connected to at least one lower dummy memory cell between memory cells and a ground selection transistor in each of the cell strings; applying an erase voltage to the substrate; and floating the at least one lower dummy word line, a ground selection line, and a string selection line after applying of the erase voltage.

In example embodiments, the floating the at least one lower dummy word line, a ground selection line, and a string selection line after applying of the erase voltage includes floating the at least one lower dummy word line, the ground selection line, and the string selection line when a voltage of the substrate reaches a reference voltage.

In example embodiments, the floating the at least one lower dummy word line, a ground selection line, and a string selection line after applying of the erase voltage includes floating the at least one lower dummy word line, the ground selection line, and the string selection line when the erase voltage is applied to the substrate and a time elapses.

In example embodiments, the methods may include applying a ground voltage to at least one upper dummy word line connected to at least one upper dummy memory cell between memory cells and a string selection transistor in each of the cell strings; and floating the at least one upper dummy word line after the erase voltage is applied to the substrate.

In example embodiments, the floating the at least one upper dummy word line after the erase voltage is applied to the substrate comprises floating the at least one upper dummy word line when a voltage of the substrate reaches a reference voltage.

In example embodiments, the floating the at least one upper dummy word line after the erase voltage is applied to the substrate comprises floating the at least one upper dummy word line when the erase voltage is applied to the substrate and a time elapses.

In example embodiments, at a program operation, a turn-off voltage is applied to the at least one ground selection line and a pass voltage is applied to the at least one lower dummy word line.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE FIGURES

The above and other objects and features will become apparent from the following description with reference to the following figures, wherein like reference numerals refer to like parts throughout the various figures unless otherwise specified.

FIG. 8 is a diagram illustrating a voltage condition of a nonvolatile memory device in FIG. 1 at an erase operation.

FIG. 36 is a table illustrating a voltage condition of a memory cell array at an erase operation.

FIG. 39 is a table illustrating a voltage condition of a memory cell array at an erase operation.

FIG. 41 is a table illustrating a voltage condition of a memory cell array when a program operation is performed.

DETAILED DESCRIPTION

Figure 1:
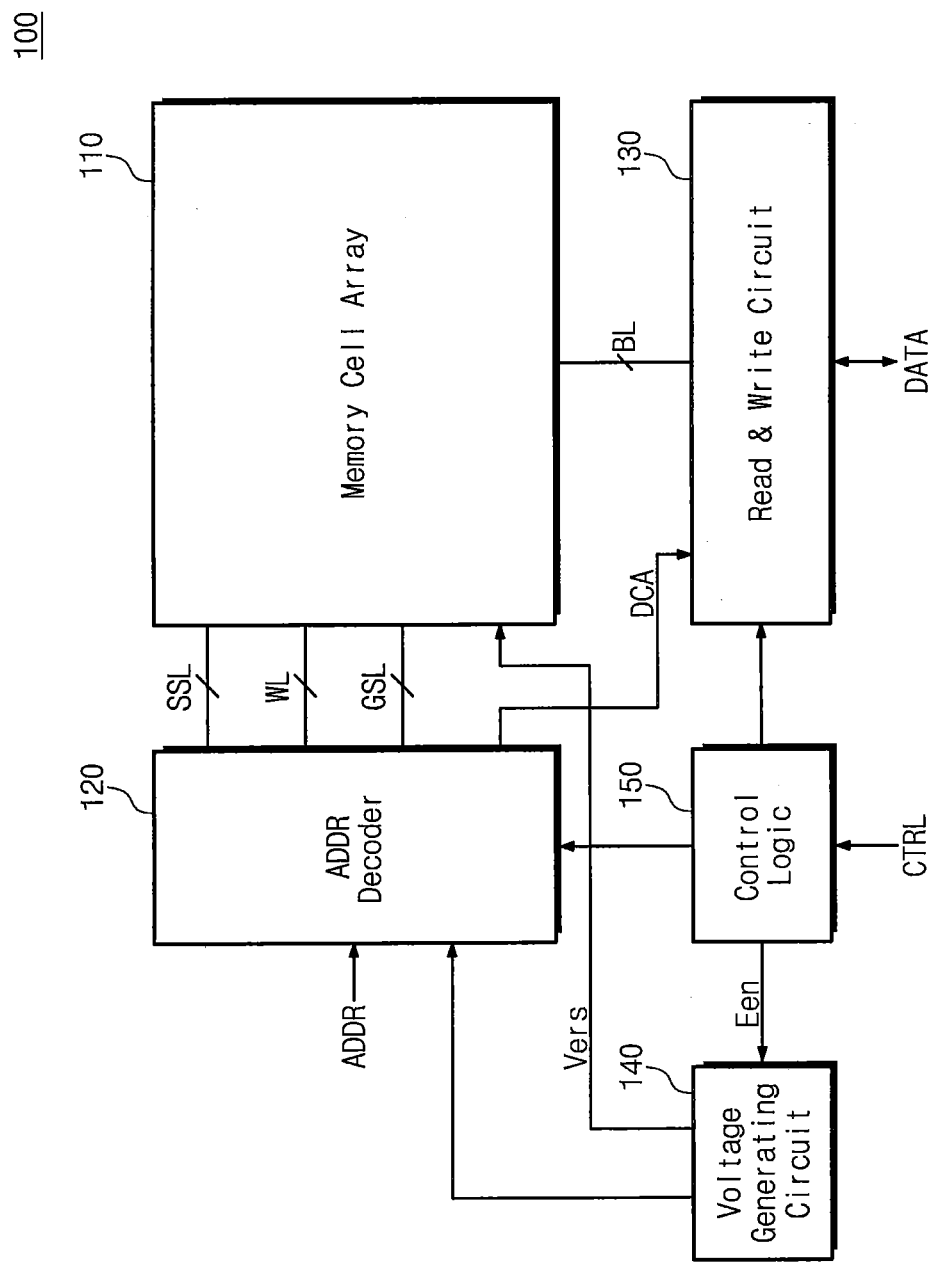
FIG. 1 is a block diagram illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device according to an embodiment of the inventive concept. Referring to FIG. 1, a nonvolatile memory device 100 may include a memory cell array 110, an address decoder 120, a read/write circuit 130, a voltage generating circuit 140, and control logic 150.

The memory cell array 110 may include a plurality of memory cell groups. For example, the memory cell array 110 may include a plurality of cell strings which are arranged on a substrate along row and column directions. Each cell string may include a plurality of memory cells stacked along a direction perpendicular to the substrate. That is, the memory cells may be provided on the substrate along rows and columns and may be stacked in a direction perpendicular to the substrate to form a three-dimensional structure. In example embodiments, each memory cell of the memory cell array 110 may store one or more bits of data.

The address decoder 120 may be coupled with the memory cell array 110 via word lines WL, string selection lines SSL, and ground selection lines GSL. The address decoder 120 may be configured to operate responsive to the control of the control logic 150. The address decoder 120 may receive an address ADDR from an external device.

The address decoder 120 may be configured to decode a row address of the input address ADDR. The address decoder 120 may be configured to select a word line corresponding to a decoded row address of the word lines WL. The address decoder 120 may be configured to select a string selection line SSL and a ground selection line GSL, corresponding to the decoded row address, of the string selection lines SSL and the ground selection lines GSL.

The address decoder 120 may be configured to decode a column address of the input address ADDR. The address decoder 120 may provide the decoded column address DCA to the read/write circuit 130.

In example embodiments, the address decoder 120 may include a row decoder decoding a row address, a column decoder decoding a column address, and an address buffer storing the input address ADDR.

The read/write circuit 130 may be coupled with the memory cell array 110 via bit lines BL. The read/write circuit 130 may be configured to exchange data with an external device. The read/write circuit 130 may operate responsive to the control of the control logic 150. The read/write circuit 130 may select bit lines. BL in response to the decoded column address DCA provided from the address decoder 120.

In example embodiments, the read/write circuit 130 may receive data from an external device to write it in the memory cell array 110. The read/write circuit 130 may read data from the memory cell array 110 to output it to the external device. The read/write circuit 130 may read data from the first storage area of the memory cell array 110 to write it in the second storage area thereof. That is, the read/write circuit 130 may perform a copy-back operation.

In example embodiments, the read/write circuit 130 may include constituent elements such as a page buffer (or, a page register), a column selecting circuit, a data buffer, and the like. In another exemplary embodiment, the read/write circuit 130 may include constituent elements such as a sense amplifier, a write driver, a column selecting circuit, a data buffer, and the like.

The voltage generating circuit 140 may operate responsive to the control of the control logic 150. The voltage generating circuit 140 may be configured to generate various voltages for the nonvolatile memory device 100. In example embodiments, the voltage generating circuit 140 may be configured to supply an erase voltage Vers to the memory cell array 110 in response to an erase enable signal Een. The voltage generating circuit 140 may be configured to drive the ground selection lines GSL, the word lines WL, and the string selection lines SSL via the address decoder 120 in response to the erase enable signal Een.

The control logic 150 may be coupled with the address decoder 120, the read/write circuit 130, and the voltage generating circuit 140. The control logic 150 may be configured to control an overall operation of the nonvolatile memory device 100. At an erase operation, the control logic 150 may be configured to provide the erase enable signal Een to the voltage generating circuit 140.

Figure 2:
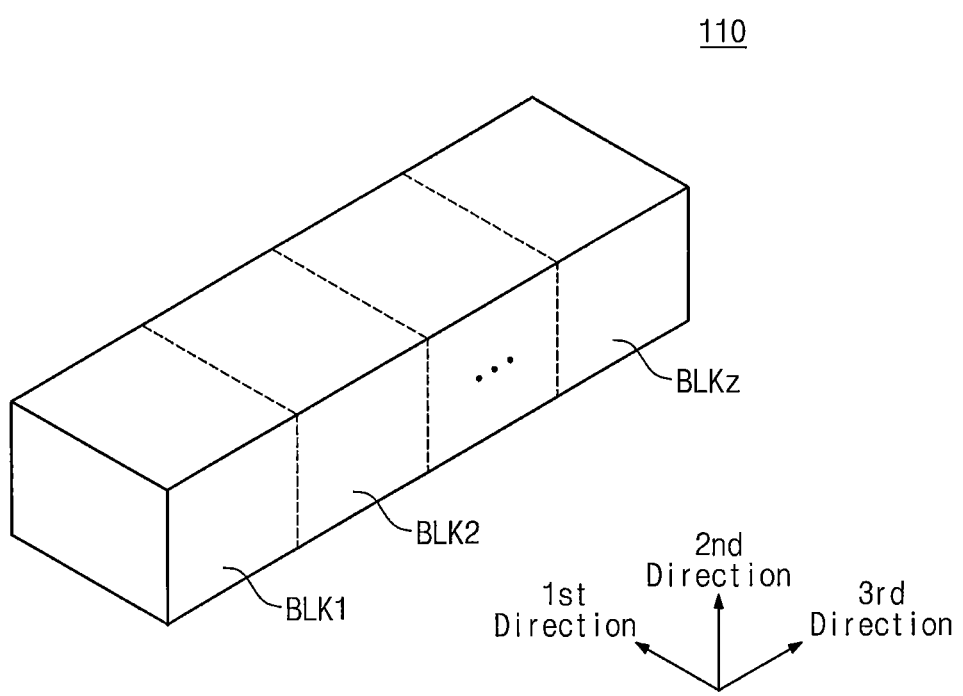
FIG. 2 is a diagram illustrating a memory cell array in FIG. 1 according to an embodiment of the inventive concept.

FIG. 2 is a diagram illustrating a memory cell array in FIG. 1 according to an embodiment of the inventive concept. Referring to FIGS. 1 and 2, a memory cell array 110 may include a plurality of memory blocks BLK1 to BLKz, each of which is connected with a plurality of bit lines BL, a plurality of string selection lines SSL, a plurality of word lines WL, a ground selection line GSL, and a common source line CSL.

In example embodiments, the plurality of memory blocks BLK1 to BLKz may be selected by an address decoder 120 in FIG. 1. For example, the address decoder 120 may be configured to select a memory block corresponding to an input address ADDR among the plurality of memory blocks BLK1 to BLKz.

Each of the memory blocks BLK1 to BLKz may be formed to have a three-dimensional structure (or, a vertical structure). For example, each of the memory blocks BLK1 to BLKz may include structures extending along the first to third directions. Although not shown in FIG. 2, each of the memory blocks BLK1 to BLKz may include a plurality of cell strings extending along the second direction. Although not shown in FIG. 2, a plurality of cell strings may be spaced apart from one other along the first and third directions. Each cell string may be coupled with a bit line BL, a string selection line SSL, a plurality of word lines WL, a ground selection line GSL, and a common source line CSL.

Figure 3:
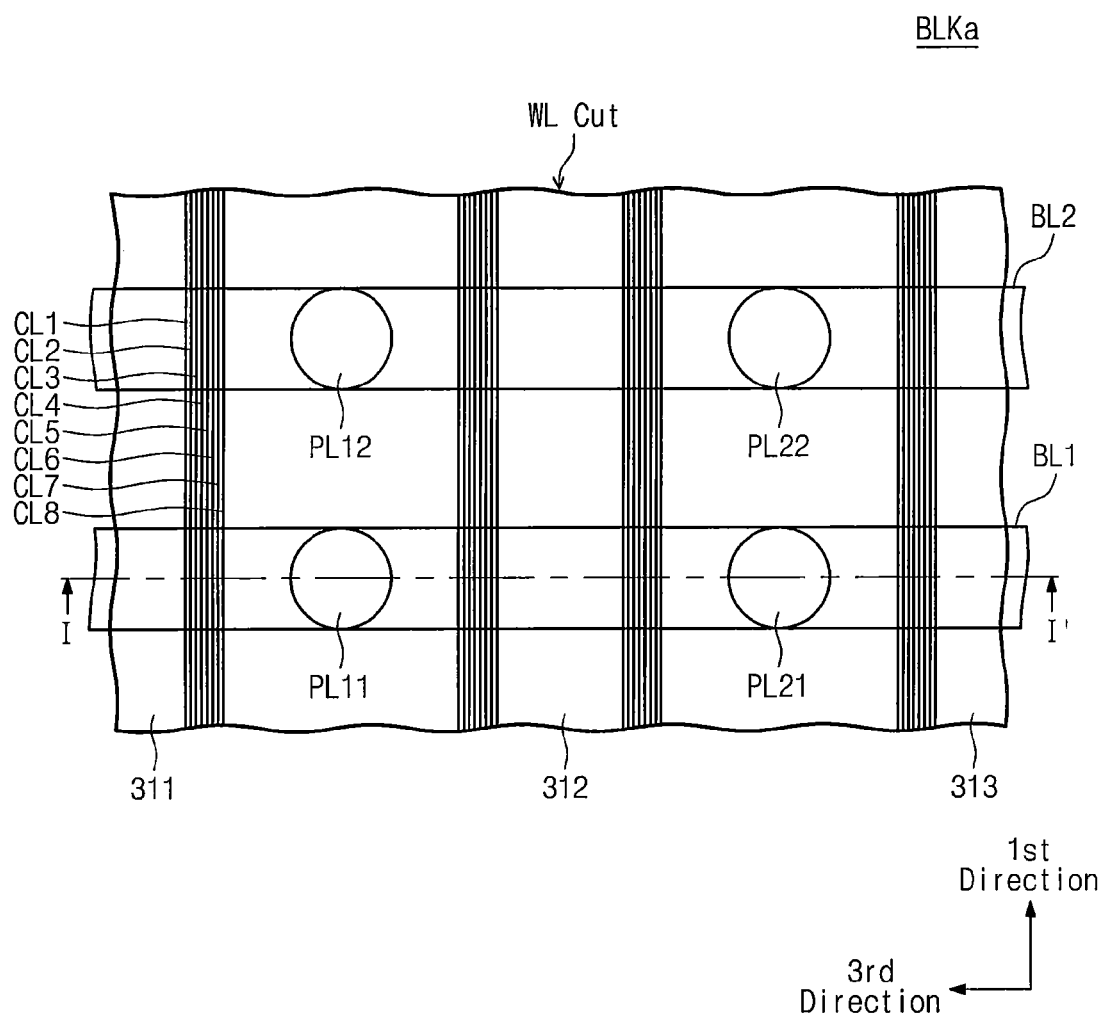
FIG. 3 is a plane diagram of one of memory blocks in FIG. 1 according to an embodiment of the inventive concept.
Figure 4:
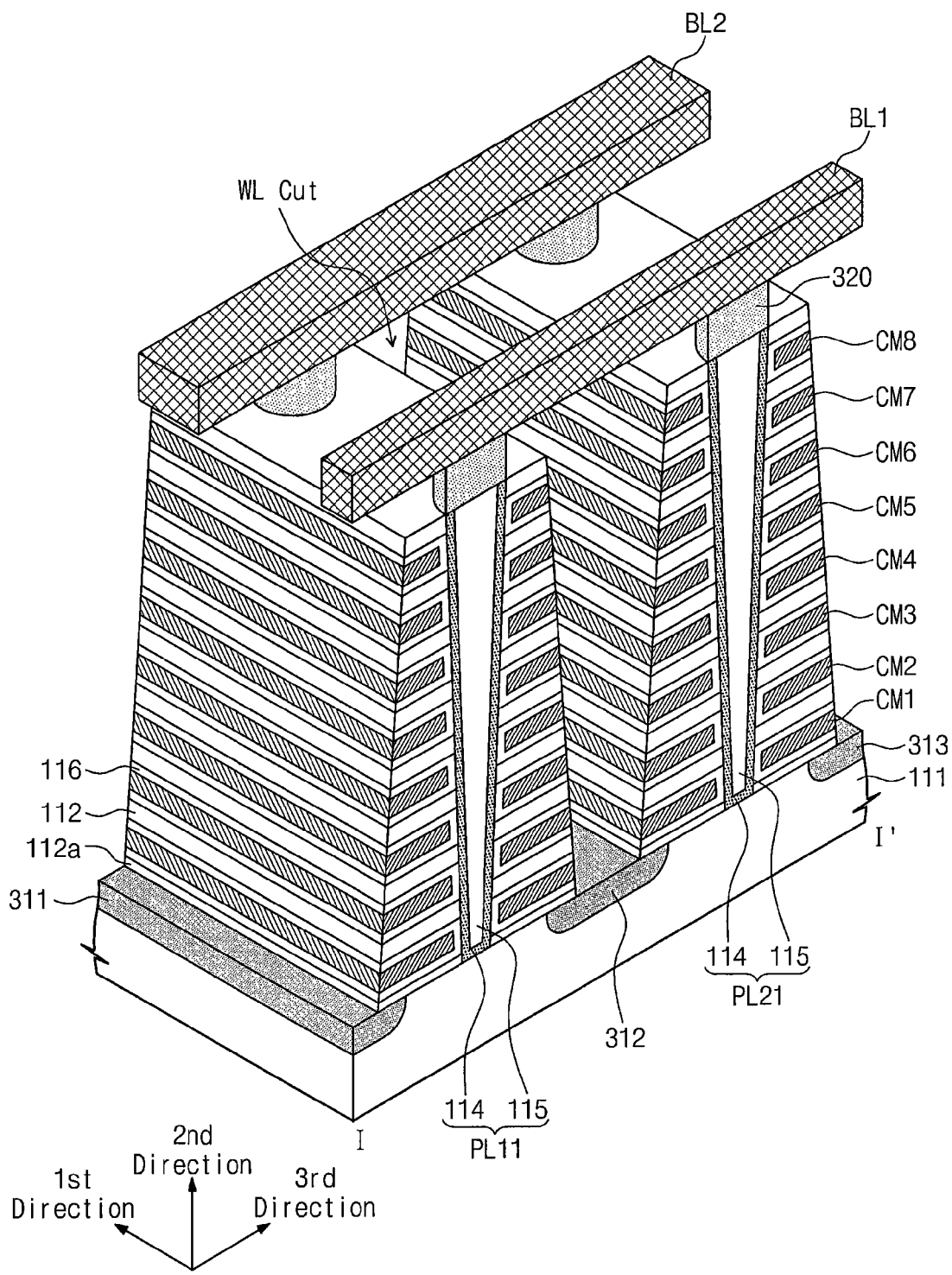
FIG. 4 is a perspective view taken along a line I-I' in FIG. 3 according to an embodiment of the inventive concept.
Figure 5:
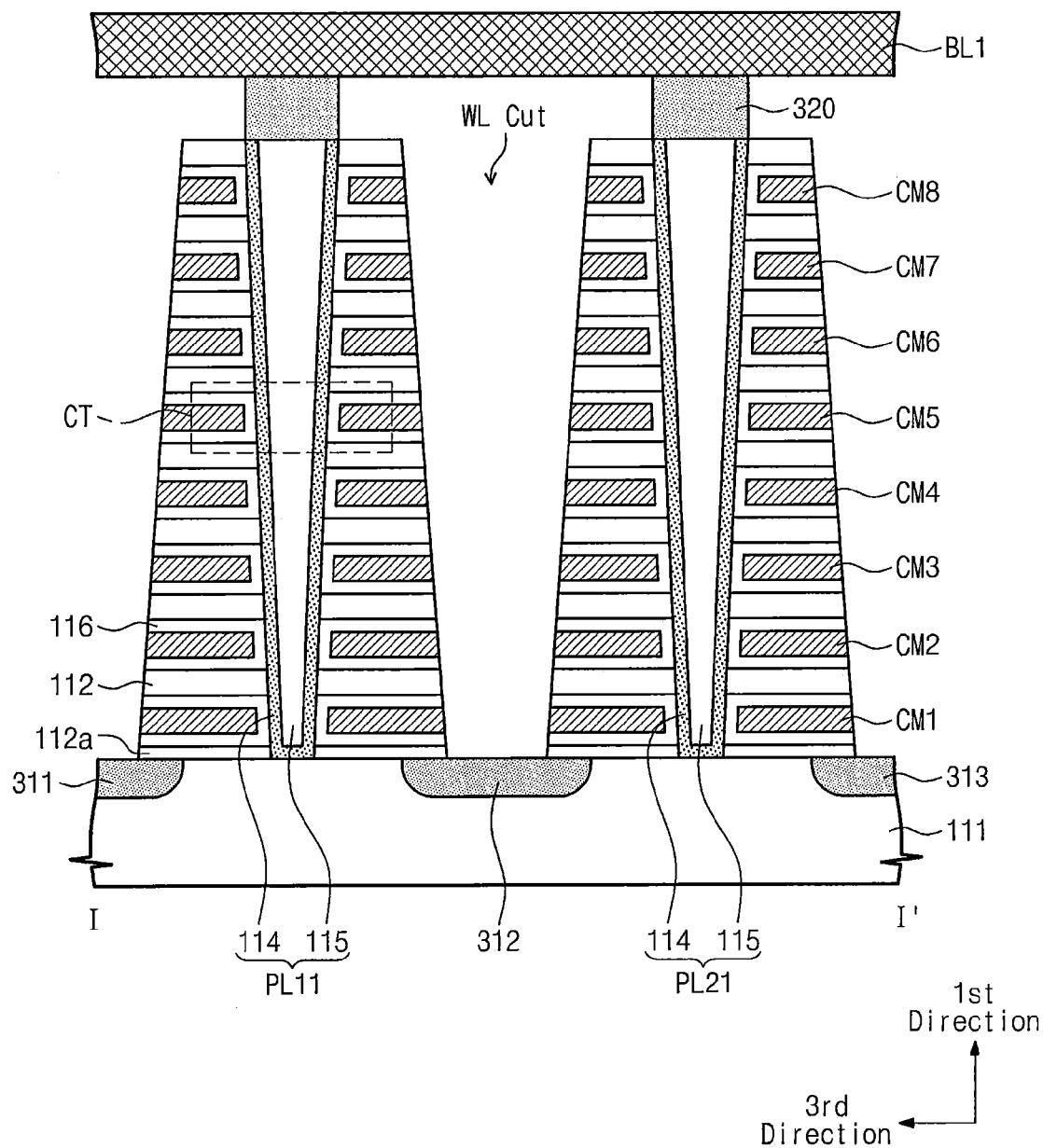
FIG. 5 is a cross-sectional view taken along a line I-I' in FIG. 4 according to an embodiment of the inventive concept.

FIG. 3 is a plane diagram of one of memory blocks in FIG. 1 according to an embodiment of the inventive concept. In example embodiments, a plane view illustrating conductive layers of a memory block BLKa is shown in FIG. 3. FIG. 4 is a perspective view taken along a line I-I' of a memory block in FIG. 3 according to an embodiment of the inventive concept. FIG. 5 is a cross-sectional view taken along a line I-I' of a memory block in FIG. 3 according to an embodiment of the inventive concept.

Referring to FIGS. 3 to 5, the memory block BLKa may include three-dimensional structures extending along the first to third directions.

A substrate 111 is provided. The substrate 111 may be a well having the first conductivity type, for example. The substrate 111 may be a p-well in which the Group III element such as boron is injected. The substrate 111 may be a pocket p-well which is provided within an n-well. Below, it is assumed that the substrate 111 is a p-well (or, a pocket p-well). However, the substrate 111 is not limited to p-type.

A plurality of doping regions 311 to 313 extending along the first direction may be provided in the substrate 111. The doping regions 311 to 313 may be spaced apart along the third direction. The doping regions 311 to 313 illustrated in FIGS. 3 to 5 may be referred to as the first to third doping regions 311 to 313, respectively.

The first to third doping regions 311 to 313 may have an n-type conductive material different from that of the substrate 111. Below, it is assumed that the first to third doping regions 311 to 313 are n-type. However, the first to third doping regions 311 to 313 are not limited to the n-type.

Between adjacent doping regions of the first to third doping regions 311 to 313, a plurality of insulation materials 112 and 112a may be provided sequentially along the second direction (i.e., a direction perpendicular to the substrate 111). The insulation materials 112 and 112a may be formed to be spaced apart along the second direction. In example embodiments, the insulation materials 112 and 112a may be extended along the first direction. For example, the insulation materials 112 and 112a may include an insulation material such as silicon oxide. In example embodiments, a thickness of the insulation material 112a contacting with the substrate 111 may be thinner than that of the insulation materials 112.

Between adjacent doping regions of the first to third doping regions 311 to 313, a plurality of pillars PL11, PL12, PL21, and PL22 may be arranged sequentially along the first direction so as to penetrate the plurality of insulation materials 112 and 112a along the second direction. For example, the pillars PL11, PL12, PL21, and PL22 may contact with the substrate 111 through the insulation materials 112 and 112a.

In example embodiments, the pillars PL11, PL12, PL21, and PL22 may be formed of a plurality of materials, respectively. For example, the pillars PL11, PL12, PL21, and PL22 may include channel films 114 and inner materials 115. In each of the pillars PL11, PL12, PL21, and PL22, an inner material and a channel film surrounding the inner material may be provided.

The channel films 114 may include a semiconductor material (e.g., silicon) having the first conductive type. For example, the channel films 114 may include a semiconductor material (e.g., silicon) having the same conductive type as the substrate 111. Below, it is assumed that the channel films 114 include p-type silicon. However, the channel films 114 may be limited to include the p-type silicon. For example, the channel films 114 may include intrinsic semiconductor being a nonconductor.

The inner materials 115 may include an insulation material. For example, the inner materials 115 may include an insulation material such as silicon oxide. Alternatively, the inner materials 115 may include air gap.

Information storage films 116 may be provided between adjacent doping regions of the first to third doping regions 311 and 313 along exposed surfaces of the insulation materials 112 and 112a and the pillars PL11, PL12, PL21, and PL22. In example embodiments, a thickness of the information storage film 116 may be less than half a distance between the insulation materials 112 and 112a.

Between adjacent doping regions of the first to third doping regions 311 to 313, conductive materials CM1 to CM8 may be provided on exposed surfaces of the information storage films 116. For example, the conductive material CM1 to CM8 extending along the first direction may be provided between an information storage film 116 provided at a lower surface of an upper insulation material of the insulation materials 112 and 112a and the information storage film 116 provided at an upper surface of a lower insulation material of the insulation materials 112 and 112a.

The conductive materials CM1 to CM8 and the insulation materials 112 and 112a may be separated on the doping regions 311 to 313 by word line cuts. In example embodiments, the conductive materials CM1 to CM8 may include a metallic conductive material. The conductive materials CM1 to CM8 may include a nonmetallic conductive material such as polysilicon.

In example embodiments, information storage films provided on an upper surface of an insulation material placed at the uppermost layer among the insulation materials 112 and 112a can be removed. Exemplarily, information storage films provided at sides opposite to the pillars PL among sides of the insulation materials 112 and 112a can be removed.

A plurality of drains 320 may be provided on the plurality of pillars PL11, PL12, PL21, and PL22, respectively. The drains 320 may include a semiconductor material (e.g., silicon) having the second conductivity type, for example. The drains 320 may include an n-type semiconductor material (e.g., silicon). Below, it is assumed that the drains 320 include n-type silicon. However, the prevent invention is not limited thereto. The drains 320 can be extended to the upside of the channel films 114 of the pillars PL11, PL12, PL21, and PL22.

Bit lines BL1 and BL2 extending in the third direction may be provided on the drains 320 so as to be spaced apart from one another along the first direction. The bit lines BL1 and BL2 may be coupled with the drains 320. In this embodiment, the drains 320 and the bit lines BL may be connected via contact plugs (not shown). The bit lines BL may include a metallic conductive material. Alternatively, the bit lines BL may include a nonmetallic conductive material such as polysilicon.

Below, rows and columns of pillars PL11, PL12, PL21, and PL22 in the memory block BLKa may be defined. In example embodiments, rows of the pillars PL11, PL12, PL21, and PL22 may be defined according to whether the conductive materials CM1 to CM8 are separated or not. The conductive materials CM1 to CM8 may be separated on the basis of the doping region 312.

Pillars PL11 and PL12 connected via the conductive materials CM1 to CM8 with the information storage films 116 provided between the first and second doping regions 311 and 312 may constitute the first row of pillars. Pillars PL21 and PL22 connected via the conductive materials CM1 to CM8 with the information storage films 116 provided between the second and third doping regions 312 and 313 may constitute the second row of pillars.

Columns of the pillars PL11, PL12, PL21, and PL22 may be defined along the bit lines BL1 and BL2. Pillars PL11 and PL21 connected with the first bit line BL1 via the drain 320 may constitute the first column of pillars. Pillars PL12 and PL22 connected with the second bit line BL2 via the drain 320 may constitute the second column of pillars.

Below, heights of the conductive materials CM1 to CM8 may be defined. The conductive materials CM1 to CM8 may have the first to eighth heights according to a distance from the substrate 111. The conductive materials CM1 closest to the substrate 111 may have the first height. The conductive materials CM8 closest to the bit lines BL1 and BL2 may have the eighth height.

Each of the pillars PL11, PL12, PL21, and PL22 may constitute one cell string with adjacent information storage films 116 and adjacent conductive materials CM1 to CM8. That is, the pillars PL11, PL12, PL21, and PL22 may constitute a plurality of cell strings with information storage films 116 and a plurality of conductive materials CM1 to CM8.

Each of cell strings may include a plurality of cell transistors CT stacked in a direction perpendicular to the substrate 111. The cell transistors CT will be more fully described with reference to FIG. 6.

Figure 6:
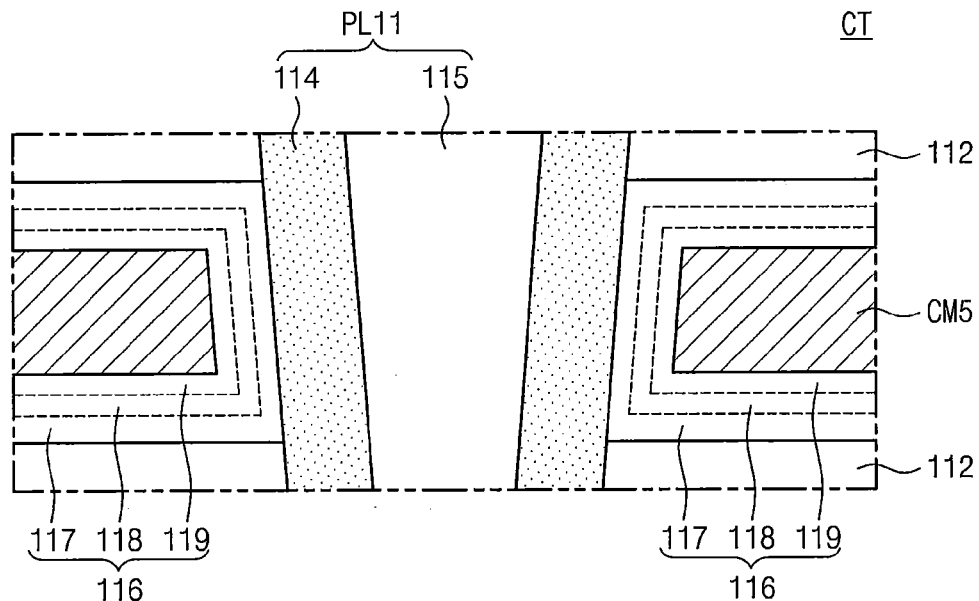
FIG. 6 is a diagram illustrating one of cell transistors in FIG. 5.

FIG. 6 is a diagram illustrating one of cell transistors in FIG. 5. In FIG. 6, there may be illustrated a cell transistor with the fifth height among a plurality of cell transistors CT corresponding to a pillar PL11 of the first row and the first column.

Referring to FIGS. 3 to 6, cell transistors CT may be formed of the fifth conductive material CM5, a part of a pillar PL11 adjacent to the fifth conductive material CM5, and an information storage film provided between the conductive material CM5 and the pillar PL11.

The information storage films 116 may extend to upper surfaces and lower surfaces of the conductive materials CM1 to CM8 from regions between the conductive materials CM1 to CM8 and the pillars PL11, PL12, PL21, and PL22. Each of the information storage films 116 may include the first to third sub insulation films 117, 118, and 119.

In the cell transistors CT, the channel films 114 of the pillars PL11, PL12, PL21, and PL22 may include the same p-type silicon as the substrate 111. The channel films 114 may act as bodies of cell transistors CT. The channel films 114 may be formed in a direction perpendicular to the substrate 111. The channel films 114 of the pillars PL11, PL12, PL21, and PL22 may act as a vertical body. Vertical channels may be formed at the channel films 114 of the pillars PL11, PL12, PL21, and PL22.

The first sub insulation films 117 adjacent to the pillars PL11, PL12, PL21, and PL22 may act as tunneling insulation films of the cell transistors CT. For example, the first sub insulation films 117 adjacent to the pillars PL11, PL12, PL21, and PL22 may include a thermal oxide film, respectively. The first sub insulation films 117 may include a silicon oxide film, respectively.

The second sub insulation films 118 may act as charge storage films of the cell transistors CT. For example, the second sub insulation films 118 may act as a charge trap film, respectively. For example, the second sub insulation films 118 may include a nitride film or a metal oxide film (e.g., an aluminum oxide film, a hafnium oxide film, etc.), respectively. The second sub insulation films 118 may include a silicon nitride film The third sub insulation films 119 adjacent to the conductive materials CM1 to CM8 may act as blocking insulation films of the cell transistors CT. In this embodiment, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

In this embodiment, the first to third sub insulation films 117 to 119 may constitute ONO (oxide-nitride-oxide).

The plurality of conductive materials CM1 to CM8 may act as a gate (or, a control gate), respectively.

That is, the plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute cell transistors CT stacked in a direction perpendicular to the substrate 111. Exemplarily, the cell transistors CT may be a charge trap type cell transistor.

The cell transistors CT can be used for different purposes according to height. For example, among the cell transistors CT, at least one cell transistor placed at an upper portion may be used as a string selection transistor. Among the cell transistors CT, at least one cell transistor placed at a lower portion may be used as a ground selection transistor. Remaining cell transistors may be used as a memory cell and a dummy memory cell.

The conductive materials CM1 to CM8 may extend along a row direction (the first direction) to be connected with a plurality of pillars PL11 and PL12 or PL21 and PL22. The conductive materials CM1 to CM8 may constitute conductive lines interconnecting cell transistors CT of the pillars PL11 and PL12 or PL21 and PL22 in the same row.

In this embodiment, the conductive materials CM1 to CM8 may be used as a string selection line, a ground selection line, a word line, or a dummy word line according to the height.

Figure 7:
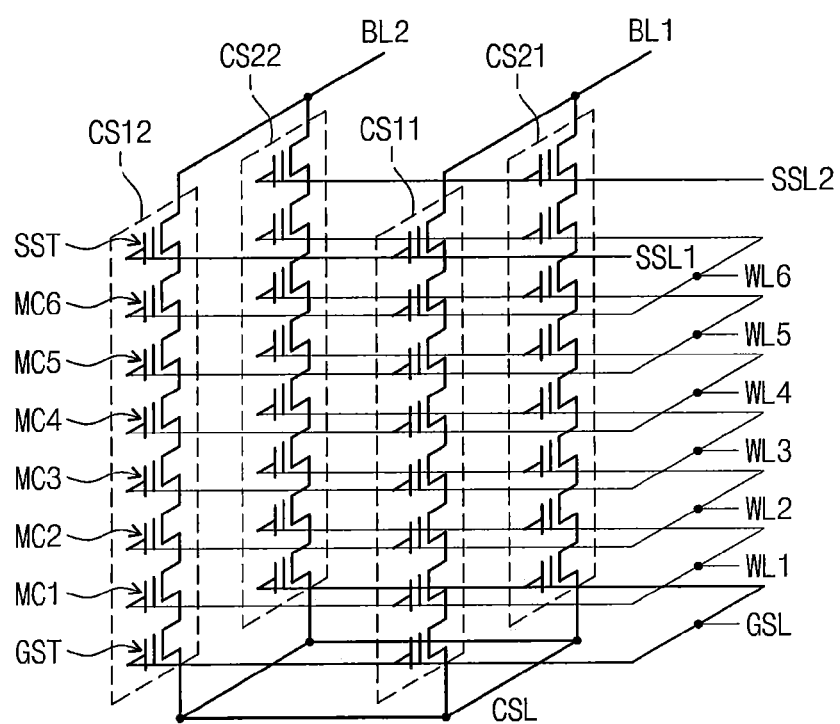
FIG. 7 is a circuit diagram illustrating an equivalent circuit of a memory block described in FIGS. 3 to 6.

FIG. 7 is a circuit diagram illustrating an equivalent circuit of a memory block described in FIGS. 3 to 6. Referring to FIGS. 3 to 7, cell strings CS11 and CS21 may be connected between the first bit line BL1 and a common source line CSL, and cell strings CS12 and CS22 may be connected between the second bit line BL2 and the common source line CSL. The cell strings CS11, CS21, CS12, and CS22 may correspond to pillars PL11, PL21, PL12, and PL22, respectively.

The pillar PL11 of the first row and the first column may form the cell string CS11 of the first row and the first column with conductive materials CM1 to CM8 and information storage films 116. The pillar PL12 of the first row and the second column may form the cell string CS12 of the first row and the second column with the conductive materials CM1 to CM8 and the information storage films 116. The pillar PL21 of the second row and the first column may form the cell string CS21 of the second row and the first column with the conductive materials CM1 to CM8 and the information storage films 116. The pillar PL22 of the second row and the second column may form the cell string CS22 of the second row and the second column with the conductive materials CM1 to CM8 and the information storage films 116.

In the cell strings CS11, CS21, CS12, and CS22, cell transistors with the first height may act as ground selection transistors GST. Ground selection transistors of the same row may share a ground selection line GSL. Ground selection transistors of different rows may share the ground selection line GSL. In example embodiments, the first conductive materials CM1 may be interconnected to form the ground selection line GSL.

In the cell strings CS11, CS21, CS12, and CS22, cell transistors with the second to sixth heights may act as the first to sixth memory cells MC1 to MC6, respectively. The first to sixth memory cells MC1 to MC6 may be connected with the first to sixth word lines WL1 to WL6, respectively. Memory cells having the same height and corresponding to the same row may share a word line. Memory cells having the same height and corresponding to different rows may share a word line. That is, memory cells MC having the same height may share a word line.

In example embodiments, the second conductive materials CM2 may be interconnected to form the first word line WL1. The third conductive materials CM3 may be interconnected to form the second word line WL2. The fourth conductive materials CM4 may be interconnected to form the third word line WL3. The fifth conductive materials CM5 may be interconnected to form the fourth word line WL4. The sixth conductive materials CM6 may be interconnected to form the fifth word line WL5. The seventh conductive materials CM7 may be interconnected to form the sixth word line WL6.

In the cell strings CS11, CS21, CS12, and CS22, cell transistors with the eighth height may act as string selection transistors SST. The string selection transistors SST may be connected with the first and second string selection lines SSL1 and SSL2. String selection transistors of the same row may share a string selection line SSL. String selection transistors of different rows may be connected with different string selection lines. In example embodiments, the first and second string selection lines SSL1 and SSL2 may correspond to the eighth conductive materials CM8, respectively. That is, rows of the pillars PL11, PL12, PL21, and PL22, (i.e., rows of cell strings CS11, CS12, CS21, and CS22) may be defined by the first and second string selection lines SSL1 and SSL2.

Below, string selection transistors connected with the first string selection line SSL1 may be referred to as the first string selection transistors SST1, and string selection transistors connected with the second string selection line SSL2 may be referred to as the second string selection transistors SST2.

A common source line CSL may be connected in common with the cell strings CS11, CS12, CS21, and CS22. For example, the first to third doping regions 311 to 313 may be interconnected to form the common source line CSL.

As illustrated in FIG. 7, memory cells having the same height may be connected in common with one word line. Accordingly, when a word line with a specific height is selected, all cell strings CS11, CS12, CS21, and CS22 connected with the selected word line may be selected.

Cell strings of different rows may be connected with different string selection lines. Accordingly, in the cell strings CS11, CS12, CS21, and CS22 connected with the same word line, an unselected row of cell strings CS11 and CS12 or CS21 and CS22 may be electrically separated from the bit lines BL1 and BL2 by unselecting the first or second string selection line SSL1 or SSL2. A selected row of cell strings CS21 and CS22 or CS11 and CS12 may be electrically connected with the bit lines BL1 and BL2.

That is, rows of the cell strings CS11, CS12, CS21, and CS22 may be selected by selecting and unselecting the first and second string selection lines SSL1 and SSL2. Columns of cell strings in a selected row may be selected by selecting and unselecting the bit lines BL1 and BL2.

In example embodiments, at least one of the word lines WL1 to WL6 may be used as a dummy word line. For example, a word line adjacent to the string selection lines SSL1 and SSL2, a word line adjacent to the ground selection line GSL, or at least one of word lines between the string selection lines SSL1 and SSL2 and the ground selection line GSL may be used as a dummy word line.

In example embodiments, at least two conductive materials of the conductive materials CM1 to CM8 may form string selection lines. For example, the seventh and eighth conductive materials CM7 and CM8 may be used as string selection lines. At this time, the seventh and eighth conductive materials CM7 and CM8 in the same row may be connected in common.

In example embodiments, at least two conductive materials of the conductive materials CM1 to CM8 may form a ground selection line. For example, the first and second conductive materials CM1 and CM2 may be used as a ground selection line. At this time, the first and second conductive materials CM1 and CM2 in the same row may be connected in common.

In example embodiments, the first conductive materials CM1 may form two ground selection lines being electrically separated such as the string selection lines SSL1 and SSL2.

Figure 8:
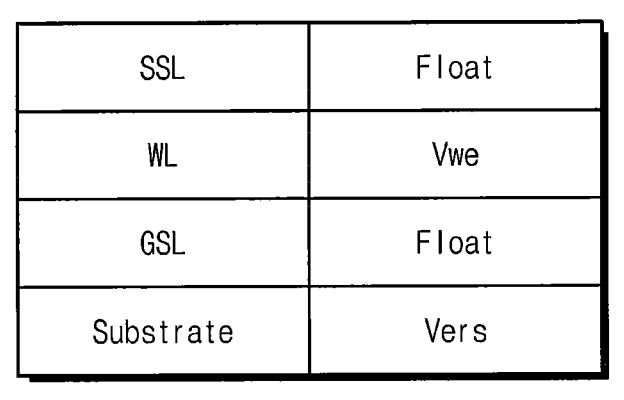

FIG. 8 is a diagram illustrating a voltage condition of a nonvolatile memory device in FIG. 1 at an erase operation. In example embodiments, an erase operation may be executed by the memory block. Below, an erase operation will be described with reference to a memory block BLKa described in FIGS. 3 to 7.

At an erase operation, string selection lines SSL1 and SSL2 may be floated, and a word line erase voltage Vwe may be applied to word line WL1 to WL6. For example, the word line erase voltage Vwe may be a ground voltage Vss. A ground selection line GSL may be floated, and an erase voltage Vers may be supplied to a substrate 111.

The substrate 111 may have the same conductivity as channel films 114. Accordingly, the erase voltage Vers applied to the substrate 111 may be transferred to the channel films 114. In example embodiments, the erase voltage Vers may be a high voltage.

The ground and string selection lines GSL, SSL1, and SSL2 may be floated. Accordingly, when voltages of the channel films 114 vary, the ground and string selection lines GSL, SSL1, and SSL2 may suffer from the coupling. That is, when voltages of the channel films 114 are increased to the erase voltage Vers, voltages of the ground and string selection lines GSL, SSL1, and SSL2 may also increase. Accordingly, the ground and string selection transistors GST, SST1, and SST2 may be erase inhibited.

The word line erase voltage Vwe may be applied to the word lines WL1 to WL6. In example embodiments, the word line erase voltage Vwe may be a low voltage. For example, the word line erase voltage Vwe may be a ground voltage Vss. The Fowler-Nordheim tunneling may be generated at memory cells MC1 to MC6 due to a voltage difference between the channel films 114 and the word lines WL1 to WL6. This means that the memory cells MC1 to MC6 are erased.

Figure 9:
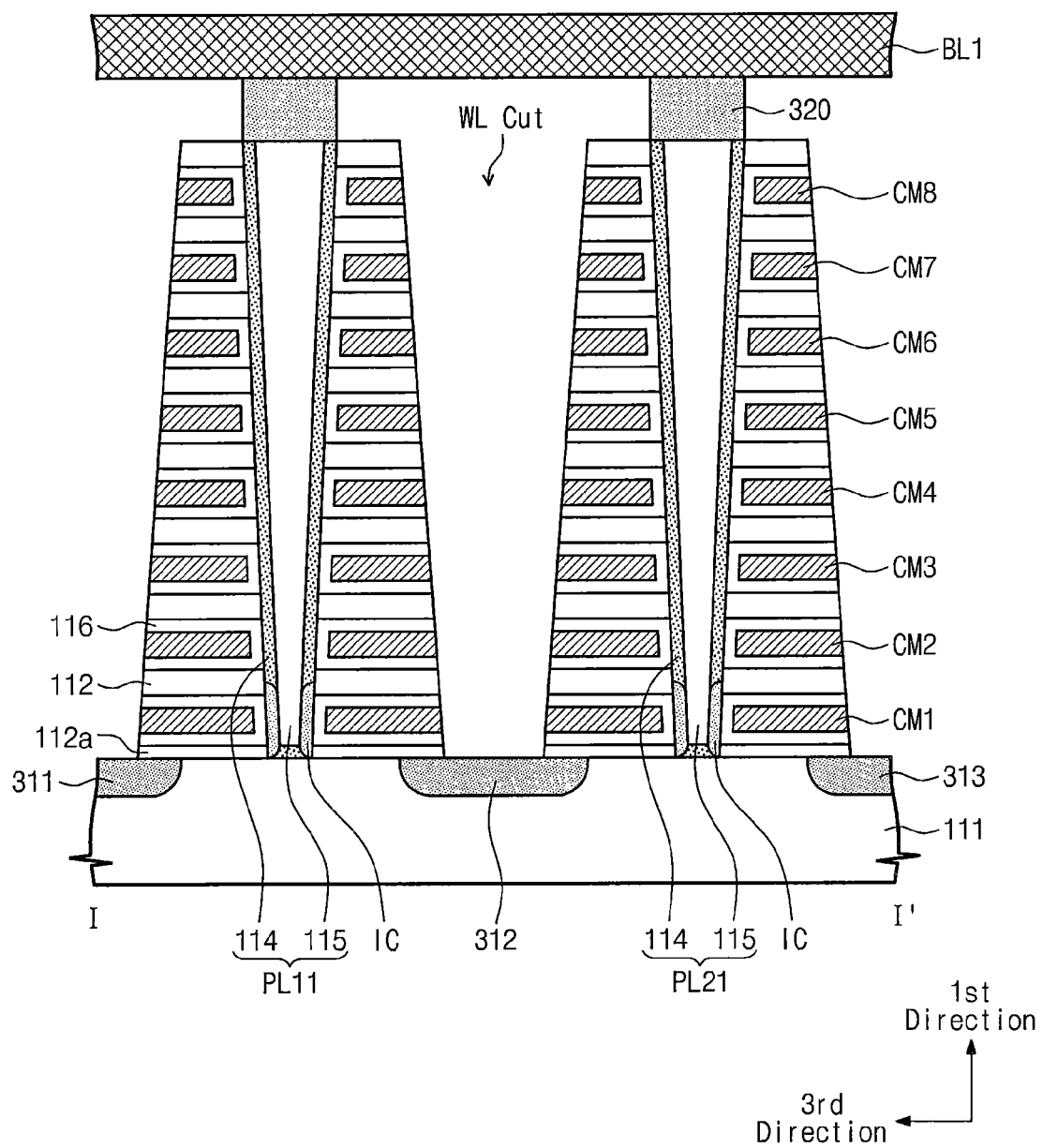
FIG. 9 is a cross-section view of a memory block taken along a line I-I' when channels of the ground selection transistors GST are formed.

If the ground selection line GSL is at a floating state, the ground selection transistors GST may have a quasi-on state. That is, when the erase voltage Vers is applied to the substrate 111, channels may be formed partially at a portion of the channel films 114 corresponding to the ground selection transistors GST. In FIG. 9, there is illustrated a cross-sectional view taken along a line I-I' when channels of the ground selection transistors GST are formed.

Referring to FIG. 9, the substrate 111 and the channel films 114 may be p-type, while channels IC formed at the ground selection transistors GST may be n-type. Accordingly, the erase voltage Vers supplied to the substrate 111 may be shut off by the ground selection transistors GST. This means that the erase voltage Vers is not transferred to the channel films 114 corresponding to the memory cells MC1 to MC6.

At this time, the memory cells MC1 to MC6 may not be erased. Further, the gate induced drain leakage (GIDL) may be generated between the ground selection transistors GST and the memory cells MC1. This may be caused by a voltage difference between the channel films 114 corresponding to the memory cells MC1 to MC6 and the substrate 111. The ground selection transistors GST may be programmed due to the GIDL.

As another example, before a voltage of the substrate 111 is transferred to the channel films 114 corresponding to the ground selection line GSL, a voltage of the ground selection line GSL can be increased due to the coupling. At this time, channels IC of the ground selection transistors GST may be formed by a voltage of the ground selection line GSL. In this case, no memory cells MC1 to MC6 may be erased, and the ground selection transistors GST may be programmed due to the GIDL.

As loading of the ground selection line GSL increases, a rising degree of a voltage of the ground selection line GSL due to the coupling from the substrate 111 and the channel films 114 may decrease. If a voltage of the ground selection line GSL decreases, the ground selection transistors GST may be erased due to a voltage difference between a voltage of the ground selection line GSL and voltages of the channel films 114.

If the ground selection line GSL is floated at the erase operation, the ground selection transistors GST may be programmed or erased. Likewise, string selection transistors SST1 and SST2 may experience this phenomenon. That is, if the string selection transistors SST1 and SST2 are floated at the erase operation, they may be programmed or erased.

With an erase method of the inventive concept, the above-described phenomenon may be prevented by controlling the ground selection line GSL. Further, the string selection lines SSL1 and SSL2 may be controlled according to the erase method of the inventive concept.

The inventive concept will be described using an embodiment where ground and string selection lines GSL, SSL1, and SSL2 are controlled at an erase operation. However, the inventive concept is not limited thereto. For example, the spirit of the inventive concept may be applicable to a technique where a ground selection line GSL is only controlled or a technique where string selection lines SSL1 and SSL2 are only controlled.

Figure 10:
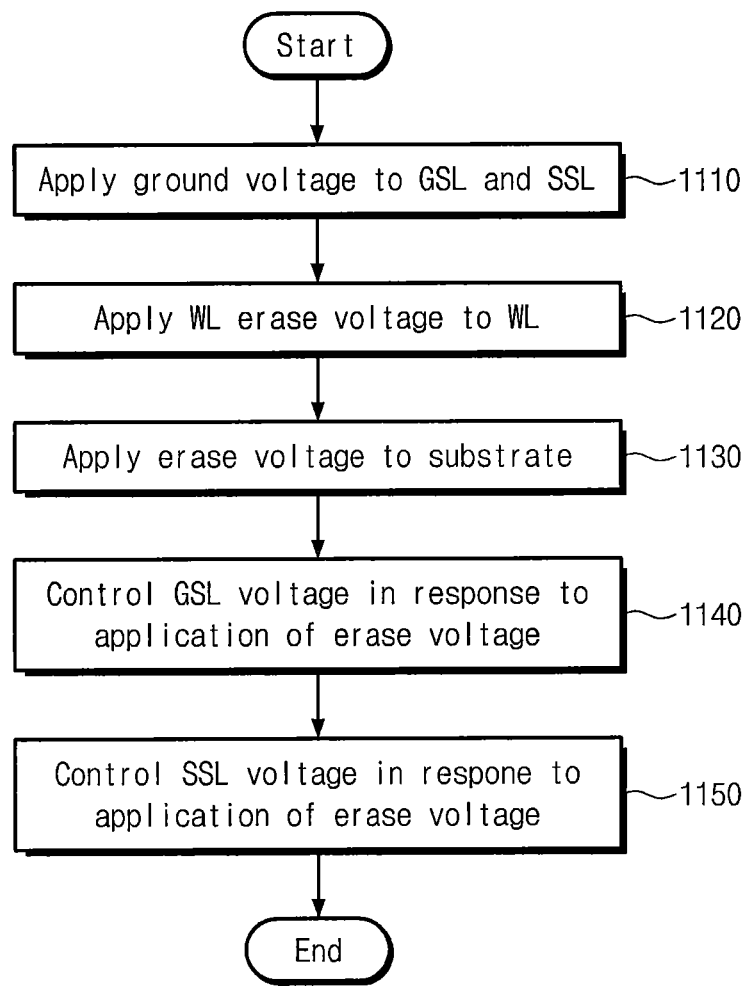
FIG. 10 is a flowchart illustrating an erase method according to an embodiment of the inventive concept.

FIG. 10 is a flowchart illustrating an erase method according to an embodiment of the inventive concept. Referring to FIGS. 1, 3 to 7, and 10, in operation 1110, a ground voltage Vss may be applied to ground and string selection lines GSL, SSL1, and SSL2. In operation 1120, a word line erase voltage Vwe may be applied to word lines WL1 to WL6. In operation 1130, an erase voltage Vers may be applied to a substrate 111. In operation 1140, a voltage of the ground selection line GSL may be controlled according to applying of the erase voltage Vers. In operation 1150, voltages of the string selection lines SSL1 and SSL2 may be controlled according to the applying of the erase voltage Vers.

In example embodiments, loading of the ground selection line GSL may be smaller than that of the substrate 111. Although a voltage is simultaneously applied to the ground selection line GSL and the substrate 111, a voltage of the ground selection line GSL may increase more rapidly than that of the substrate 111. If a voltage of the ground selection line GSL becomes higher by a predetermined level than a voltage of the substrate 111, the Fowler-Nordheim tunneling may be generated at the ground selection transistors GST. That is, the ground selection transistors GST may be programmed. Likewise, the string selection transistors SST1 and SST may experience this phenomenon. That is, the string selection transistors SST1 and SST may be programmed.

The erase method according to an embodiment of the inventive concept may include controlling the ground and string selection lines GSL, SSL1, and SSL2 such that the ground and string selection transistors GST, SST1, and SST2 are not programmed and erased and don't fall into quasi-on and turn-on states. In example embodiments, a voltage difference between the substrate 111 and the ground and string selection lines GSL, SSL1, and SSL2 may be kept within a predetermined/specific range. For example, voltages of the ground and string selection lines GSL, SSL1, and SSL2 may be controlled within a predetermined range on the basis of half a voltage of the substrate 111.

Figure 11:
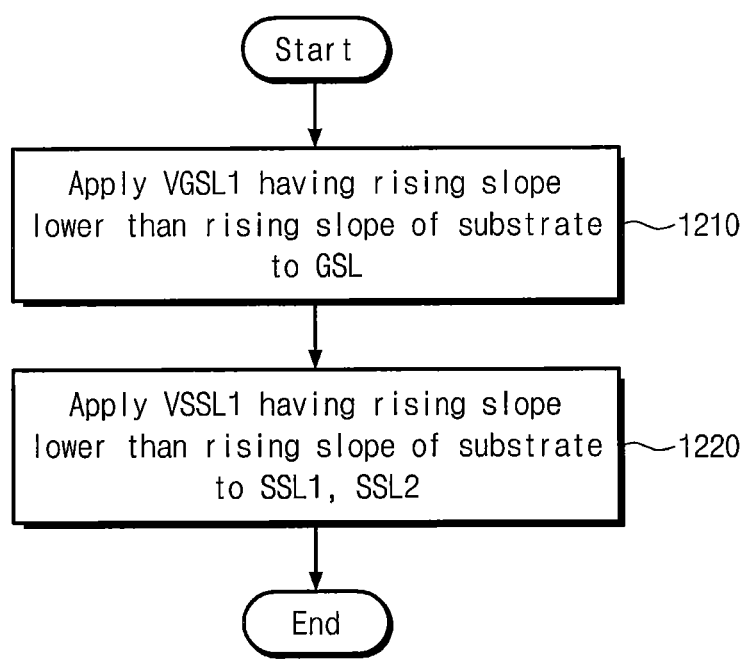
FIG. 11 is a flowchart for describing operations of controlling voltages of ground and string selection lines according to an embodiment of the inventive concept.

FIG. 11 is a flowchart for describing operations of controlling voltages of ground and string selection lines according to an embodiment of the inventive concept. Referring to FIGS. 1, 3 to 7, and 11, in operation 1210, the first ground selection line voltage VGSL1 may be applied to a ground selection line GSL. A rising slope of the first ground selection line voltage VGSL1 may be slower than that of a substrate voltage.

In operation 1220, the first string selection line voltage VSSL1 may be applied to string selection lines SSL1 and SSL2. A rising slope of the first string selection line voltage VSSL1 may be slower than that of a substrate voltage.

Figure 12:
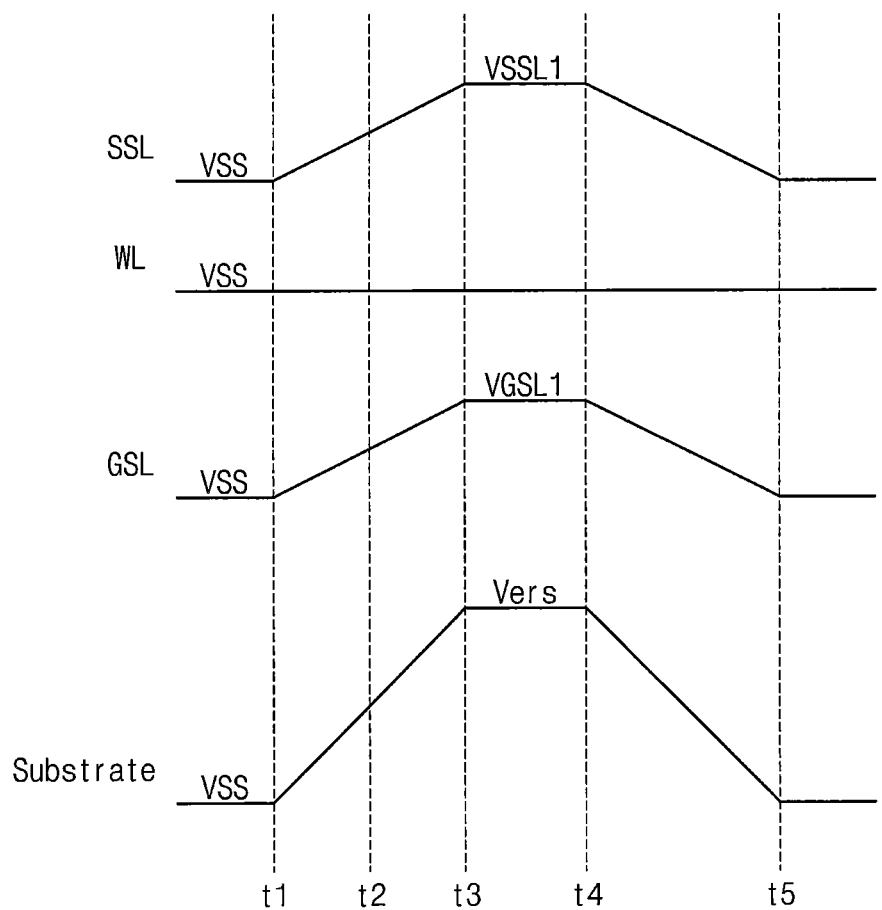
FIG. 12 is a diagram illustrating voltage variations according to an erase method of the inventive concept.

FIG. 12 is a diagram illustrating voltage variations according to an erase method of the inventive concept. Referring to FIG. 12, at t1, the first string selection line voltage VSSL1 may be applied to string selection lines SSL1 and SSL2. A word line erase voltage Vwe may be applied to word lines WL1 to WL6. The first ground selection line voltage VGSL1 may be applied to a ground selection line GSL, and an erase voltage Vers may be applied to a substrate 111.

In example embodiments, voltages of the string selection lines SSL1 and SSL2 may be controlled such that rising slopes of voltages of the string selection lines SSL1 and SSL2 is slower than that of the substrate 111.

Voltages of the string selection lines SSL1 and SSL2 (or, rising slopes of voltages of the string selection lines SSL1 and SSL2) may be controlled such that string selection transistors SST1 and SST2 are not programmed. For example, rising slopes of voltages of the string selection lines SSL1 and SSL2 may be controlled such that voltages of the string selection lines SSL1 and SSL2 are lower than a voltage of the substrate 111.

Voltages of the string selection lines SSL1 and SSL2 (or, rising slopes of voltages of the string selection lines SSL1 and SSL2) may be controlled such that string selection transistors SST1 and SST2 are not erased. For example, rising slopes of voltages of the string selection lines SSL1 and SSL2 may be controlled such that voltages of the string selection lines SSL1 and SSL2 don't become lower by a specific level than a voltage of the substrate 111.

Voltages of the string selection lines SSL1 and SSL2 (or, rising slopes of voltages of the string selection lines SSL1 and SSL2) may be controlled such that the string selection transistors SST1 and SST2 don't fall into a quasi-on or turn-on state.

A voltage of the ground selection line GSL may be controlled such that a rising slope of a voltage of the ground selection line GSL is slower than that of the substrate 111.

A voltage of the ground selection line GSL, that is, a rising slope of a voltage of the ground selection line GSL may be controlled such that ground selection transistors GST are not programmed. For example, a rising slope of a voltage of the ground selection line GSL may be controlled such that a voltage of the ground selection line GSL is lower than a voltage of the substrate 111.

A voltage of the ground selection line GSL, that is, a rising slope of a voltage of the ground selection line GSL may be controlled such that ground selection transistors GST are not erased. For example, a rising slope of a voltage of the ground selection line GSL may be controlled such that a voltage of the ground selection line GSL does not become lower by a specific level than a voltage of the substrate 111.

A voltage of the ground selection line GSL, that is, a rising slope of a voltage of the ground selection line GSL may be controlled such that the ground selection transistors GST don't fall into a quasi-on or turn-on state.

At t3, voltages of the string selection lines SSL1 and SSL2 may reach the first string selection line voltage VSSL1, a voltage of the ground selection line GSL may reach the first ground selection line voltage VGSL1, and a voltage of the substrate 111 may reach an erase voltage Vers. In example embodiments, the first string selection line voltage VSSL1 may be controlled such that the string selection transistors SST1 and SST2 are not erased due to a voltage difference between the first string selection line voltage VSSL1 and the erase voltage Vers. For example, the first string selection line voltage VSSL1 may be controlled to have a level within a specific range on the basis of half the erase voltage Vers.

The first ground selection line voltage VGSL1 may be controlled such that the ground selection transistors GST are not erased due to a voltage difference between the first ground selection line voltage VGSL1 and the erase voltage Vers. For example, the first ground selection line voltage VGSL1 may be controlled to have a level within a specific range on the basis of half the erase voltage Vers.

Memory cells MC1 to MC6 may be erased by a voltage difference between the word line erase voltage Vwe and the erase voltage Vers.

At t4, voltages of the string selection lines SSL1 and SSL2 may start to decrease from the first string selection line voltage VSSL1. A voltage of the ground selection line GSL may start to decrease from the first ground selection line voltage VGSL1. A voltage of the substrate 111 may start to decrease from the erase voltage Vers.

At t5, voltages of the string and ground selection lines SSL1, SSL2, and GSL and the substrate may be lowered to a ground voltage VSS.

In example embodiments, voltages of the string selection lines SSL1 and SSL2 may be controlled such that falling slopes of voltages of the string selection lines SSL1 and SSL2 is slower than that of the substrate 111.

Voltages of the string selection lines SSL1 and SSL2 (or, falling slopes of voltages of the string selection lines SSL1 and SSL2) may be controlled such that string selection transistors SST1 and SST2 are not programmed. For example, falling slopes of voltages of the string selection lines SSL1 and SSL2 may be controlled such that voltages of the string selection lines SSL1 and SSL2 are lower than a voltage of the substrate 111.

Voltages of the string selection lines SSL1 and SSL2 (or, falling slopes of voltages of the string selection lines SSL1 and SSL2) may be controlled such that string selection transistors SST1 and SST2 are not erased. For example, falling slopes of voltages of the string selection lines SSL1 and SSL2 may be controlled such that voltages of the string selection lines SSL1 and SSL2 don't become lower by a specific level than a voltage of the substrate 111.

Voltages of the string selection lines SSL1 and SSL2 (or, falling slopes of voltages of the string selection lines SSL1 and SSL2) may be controlled such that the string selection transistors SST1 and SST2 don't fall into a quasi-on or turn-on state.

A voltage of the ground selection line GSL may be controlled such that a falling slope of a voltage of the ground selection line GSL is slower than that of the substrate 111.

A voltage of the ground selection line GSL (or, a falling slope of a voltage of the ground selection line GSL) may be controlled such that ground selection transistors GST are not programmed. For example, a falling slope of a voltage of the ground selection line GSL may be controlled such that a voltage of the ground selection line GSL is lower than a voltage of the substrate 111.

A voltage of the ground selection line GSL (or, a falling slope of a voltage of the ground selection line GSL) may be controlled such that ground selection transistors GST are not erased. For example, a rising slope of a voltage of the ground selection line GSL may be controlled such that a voltage of the ground selection line GSL does not become lower by a specific level than a voltage of the substrate 111.

A voltage of the ground selection line GSL (or, a falling slope of a voltage of the ground selection line GSL) may be controlled such that the ground selection transistors GST don't fall into a quasi-on or turn-on state.

As described above, rising and falling slopes of a voltage of the ground selection line GSL may be controlled to be slower than those of the substrate 111, based upon applying of the erase voltage Vers to the substrate 111. A voltage difference between voltages of the ground selection line GSL and the substrate 111 may be kept within a specific range.

For example, a voltage of the ground selection line GSL may be prevented from being increased over a voltage of the substrate 111. Accordingly, programming of the ground selection transistors GST may be prevented. Further, a voltage of the ground selection line GSL may be prevented from becoming lower by a specific voltage than a voltage of the substrate 111. Accordingly, erasing of the ground selection transistors GST may be prevented. Further, it is possible to prevent the ground selection transistors GST from falling into a quasi-on or turn-on state before a voltage of the substrate 111 is transferred to the channel films 114. Accordingly, programming and deteriorating of the ground selection transistors GST due to the GIDL may be prevented.

Likewise, rising and falling slopes of voltages of the string selection lines SSL1 and SSL2 may be controlled to be slower than those of the substrate 111, based upon applying of the erase voltage Vers to the substrate 111. A voltage difference between voltages of the string selection lines SSL1 and SSL2 and the substrate 111 may be kept within a specific range.

For example, voltages of the string selection lines SSL1 and SSL2 may be prevented from being increased over a voltage of the substrate 111. Accordingly, programming of the string selection transistors SST1 and SST2 may be prevented. Further, voltages of the string selection lines SSL1 and SSL2 may be prevented from becoming lower by a specific voltage than a voltage of the substrate 111. Accordingly, erasing of the string selection transistors SST1 and SST2 may be prevented. Further, it is possible to prevent the string selection transistors SST1 and SST2 from falling into a quasi-on or turn-on state before a voltage of the substrate 111 is transferred to the channel films 114. Accordingly, programming and deteriorating of the string selection transistors SST1 and SST2 due to the GIDL may be prevented.

Figure 13:
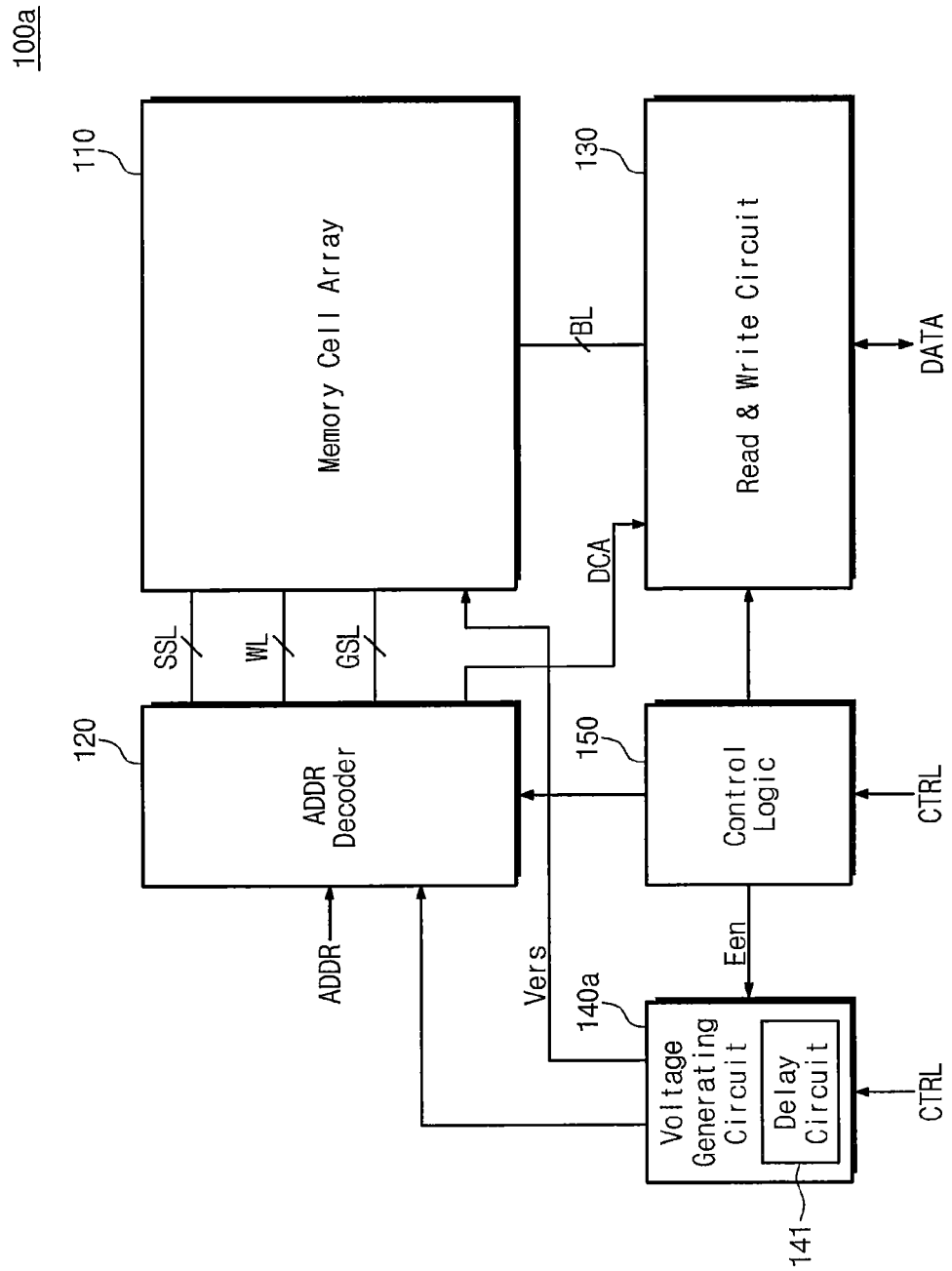
FIG. 13 is a block diagram illustrating a nonvolatile memory device according to another exemplary embodiment of the inventive concept.

FIG. 13 is a block diagram illustrating a nonvolatile memory device according to another exemplary embodiment of the inventive concept. Referring to FIG. 13, a nonvolatile memory device 100a may include a memory cell array 110, an address decoder 120, a read/write circuit 130, a voltage generating circuit 140a, and control logic 150.

The nonvolatile memory device 100a may be substantially identical to that in FIG. 1 except for the voltage generating circuit 140a, and description thereof is thus omitted.

The voltage generating circuit 140a may be configured to generate various voltages for the nonvolatile memory device 100a. In example embodiments, the voltage generating circuit 140a may be configured to supply an erase voltage Vers to the memory cell array 110 in response to an erase enable signal Een. The voltage generating circuit 140a may be configured to control voltages of ground selection lines GSL, word lines WL, and string selection lines SSL to be transferred via the address decoder 120 in response to applying of the erase voltage Vers.

The voltage generating circuit 140a may include a delay 141. The delay 141 may generate an internal signal after the erase enable signal Een is received and a time elapses. The voltage generating circuit 140a may drive the ground selection lines GSL, the word lines WL, and the string selection lines SSL via the address decoder 120 in response to the internal signal. That is, the voltage generating circuit 140a may control voltages of the ground selection lines GSL, the word lines WL, and the string selection lines SSL to be transferred via the address decoder 120 after the erase voltage Vers is applied and a time elapses.

Figure 14:
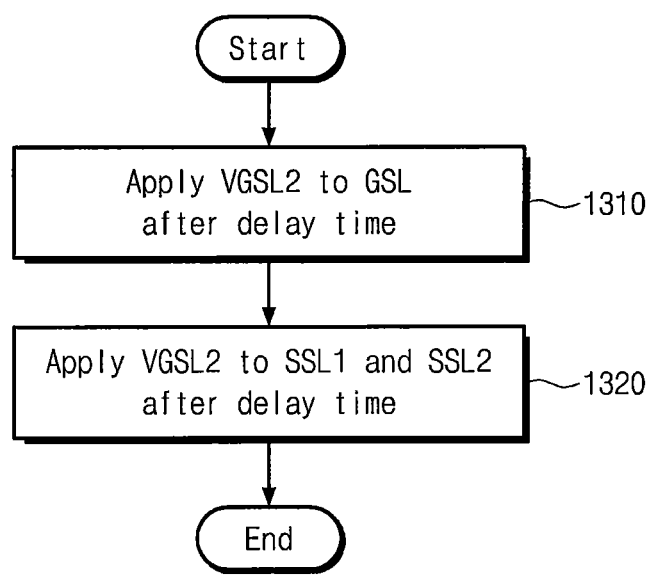
FIG. 14 is a flowchart for describing operations of controlling voltages of ground and string selection lines according to another exemplary embodiment of the inventive concept.

FIG. 14 is a flowchart for describing operations of controlling voltages of ground and string selection lines according to another exemplary embodiment of the inventive concept. Referring to FIGS. 3 to 7, 11, 13, and 14, in operation 1310, the second ground selection line voltage VGSL2 may be applied to a ground selection line GSL after a delay time. In operation 1320, the second string selection line voltage VSSL2 may be applied after a delay time DT. The delay time DT may be a time determined by a delay 141.

Figure 15:
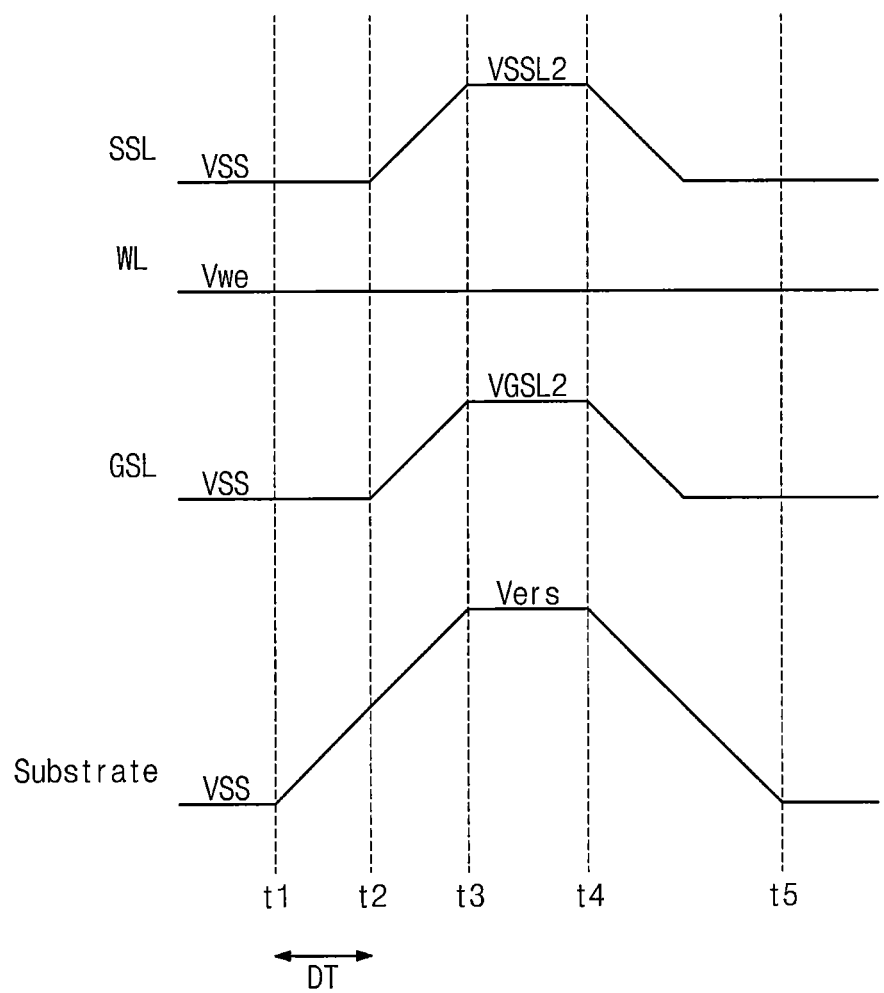
FIG. 15 is a diagram illustrating voltage variations according to an erase method described in FIGS. 10 to 14.

FIG. 15 is a diagram illustrating voltage variations according to an erase method described in FIGS. 10 to 14. Referring to FIGS. 3 to 7, 10, and 13 to 15, at t1, a word line erase voltage Vwe may be applied to word lines WL1 to WL6. An erase voltage Vers may be applied to a substrate 111. String and ground selection lines SSL1, SSL2, and GSL may be grounded.

After the delay time DT, that is, at t2, the second string selection line voltage VSSL2 may be applied to string selection lines SSL1 and SSL2. The second ground selection line voltage VGSL2 may be applied to the ground selection line GSL.

The delay time DT may be controlled such that string selection transistors SST1 and SST2 are not programmed. For example, the delay time DT may be controlled such that voltages of the string selection lines SSL1 and SSL2 are lower than a voltage of the substrate 111.

The delay time DT may be controlled such that string selection transistors SST1 and SST2 are not erased. For example, the delay time DT may be controlled such that voltages of the string selection lines SSL1 and SSL2 don't become lower by a specific level than a voltage of the substrate 111.

The delay time DT may be controlled such that the string selection transistors SST1 and SST2 don't fall into a quasi-on or turn-on state.

The delay time DT may be controlled such that ground selection transistors GST are not programmed. For example, the delay time DT may be controlled such that a voltage of the ground selection line GSL is lower than a voltage of the substrate 111.

The delay time DT may be controlled such that ground selection transistors GST are not erased. For example, the delay time DT may be controlled such that a voltage of the ground selection line GSL does not become lower by a specific level than a voltage of the substrate 111.

The delay time DT may be controlled such that the ground selection transistors GST don't fall into a quasi-on or turn-on state.

At t3, voltages of the string selection lines SSL1 and SSL2 may reach the second string selection line voltage VSSL2, a voltage of the ground selection line GSL may reach the second ground selection line voltage VGSL2, and a voltage of the substrate 111 may reach an erase voltage Vers.

The second string selection line voltage VSSL2 may be controlled such that the string selection transistors SST1 and SST2 are not erased due to a voltage difference between the string selection lines SSL1 and SSL2 and the substrate 111. For example, the second string selection line voltage VSSL2 may be controlled to have a level within a specific range on the basis of half the erase voltage Vers.

The second ground selection line voltage VGSL2 may be controlled such that the ground selection transistors GST are not erased due to a voltage difference between the ground selection line GSL and the substrate 111. For example, the second ground selection line voltage VGSL2 may be controlled to have a level within a specific range on the basis of half the erase voltage Vers.

Memory cells MC1 to MC6 may be erased by a voltage difference between the word lines WL1 to WL6 and the substrate 111.

At t4, voltages of the string selection lines SSL1 and SSL2 may start to decrease from the second string selection line voltage VSSL2. A voltage of the ground selection line GSL may start to decrease from the second ground selection line voltage VGSL2. A voltage of the substrate 111 may start to decrease from the erase voltage Vers.

After voltages of the string and ground selection lines SSL1, SSL2, and GSL are lowered to a ground voltage VSS, at t5, a voltage of the substrate 111 may be lowered to the ground voltage VSS.

As described above, after the erase voltage Vers is applied to the substrate 111 and the delay time DT elapses, the second string selection line voltage VSSL2 may be supplied to the string selection lines SSL1 and SSL2. A voltage difference between the string selection lines SSL1 and SSL2 and the substrate 111 may be kept within a specific range.

For example, voltages of the string selection lines SSL1 and SSL2 may be prevented from being increased over a voltage of the substrate 111. Accordingly, programming of the string selection transistors SST1 and SST2 may be prevented. Further, voltages of the string selection lines SSL1 and SSL2 may be prevented from becoming lower by a specific voltage than a voltage of the substrate 111. Accordingly, erasing of the string selection transistors SST1 and SST2 may be prevented. Further, it is possible to prevent the string selection lines SSL1 and SSL2 from falling into a quasi-on or turn-on state before a voltage of the substrate 111 is transferred to the channel films 114. Accordingly, programming and deteriorating of the string selection lines SSL1 and SSL2 due to the GIDL may be prevented.

Likewise, after the erase voltage Vers is applied to the substrate 111 and a delay time DT elapses, the second ground selection line voltage VGSL2 may be supplied to the ground selection line GSL. A voltage difference between the ground selection line GSL and the substrate 111 may be kept within a specific range.

For example, a voltage of the ground selection line GSL may be prevented from being increased over a voltage of the substrate 111. Accordingly, programming of the ground selection transistors GST may be prevented. Further, a voltage of the ground selection line GSL may be prevented from becoming lower by a specific voltage than a voltage of the substrate 111. Accordingly, erasing of the ground selection transistors GST may be prevented. Further, it is possible to prevent the ground selection transistors GST from falling into a quasi-on or turn-on state before a voltage of the substrate 111 is transferred to the channel films 114. Accordingly, programming and deteriorating of the ground selection transistors GST due to the GIDL may be prevented.

Figure 16:
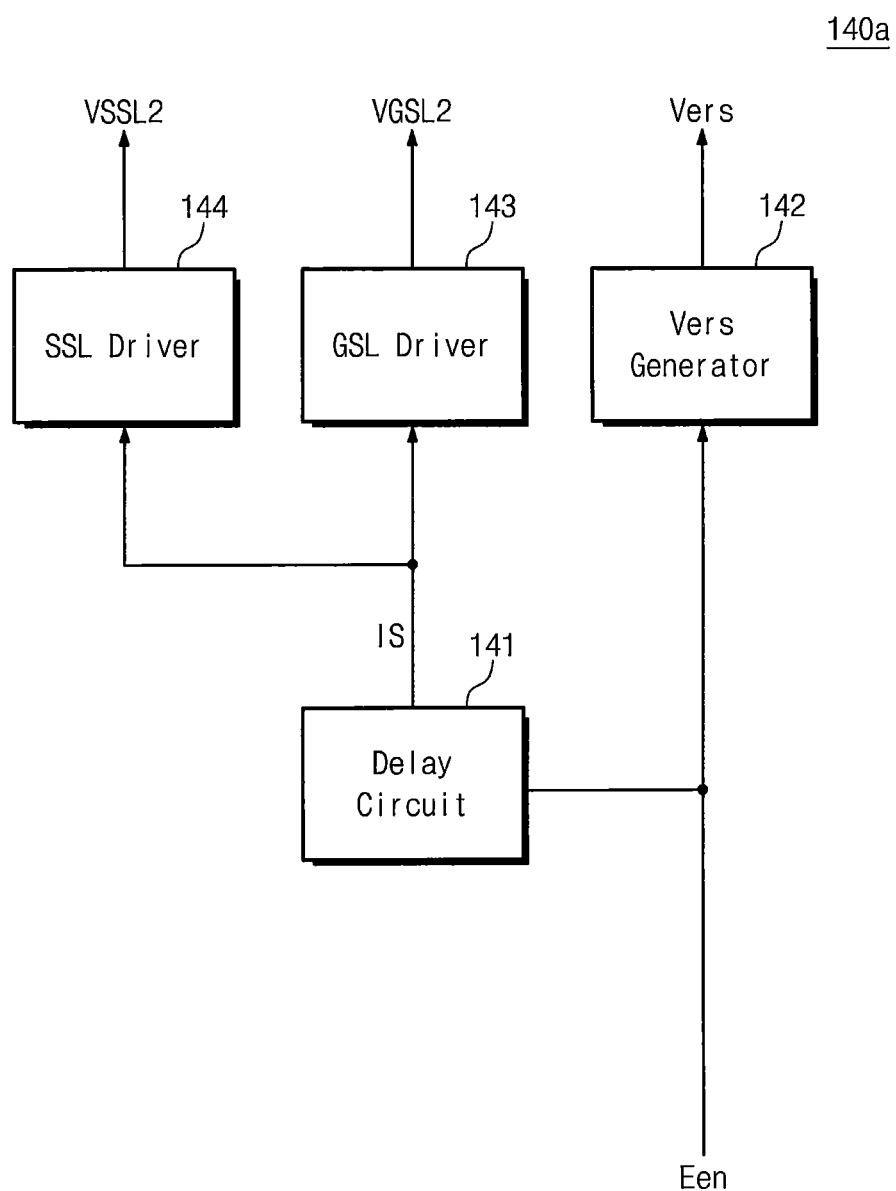
FIG. 16 is a block diagram illustrating a voltage generating circuit in FIG. 13.

FIG. 16 is a block diagram illustrating a voltage generating circuit in FIG. 13. Referring to FIGS. 13 and 16, a voltage generating circuit 140a may include a delay circuit 141, an erase voltage generator 142, a ground selection line driver 143, and a string selection line driver 144.

The delay circuit 141 and the erase voltage generator 142 may be configured to receive an erase enable signal Een. The delay circuit 141 may be configured to activate an internal signal IS after the erase enable signal Een is input and a delay time DT elapses.

The erase voltage generator 142 may be configured to generate an erase voltage Vers in response to the erase enable signal Een. The erase voltage Vers may be supplied to a substrate 111 of a memory cell array 110.

The ground selection line driver 143 may be configured to generate the second ground selection line voltage VGSL2 in response to the internal signal IS. The second ground selection line voltage VGSL2 may be supplied to a ground selection line GSL of a selected memory block BLKa via an address decoder 120.

The string selection line driver 144 may be configured to generate the second string selection line voltage VSSL2 in response to the internal signal IS. The second string selection line voltage VSSL2 may be supplied to string selection lines SSL1 and SSL2 of a selected memory block BLKa via the address decoder 120.

Figure 17:
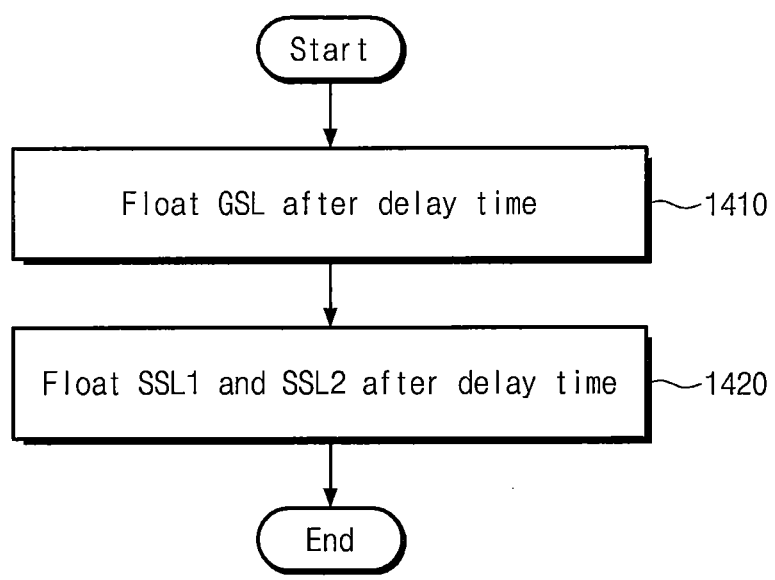
FIG. 17 is a flowchart for describing operations of controlling voltages of ground and string selection lines according to still another exemplary embodiment of the inventive concept.

FIG. 17 is a flowchart for describing operations of controlling voltages of ground and string selection lines according to still another exemplary embodiment of the inventive concept. Referring to FIGS. 3 to 7, 10, 13, and 16, in operation 1410, a ground selection line GSL may be floated after a delay time DT. In example embodiments, after generating an erase voltage Vers in response to an erase enable signal Een, a voltage generating circuit 140a may float a ground selection line GSL if the delay time DT elapses.

In operation 1420, string selection lines SSL1 and SSL2 may be floated after the delay time DT. In example embodiments, after generating an erase voltage Vers in response to the erase enable signal Een, the voltage generating circuit 140a may float the string selection lines SSL1 and SSL2 if the delay time DT elapses.

Figure 18:
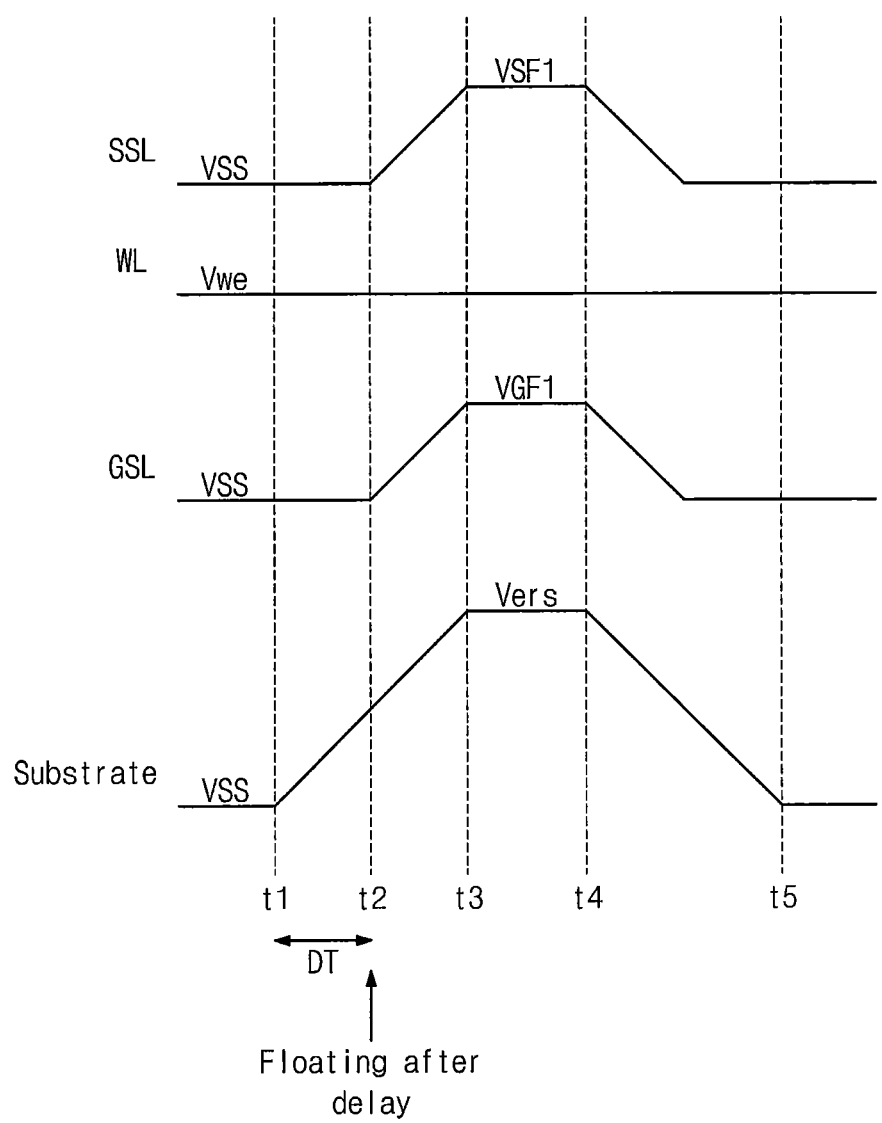
FIG. 18 is a diagram illustrating voltage variations according to an erase method described in FIGS. 10 to 17.

FIG. 18 is a diagram illustrating voltage variations according to an erase method described in FIGS. 10 to 17. Referring to FIGS. 3 to 7, 10, 13, 17, and 18, at t1, a word line erase voltage Vwe may be applied to word lines WL1 to WL6. An erase voltage Vers may be applied to a substrate 111. String and ground selection lines SSL1, SSL2, and GSL may be grounded.

After a delay time DT, at t2, string selection lines SSL1 and SSL2 may be floated. A ground selection line GSL may be floated.

The delay time DT may be controlled such that string selection transistors SST1 and SST2 are not programmed. For example, the delay time DT may be controlled such that voltages of the string selection lines SSL1 and SSL2 are lower than a voltage of the substrate 111.

The delay time DT may be controlled such that string selection transistors SST1 and SST2 are not erased. For example, the delay time DT may be controlled such that voltages of the string selection lines SSL1 and SSL2 don't become lower by a specific level than a voltage of the substrate 111.

The delay time DT may be controlled such that the string selection transistors SST1 and SST2 don't fall into a quasi-on or turn-on state.

The delay time DT may be controlled such that ground selection transistors GST are not programmed. For example, the delay time DT may be controlled such that a voltage of the ground selection line GSL is lower than a voltage of the substrate 111.

The delay time DT may be controlled such that ground selection transistors GST are not erased. For example, the delay time DT may be controlled such that a voltage of the ground selection line GSL does not become lower by a specific level than a voltage of the substrate 111.

The delay time DT may be controlled such that the ground selection transistors GST don't fall into a quasi-on or turn-on state.

At t3, voltages of the string selection lines SSL1 and SSL2 may reach the first string selection line voltage VSF1, a voltage of the ground selection line GSL may reach the first ground selection line voltage VGF1, and a voltage of the substrate 111 may reach an erase voltage Vers.

The delay time DT may be controlled such that the string selection transistors SST1 and SST2 are not erased due to a voltage difference between the string selection lines SSL1 and SSL2 and the substrate 111. For example, the delay time DT may be controlled such that the first string selection line voltage VSF1 has a level within a specific range on the basis of half an erase voltage Vers. The delay time DT can be controlled according to rising slopes of voltages of the string selection lines SSL1 and SSL2 by the coupling effect.

The delay time DT may be controlled such that the ground selection transistors GST are not erased due to a voltage difference between the ground selection line GSL and the substrate 111. For example, the delay time DT may be controlled such that the first ground selection line voltage VGF1 has a level within a specific range on the basis of half the erase voltage Vers. The delay time DT can be controlled according to a rising slope of a voltage of the ground selection line GSL by the coupling effect.

Memory cells MC1 to MC6 may be erased by a voltage difference between the word lines WL1 to WL6 and the substrate 111.

At t4, voltages of the string selection lines SSL1 and SSL2 may start to decrease from the first string selection line voltage VSF1. A voltage of the ground selection line GSL may start to decrease from the first ground selection line voltage VGF1. A voltage of the substrate 111 may start to decrease from the erase voltage Vers.

After voltages of the string and ground selection lines SSL1, SSL2, and GSL are lowered to a ground voltage VSS, at t5, a voltage of the substrate 111 may be lowered to the ground voltage VSS.

As described above, after the erase voltage Vers is applied to the substrate 111 and the delay time DT elapses, the string selection lines SSL1 and SSL2 may be floated. A voltage difference between the string selection lines SSL1 and SSL2 and the substrate 111 may be kept within a specific range.

For example, voltages of the string selection lines SSL1 and SSL2 may be prevented from being increased over a voltage of the substrate 111. Accordingly, programming of the string selection transistors SST1 and SST2 may be prevented. Further, voltages of the string selection lines SSL1 and SSL2 may be prevented from becoming lower by a specific voltage than a voltage of the substrate 111. Accordingly, erasing of the string selection transistors SST1 and SST2 may be prevented. Further, it is possible to prevent the string selection lines SSL1 and SSL2 from falling into a quasi-on or turn-on state before a voltage of the substrate 111 is transferred to the channel films 114. Accordingly, programming and deteriorating of the string selection lines SSL1 and SSL2 due to the GIDL may be prevented.

Likewise, after the erase voltage Vers is applied to the substrate 111 and the delay time DT elapses, the ground selection line GSL may be floated. A voltage difference between the ground selection line GSL and the substrate 111 may be kept within a specific range.

For example, a voltage of the ground selection line GSL may be prevented from being increased over a voltage of the substrate 111. Accordingly, programming of the ground selection transistors GST may be prevented. Further, voltages of the ground selection line GSL may be prevented from becoming lower by a specific voltage than a voltage of the substrate 111. Accordingly, erasing of the ground selection transistors GST may be prevented. Further, it is possible to prevent the ground selection transistors GST from falling into a quasi-on or turn-on state before a voltage of the substrate 111 is transferred to the channel films 114. Accordingly, programming and deteriorating of the ground selection transistors GST due to the GIDL may be prevented.

A voltage generating circuit 140a may be substantially identical to that described with reference to FIG. 16 except that the ground and string selection lines GSL, SSL1, and SSL2 are floated according to the internal signal IS.

Figure 19:
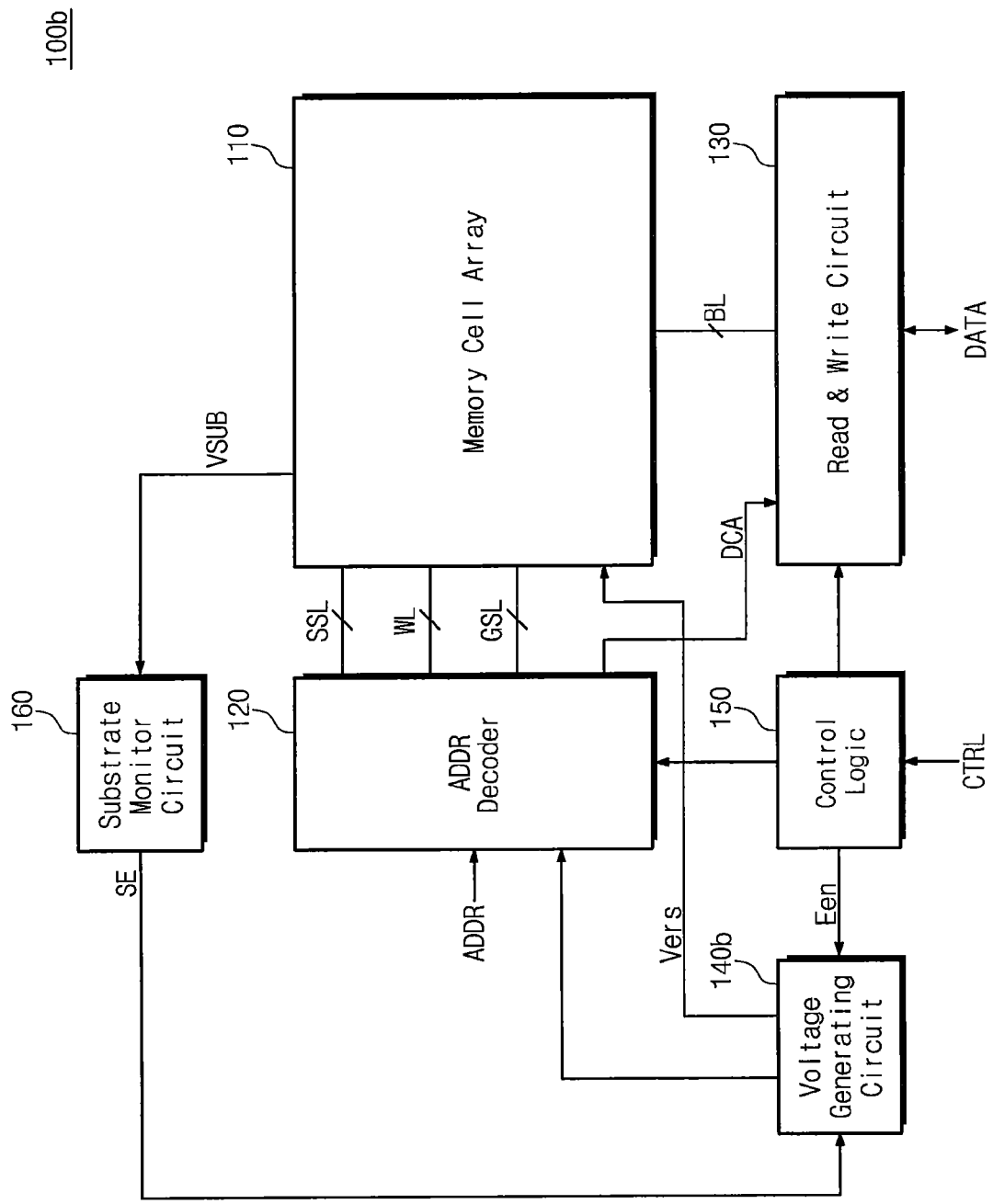
FIG. 19 is a block diagram illustrating a nonvolatile memory device according to still another exemplary embodiment of the inventive concept.

FIG. 19 is a block diagram illustrating a nonvolatile memory device according to still another exemplary embodiment of the inventive concept. Referring to FIG. 19, a nonvolatile memory device 100b may include a memory cell array 110, an address decoder 120, a read/write circuit 130, a voltage generating circuit 140b, control logic 150, and a substrate monitor circuit 160.

The nonvolatile memory device 100b may be substantially identical to that in FIG. 1 except for the voltage generating circuit 140b and the substrate monitor circuit 160, and description thereof is thus omitted.

The voltage generating circuit 140a may be configured to supply an erase voltage Vers to the memory cell array 110 in response to an erase enable signal Een. The voltage generating circuit 140b may be configured to control voltages of ground selection lines GSL, word lines WL, and string selection lines SSL to be transferred via the address decoder 120 in response to a selection signal SE.

The substrate monitor circuit 160 may be configured to monitor a voltage of a substrate 111 of the memory cell array 110. If a voltage of the substrate 111 reaches a level of a target voltage Vtar, the substrate monitor circuit 160 may activate the selection signal SE.

Figure 20:
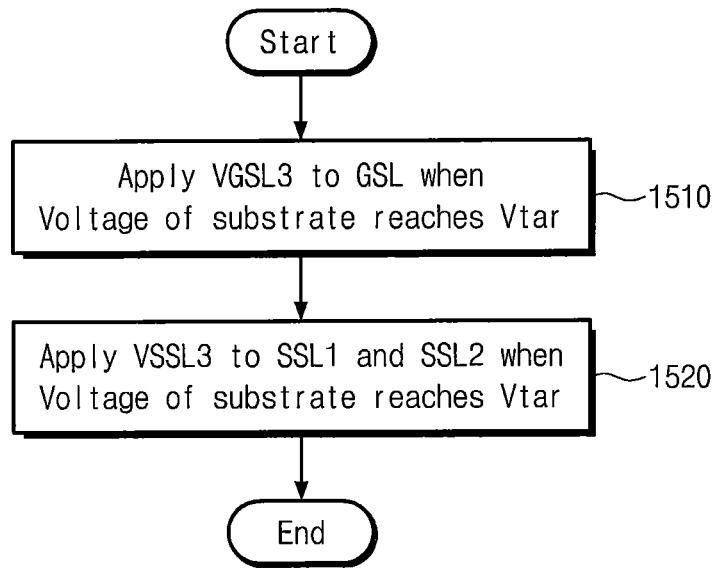
FIG. 20 is a flowchart for describing operations of controlling voltages of ground and string selection lines according to still another exemplary embodiment of the inventive concept.

FIG. 20 is a flowchart for describing operations of controlling voltages of ground and string selection lines according to still another exemplary embodiment of the inventive concept. Referring to FIGS. 3 to 7, 10, 19, and 20, in operation 1510, when a voltage of a substrate 111 reaches a target voltage Vtar, the third ground selection line voltage VGSL3 may be applied to a ground selection line GSL. In operation 1520, when a voltage of the substrate 111 reaches the target voltage Vtar, the third string selection line voltage VSSL3 may be applied to string selection lines SSL1 and SSL2.

Figure 21:
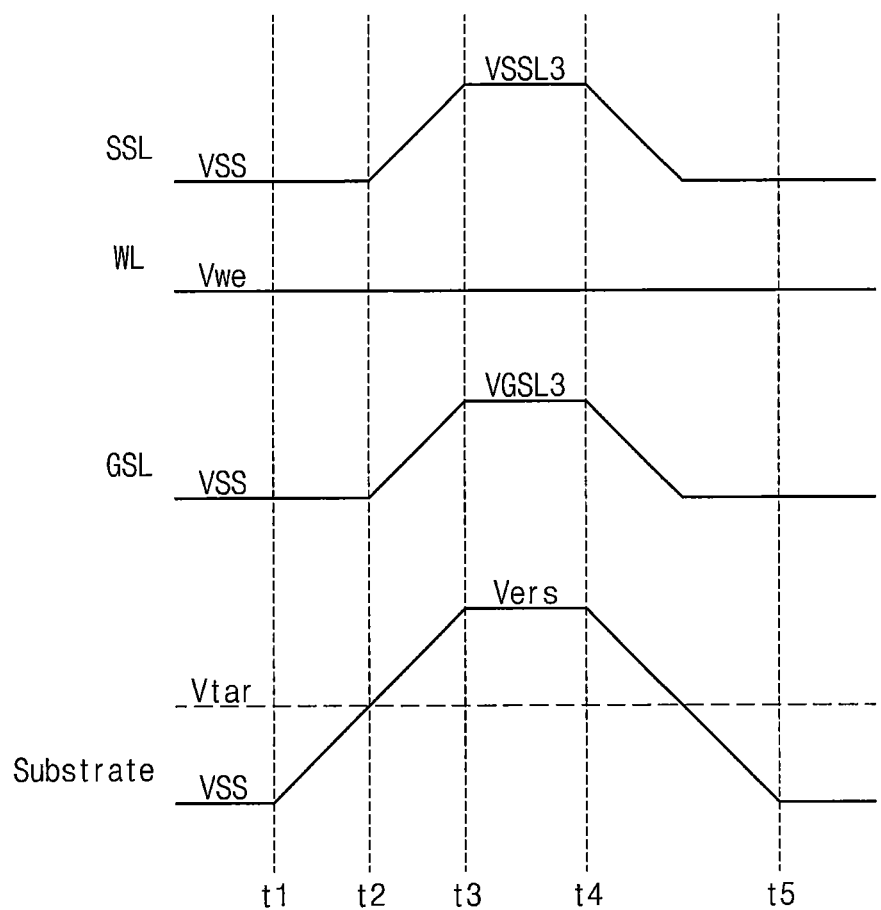
FIG. 21 is a diagram illustrating voltage variations according to an erase method described in FIGS. 10 and 20.

FIG. 21 is a diagram illustrating voltage variations according to an erase method described in FIGS. 10 and 20. Referring to FIGS. 3 to 7, 10, and 19 to 21, at t1, a word line erase voltage Vwe may be applied to word lines WL1 to WL6. An erase voltage Vers may be applied to a substrate 111. String and ground selection lines SSL1, SSL2, and GSL may be grounded.

At t2, a voltage of the substrate 111 may reach a target voltage Vtar. At this time, a substrate monitor circuit 160 may activate a selection signal SE. A voltage generating circuit 140b may supply the third string selection line voltage VSSL3 to the string selection lines SSL1 and SSL2 via an address decoder 120 in response to the selection signal SE. Further, the voltage generating circuit 140b may supply the third ground selection line voltage VGSL3 to the ground selection line GSL.

The third ground selection line voltage VGSL3 and the target voltage Vtar may be controlled such that string selection transistors SST1 and SST2 are not programmed. For example, the third ground selection line voltage VGSL3 and the target voltage Vtar may be controlled such that voltages of the string selection lines SSL1 and SSL2 are lower than a voltage of the substrate 111.

The third ground selection line voltage VGSL3 and the target voltage Vtar may be controlled such that string selection transistors SST1 and SST2 are not erased. For example, the third ground selection line voltage VGSL3 and the target voltage Vtar may be controlled such that voltages of the string selection lines SSL1 and SSL2 don't become lower by a specific level than a voltage of the substrate 111.

The third ground selection line voltage VGSL3 and the target voltage Vtar may be controlled such that the string selection transistors SST1 and SST2 don't fall into a quasi-on or turn-on state.

The third ground selection line voltage VGSL3 and the target voltage Vtar may be controlled such that ground selection transistors GST are not programmed. For example, the third ground selection line voltage VGSL3 and the target voltage Vtar may be controlled such that a voltage of the ground selection line GSL is lower than a voltage of the substrate 111.

The third ground selection line voltage VGSL3 and the target voltage Vtar may be controlled such that ground selection transistors GST are not erased. For example, the third ground selection line voltage VGSL3 and the target voltage Vtar may be controlled such that a voltage of the ground selection line GSL does not become lower by a specific level than a voltage of the substrate 111.

The third ground selection line voltage VGSL3 and the target voltage Vtar may be controlled such that the ground selection transistors GST don't fall into a quasi-on or turn-on state.

At t3, voltages of the string selection lines SSL1 and SSL2 may reach the third string selection line voltage VSSL3, a voltage of the ground selection line GSL may reach the third ground selection line voltage VGSL3, and a voltage of the substrate 111 may reach an erase voltage Vers.

The third ground selection line voltage VGSL3 may be controlled such that the string selection transistors SST1 and SST2 are not erased due to a voltage difference between the string selection lines SSL1 and SSL2 and the substrate 111. For example, the third ground selection line voltage VGSL3 may be controlled to have a level within a specific range on the basis of half the erase voltage Vers.

The third ground selection line voltage VGSL3 may be controlled such that the ground selection transistors GST are not erased due to a voltage difference between the ground selection line GSL and the substrate 111. For example, the third ground selection line voltage VGSL3 may be controlled to have a level within a specific range on the basis of half the erase voltage Vers.

Memory cells MC1 to MC6 may be erased by a voltage difference between the word lines WL1 to WL6 and the substrate 111.

At t4, voltages of the string selection lines SSL1 and SSL2 may start to decrease from the third string selection line voltage VSSL1. A voltage of the ground selection line GSL may start to decrease from the third ground selection line voltage VGSL3. A voltage of the substrate 111 may start to decrease from the erase voltage Vers.

In example embodiments, after voltages of the string and ground selection lines SSL1, SSL2, and GSL are lowered to a ground voltage VSS, at t5, a voltage of the substrate 111 may be lowered to the ground voltage VSS.

As described above, when a voltage of the substrate 111 reaches the target voltage Vtar, the third string selection line voltage VSSL3 may be applied to the string selection lines SSL1 and SSL2. A voltage difference between the string selection lines SSL1 and SSL2 and the substrate 111 may be kept within a specific range.

For example, voltages of the string selection lines SSL1 and SSL2 may be prevented from being increased over a voltage of the substrate 111. Accordingly, programming of the string selection transistors SST1 and SST2 may be prevented. Further, voltages of the string selection lines SSL1 and SSL2 may be prevented from becoming lower by a specific voltage than a voltage of the substrate 111. Accordingly, erasing of the string selection transistors SST1 and SST2 may be prevented. Further, it is possible to prevent the string selection lines SSL1 and SSL2 from falling into a quasi-on or turn-on state before a voltage of the substrate 111 is transferred to the channel films 114. Accordingly, programming and deteriorating of the string selection lines SSL1 and SSL2 due to the GIDL may be prevented.

Likewise, when a voltage of the substrate 111 reaches the target voltage Vtar, the third ground selection line voltage VGSL3 may be applied to the ground selection line GSL. A voltage difference between the ground selection line GSL and the substrate 111 may be kept within a specific range.

For example, a voltage of the ground selection line GSL may be prevented from being increased over a voltage of the substrate 111. Accordingly, programming of the ground selection transistors GST may be prevented. Further, voltages of the ground selection line GSL may be prevented from becoming lower by a specific voltage than a voltage of the substrate 111. Accordingly, erasing of the ground selection transistors GST may be prevented. Further, it is possible to prevent the ground selection transistors GST from falling into a quasi-on or turn-on state before a voltage of the substrate 111 is transferred to the channel films 114. Accordingly, programming and deteriorating of the ground selection transistors GST due to the GIDL may be prevented.

Figure 22:
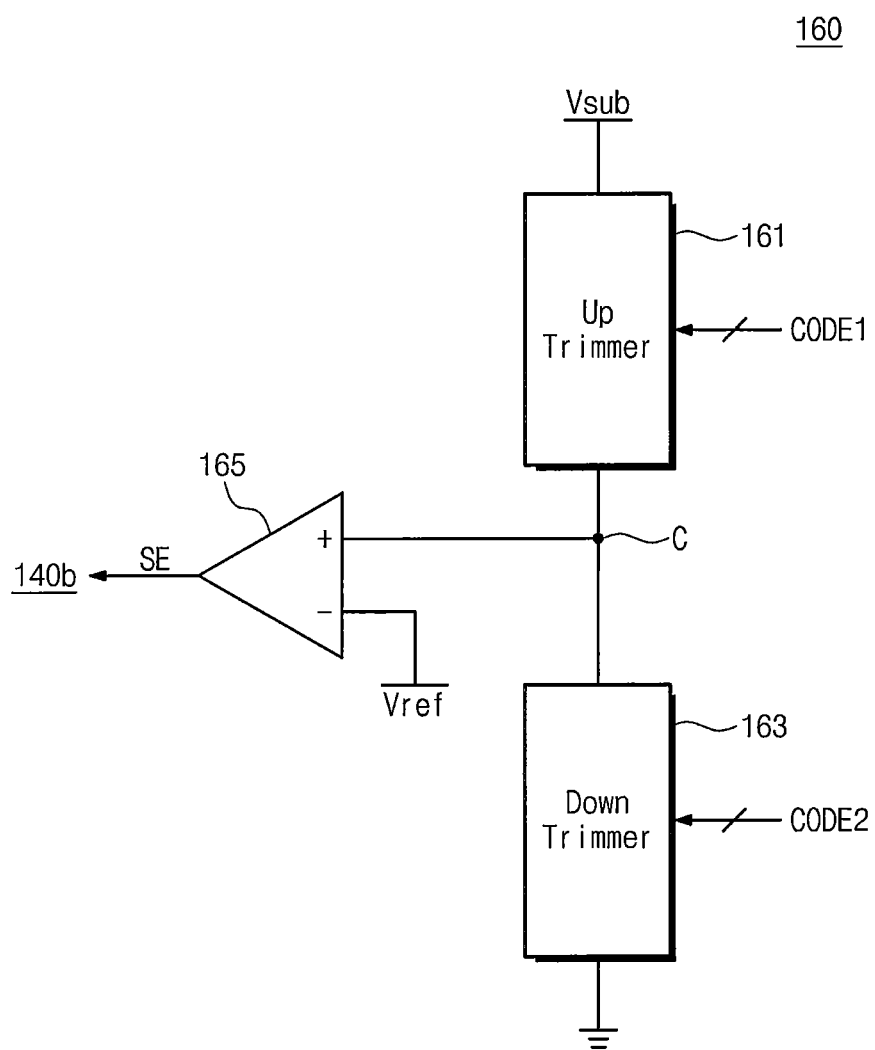
FIG. 22 is a block diagram illustrating a substrate monitor circuit in FIG. 19.

FIG. 22 is a block diagram illustrating a substrate monitor circuit in FIG. 19. Referring to FIG. 22, a substrate monitor circuit 130 may include an up-trimmer 161, a down-trimmer 163, and a comparator 165.

A substrate voltage Vsub may be provided to the up-trimmer 161. The down-trimmer 163 may be connected with a ground terminal. An intermediate node C between the up-trimmer 161 and the down-trimmer 163 may be connected with the comparator 165. The up-trimmer 161 and the down-trimmer 163 may be configured to divide the substrate voltage Vsub. For example, the up-trimmer 161 and the down-trimmer 163 may be configured to have a resistance value. That is, a voltage divided by the up-trimmer 161 and the down-trimmer 163 may be provided to the comparator 135.

In example embodiments, the up-trimmer 161 and the down-trimmer 163 may be configured to have a variable resistance value. For example, the up-trimmer 161 may be configured to adjust a resistance value in response to the first code signal CODE1. The down-trimmer 163 may be configured to adjust a resistance value in response to the second code signal CODE2.

The comparator 165 may compare a voltage of the intermediate node C and a reference voltage Vref to activate a selection signal SE according to the comparison. The selection signal SE may be transferred to a voltage generating circuit 140*b*. The voltage generating circuit 140*b* may supply the third string selection line voltage VSSL3 to string selection lines SSL1 and SSL2 of a selected memory block BLKa in response to the selection signal SE. That is, a target voltage Vtar may be determined according to a level of the reference voltage Vref and a division rate of the up-trimmer 161 and the down-trimmer 163.

The division rate of the up-trimmer 161 and the down-trimmer 163 may be controlled according to the first and second code signals CODE1 and CODE2. Accordingly, a level of the target voltage Vtar may be varied according to the code signals CODE1 and CODE2.

In FIG. 22, there is exemplarily described such an example that an output of the comparator 165 is used as the selection signal SE. However, a logic block can be further provided which outputs the selection signal SE by adjusting an output of the comparator 165.

Figure 23:
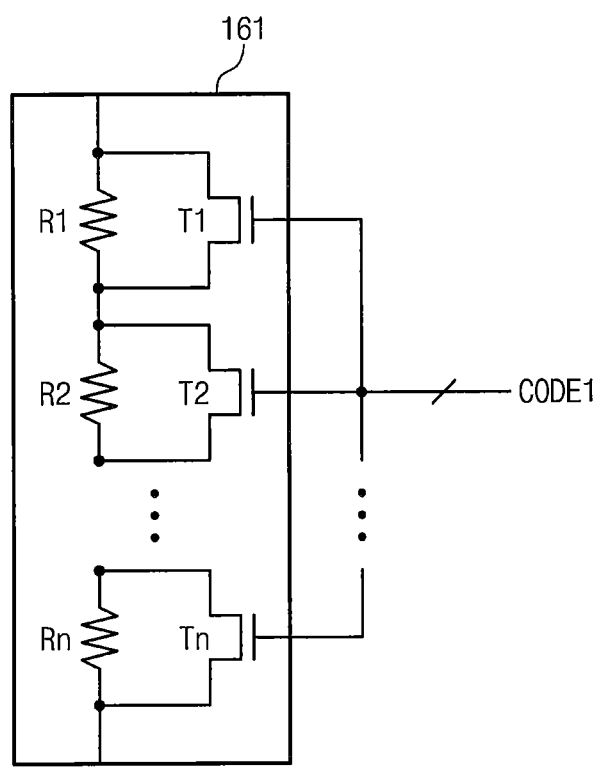
FIG. 23 is a circuit diagram illustrating an up-trimmer in FIG. 22.

FIG. 23 is a circuit diagram illustrating an up-trimmer in FIG. 22. Referring to FIG. 23, an up-trimmer 161 may include a plurality of resistors R1 to Rn and a plurality of switches T1 to Tn. In example embodiments, the switches T1 to Tn may be formed of transistors. However, the inventive concept is not limited thereto.

The resistors R1 to Rn may be connected in series. The resistors R1 to Rn may be connected in parallel with the transistors T1 to Tn, respectively. The transistors T1 to Tn may operate responsive to the first code signal CODE1. In example embodiments, if the transistor T1 is turned on, it may provide a bypass path of the resistor R1. Accordingly, a resistance value of the up-trimmer 131 may decrease. If the transistor T1 is turned off, the bypass path of the resistor R1 may not be formed. Accordingly, a resistance value of the resistor R1 may be reflected to a resistance value of the up-trimmer 131.

A down-trimmer 163 in FIG. 22 may be identical to the up-trimmer 161 except that the second code signal CODE2 is provided to the down-trimmer 163, and description thereof is thus omitted.

As described above, a resistance value of the up-trimmer 161 may be adjusted according to the first code signal CODE1. Further, a resistance value of the down-trimmer 163 may be adjusted according to the second code signal CODE2. As a result, a level of a target voltage Vtar may be varied according to the first and second code signals CODE1 and CODE2.

Figure 24:
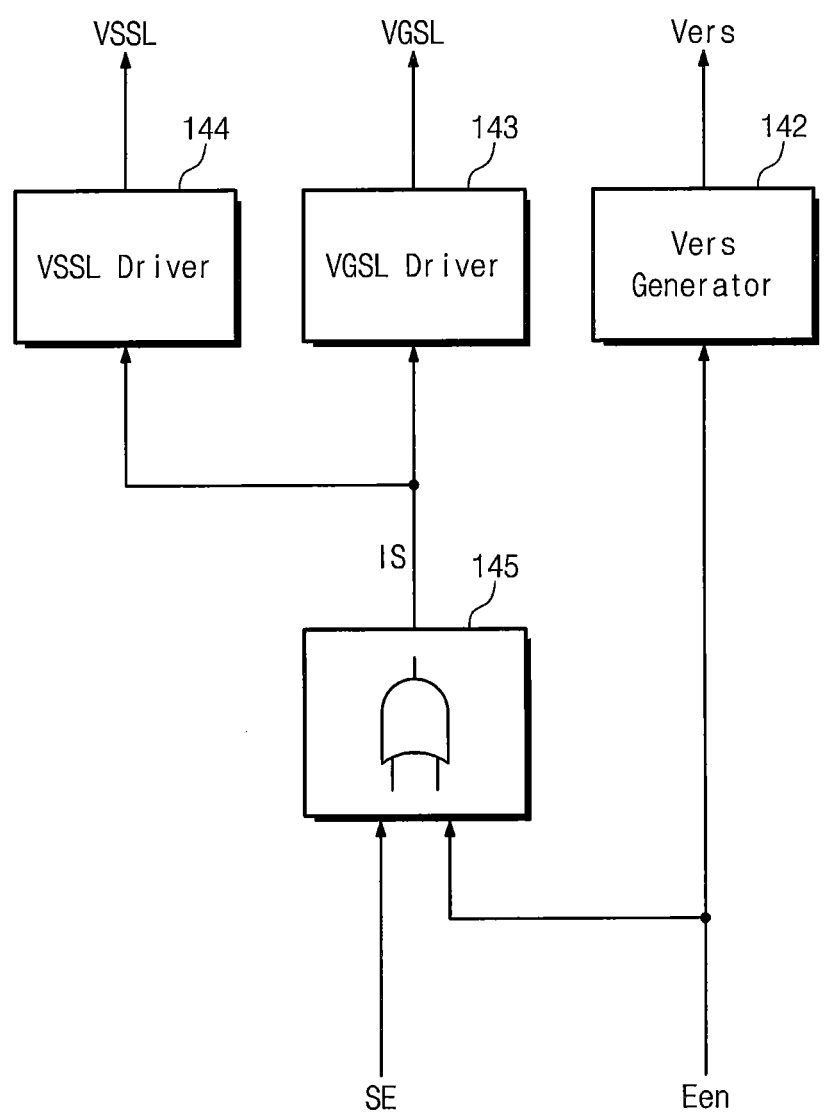
FIG. 24 is a block diagram illustrating a voltage generating circuit in FIG. 19.

FIG. 24 is a block diagram illustrating a voltage generating circuit in FIG. 19. Referring to FIGS. 19 and 24, a voltage generating circuit 140b may include an erase voltage generating 142, a ground selection line driver 143, a string selection line driver 144, and a gate circuit 145.

The erase voltage generator 142 may operate in response to an erase enable signal Een. The erase voltage generator 142 may be configured to generate an erase voltage Vers in response to the erase enable signal Een. The erase voltage Vers may be supplied to a substrate 111 of a memory cell array 110.

The gate circuit 145 may operate in response to the erase enable signal Een and a selection signal SE. When the erase enable signal Een and the selection signal SE are at an active state, the gate circuit 145 may activate an internal signal IS. The internal signal IS may be provided to the ground selection line driver 143 and the string selection line driver 144.

The ground selection line driver 143 may be configured to generate the third ground selection line voltage VGSL3 in response to the internal signal IS. The third ground selection line voltage VGSL3 may be supplied to a ground selection line GSL via an address decoder 120.

The string selection line driver 144 may be configured to generate the third string selection line voltage VSSL3 in response to the internal signal IS. The third string selection line voltage VSSL3 may be supplied to string selection lines SSL1 and SSL2 via the address decoder 120.

With an erase method of the inventive concept, a ground voltage VSS may be supplied to ground and string selection lines GSL, SSL1, and SSL2. As the ground voltage VSS is supplied to the ground and string selection lines GSL, SSL1, and SSL2, ground and string selection transistors GST, SST1, and SST2 may be prevented from falling into quasi-on and turn-on states.

Further, with the erase method of the inventive concept, voltages of the ground and string selection lines GSL, SSL1, and SSL2 may be controlled from a ground voltage VSS in response to applying of the erase voltage Vers. In example embodiments, a voltage difference between voltages of the string selection lines SSL1 and SSL2 and a voltage of a substrate 111 may be kept within a specific range. Accordingly, it is possible to prevent the ground and string selection transistors GST, SST1, and SST2 from being programmed and erased.

Figure 25:
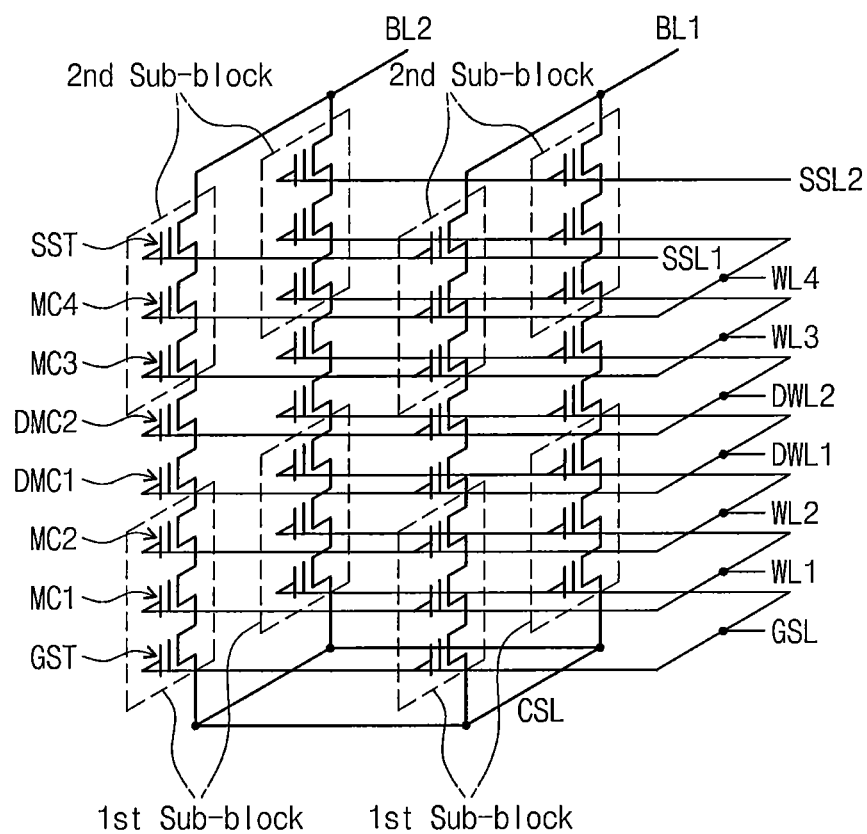
FIG. 25 is a circuit diagram illustrating an equivalent circuit of a memory block in FIGS. 3 to 6 according to another exemplary embodiment of the inventive concept.

FIG. 25 is a circuit diagram illustrating an equivalent circuit of a memory block in FIGS. 3 to 6 according to another exemplary embodiment of the inventive concept. Referring to FIGS. 3 to 6 and 25, a memory block BLKa2 may be divided into a plurality of sub memory blocks along the second direction. Dummy memory cells DMC1 and DMC2 and dummy word lines DWL1 and DWL2 may be provided between sub memory blocks.

In example embodiments, memory cells MC1 to MC4 of the equivalent circuit BLKa2 may constitute one memory block. At an erase operation, an erase method of the equivalent circuit BLKa2 may be identical to that described with reference to an equivalent circuit BLKa1 in FIG. 7 except that a dummy word line voltage VDWL is supplied to the dummy word lines DWL1 and DWL2 or the dummy word lines DWL1 and DWL2 are floated. The dummy word line voltage VDWL may be higher than a word line erase voltage Vwe and lower than an erase voltage Vers.

In other example embodiments, the memory cells MC1 to MC4 of the equivalent circuit BLKa2 may form sub memory blocks on the basis of dummy memory cells DMC1 and DMC2.

The second and third conductive materials CM2 and CM3 may form the first and second memory cells MC1 and MC2 and the first and second word lines WL1 and WL2, which constitute the first sub memory block. The fourth and fifth conductive materials CM4 and CM5 may form dummy memory cells DMC1 and DMC2 and dummy word lines DWL1 and DWL2. The sixth and seventh conductive materials CM6 and CM7 may form the third and fourth memory cells MC3 and MC4 and the third and fourth word lines WL3 and WL4, which constitute the second sub memory block.

The memory block BLKa2 may be erased by the sub memory block. As described with reference to FIGS. 10 to 24, a word line erase voltage Vwe may be applied to word lines of a selected sub memory block. Word lines of an unselected sub memory block may be program inhibited. For example, word lines of an unselected sub memory block may be floated. An intermediate voltage can be applied to word lines of an unselected sub memory block. The intermediate voltage may be a voltage between the erase voltage Vers and the word line erase voltage Vwe.

The memory block BLKa2 may be erased as described with reference to FIGS. 10 to 24 except that it is erased by the sub memory block. At an erase operation, a ground voltage VSS may be applied to a ground selection line GSL and string selection lines SSL1 and SSL2. Voltages of the ground and string selection lines GSL, SSL1, and SSL2 may be controlled in response to applying of an erase voltage Vers to a substrate 111.

In example embodiments, there is exemplarily described such an example that the memory block BLKa2 is divided into two sub memory blocks. However, the number of sub memory blocks is not limited thereto. Further, there is exemplarily described such an example that two dummy word lines DWL1 and DWL2 are provided between sub memory blocks of the memory block BLKa2. However, the number of dummy word lines DWL1 and DWL2 provided between sub memory blocks is not limited thereto.

Figure 26:
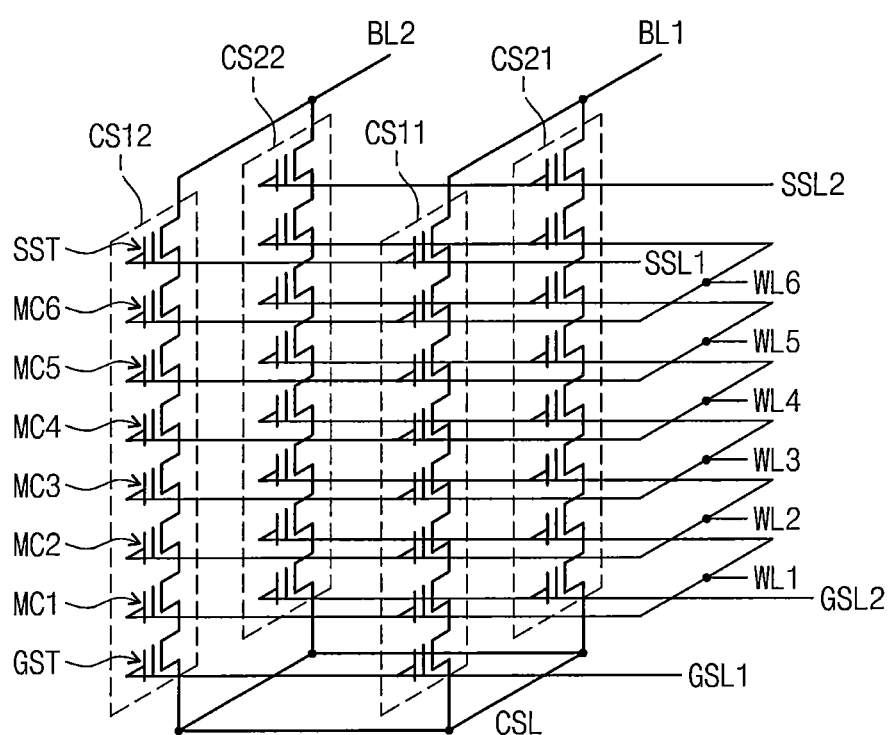
FIG. 26 is a circuit diagram illustrating an equivalent circuit of a memory block in FIGS. 3 to 6 according to still another exemplary embodiment of the inventive concept.

FIG. 26 is a circuit diagram illustrating an equivalent circuit of a memory block in FIGS. 3 to 6 according to still another exemplary embodiment of the inventive concept. Referring to FIGS. 3 to 6 and 26, cell strings of the same row may share a ground selection line. Cell strings of different rows may be connected with different ground selection lines. That is, ground selection transistors GST may be connected with the first and second ground selection lines GSL1 and GSL2.

The memory block BLKa3 in FIG. 26 may be erased as described with reference to FIGS. 10 to 24 except that a plurality of ground selection lines GSL1 and GSL2 is provided. At an erase operation, a ground voltage VSS may be applied to ground and string selection lines GSL1, GSL2, SSL1, and SSL2. Voltages of the ground and string selection lines GSL1, GSL2, SSL1, and SSL2 may be controlled in response to applying of an erase voltage Vers to a substrate 111.

Figure 27:
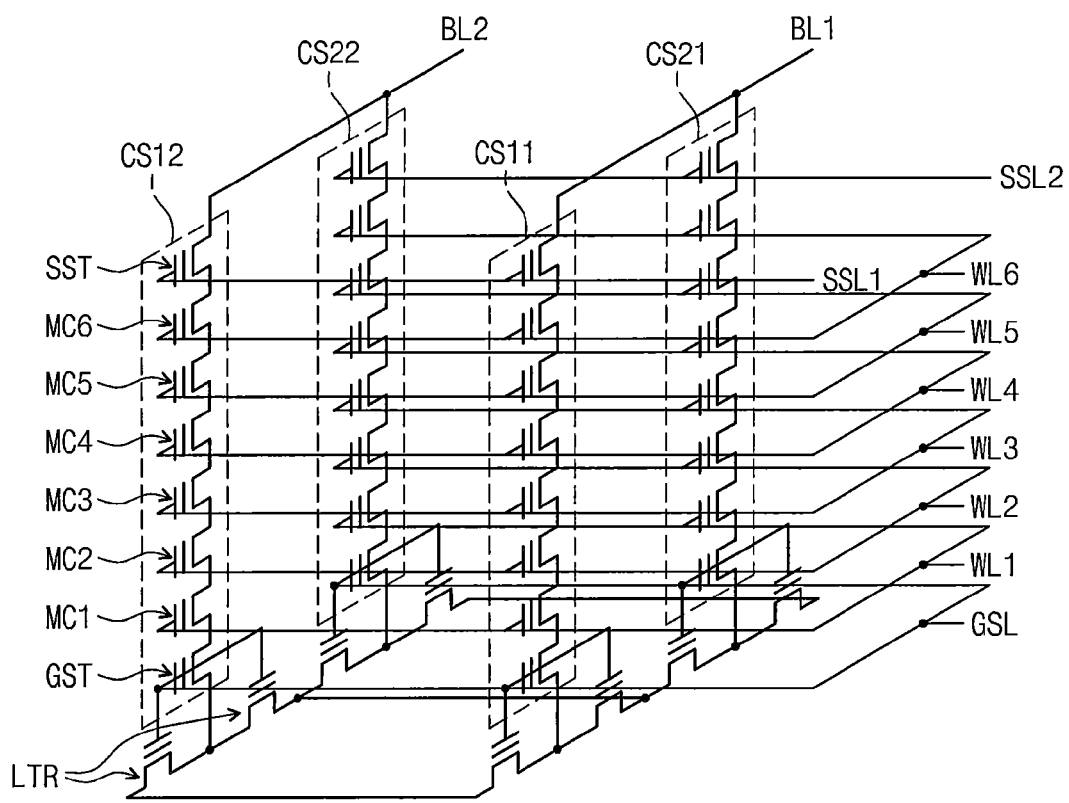
FIG. 27 is a circuit diagram illustrating an equivalent circuit of a memory block in FIGS. 3 to 6 according to still another exemplary embodiment of the inventive concept.

FIG. 27 is a circuit diagram illustrating an equivalent circuit of a memory block in FIGS. 3 to 6 according to still another exemplary embodiment of the inventive concept. As compared with an equivalent circuit BLKa1 in FIG. 7, a memory block BLKa4 may further include lateral transistors LTR provided at each cell string.

Referring to FIGS. 3 to 6 and 27, lateral transistors LTR in each cell string may be connected between a ground selection transistor GST and a common source line CSL. Gates of the lateral transistors LTR in each cell string may be connected to a ground selection line GSL together with a gate (or, a control gate) of a ground selection transistor GST therein.

The first conductive materials CM1 may correspond to the first and second ground selection lines GSL1 and GSL2, respectively. If a specific voltage is applied to the first conductive materials CM1, channels may be formed at portions of channel films 114 adjacent to the first conductive materials CM1. That is, channels of the ground selection transistors GST may be formed. If the specific voltage is applied to the first conductive materials CM1, channels may be formed at portions of a substrate 111 adjacent to the first conductive materials CM1.

The first to third doping regions 311 to 313 may be interconnected to form a common source line CSL. The common source line CSL and channels of memory cells MC1 to MC6 may be electrically connected via channels (e.g., horizontal channels) generated at the substrate 111 by a voltage of the ground selection line GSL and channels (e.g., vertical channels) generated at the channel films 114.

That is, between the common source line CSL and the first memory cells MC1, a transistor perpendicular to the substrate 111 and transistors parallel with the substrate 111 may be provided. The transistors may be driven by the ground selection line GSL. The transistor perpendicular to the substrate may be a ground selection transistor GST, and the transistors parallel with the substrate 111 may be lateral transistors LTR.

Figure 28:
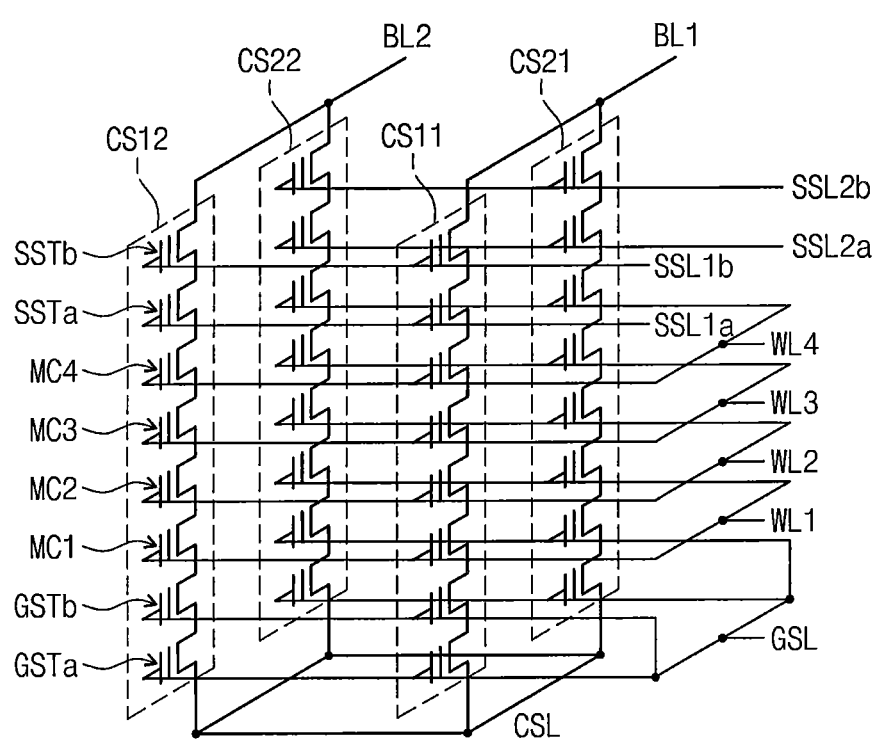
FIG. 28 is a circuit diagram illustrating an equivalent circuit of a memory block in FIGS. 3 to 6 according to still another exemplary embodiment of the inventive concept.

FIG. 28 is a circuit diagram illustrating an equivalent circuit of a memory block in FIGS. 3 to 6 according to still another exemplary embodiment of the inventive concept. As compared with an equivalent circuit BLKa1 in FIG. 7, in each cell string, two ground selection transistors GSTa and GSTb may be provided between memory cells MC1 to MC4 and a common source line CSL, and two string selection transistors SSTa and SSTb may be provided between the memory cells MC1 to MC4 and bit lines BL1 and BL2.

The first conductive materials CM1 may form ground selection transistors GSTa, and the second conductive materials CM2 may form ground selection transistors GSTb. In cell strings of the same row, the ground selection transistors GSTa and GSTb may share a ground selection line GSL. In cell strings of different rows, the ground selection transistors GSTa and GSTb may share a ground selection line GSL. That is, the ground selection transistors GSTa and GSTb may be connected in common with one ground selection line GSL.

The seventh conductive materials CM7 may form string selection transistors SSTa, and the eighth conductive materials CM8 may form string selection transistors SSTb. In cell strings of the same row, string selection transistors SSTa or SSTb having the same height may share one string selection line. String selection transistors SSTa and SSTb having different heights may be connected with different string selection lines.

In cell strings CS11 to CS12 of the first row, the string selection transistors SSTa may share a string selection line SSL1a, and the string selection transistors SSTb may share a string selection line SSL1b. In cell strings CS21 to CS22 of the second row, the string selection transistors SST1a may share a string selection line SSL2a, and the string selection transistors SSTb may share a string selection line SSL2b.

There is exemplarily described such an example that each cell string includes two ground selection transistors GSTa and GSTb. That is, the first and second conductive materials CM1 and CM2 may form ground selection transistors GSTa and GSTb. However, the number of ground selection transistors included in each cell string is not limited thereto. For example, each cell string may be configured to include at least one ground selection transistor.

There is exemplarily described such an example that each cell string includes two string selection transistors SSTa and SSTb. That is, the seventh and eighth conductive materials CM7 and CM8 may form string selection transistors SSTa and SSTb. However, the number of string selection transistors included in each cell string is not limited thereto. For example, each cell string may be configured to include at least one string selection transistor.

Figure 29:
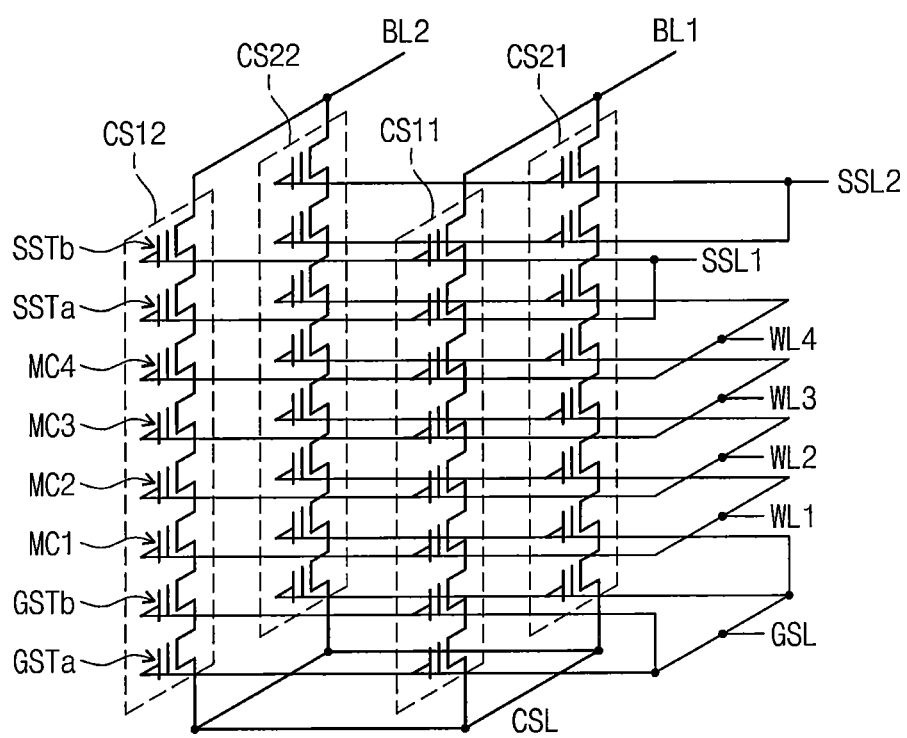
FIG. 29 is a circuit diagram illustrating an equivalent circuit of a memory block in FIGS. 3 to 6 according to still another exemplary embodiment of the inventive concept.

FIG. 29 is a circuit diagram illustrating an equivalent circuit of a memory block in FIGS. 3 to 6 according to still another exemplary embodiment of the inventive concept. In cell strings of the same row, string selection transistors SSTa and SSTb may share one string selection line as compared with an equivalent circuit BLKa5 in FIG. 28.

String selection transistors SSTa and SSTb of cell strings CS11 and CS12 of the first row may be connected in common with the first string selection line SSL1. String selection transistors SSTa and SSTb of cell strings CS21 and CS22 of the second row may be connected in common with the second string selection line SSL2.

As described with reference to FIG. 28, the number of string and ground selection transistors included in each cell string is not limited to this disclosure.

Figure 30:
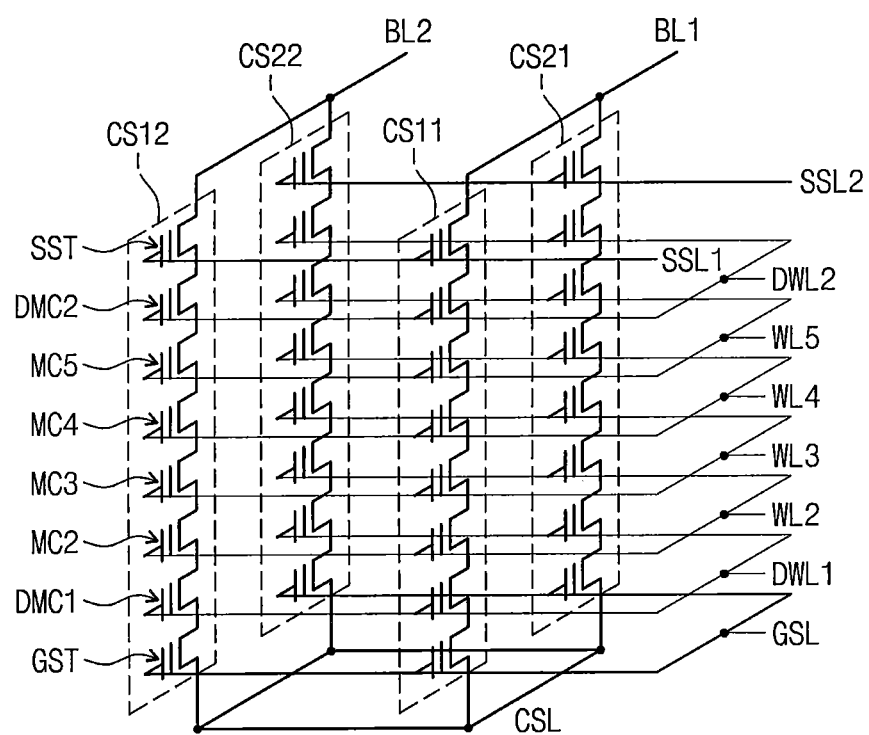
FIG. 30 is a circuit diagram illustrating an equivalent circuit of a memory block in FIGS. 3 to 6 according to still another exemplary embodiment of the inventive concept.

FIG. 30 is a circuit diagram illustrating an equivalent circuit of a memory block in FIGS. 3 to 6 according to still another exemplary embodiment of the inventive concept. As compared with an equivalent circuit BLKa1 in FIG. 7, the first dummy memory cells DMC1 may be provided between memory cells MC2 and ground selection transistors GST. The first dummy memory cells DMC1 may be connected in common with the first dummy word line DWL1. The first conductive materials CM1 may be interconnected to form the first dummy word line DWL1.

The second dummy memory cells DMC2 may be provided between memory cells MC5 and string selection transistors SST. The second dummy memory cells DMC2 may be connected in common with the second dummy word line DWL2. The eighth conductive materials CM8 may be interconnected to form the second dummy word line DWL2.

There is exemplarily described the case that each cell string includes two dummy memory cells DMC1 and DMC2. That is, the first and eighth conductive materials CM1 and CM8 may form dummy memory cells DMC1 and DMC2. However, the number of dummy memory cells included in each cell string is not limited thereto. For example, each cell string may be configured to include at least one dummy memory cell adjacent to a ground selection transistor. Further, each cell string may be configured to include at least one dummy memory cell adjacent to a string selection transistor.

Figure 31:
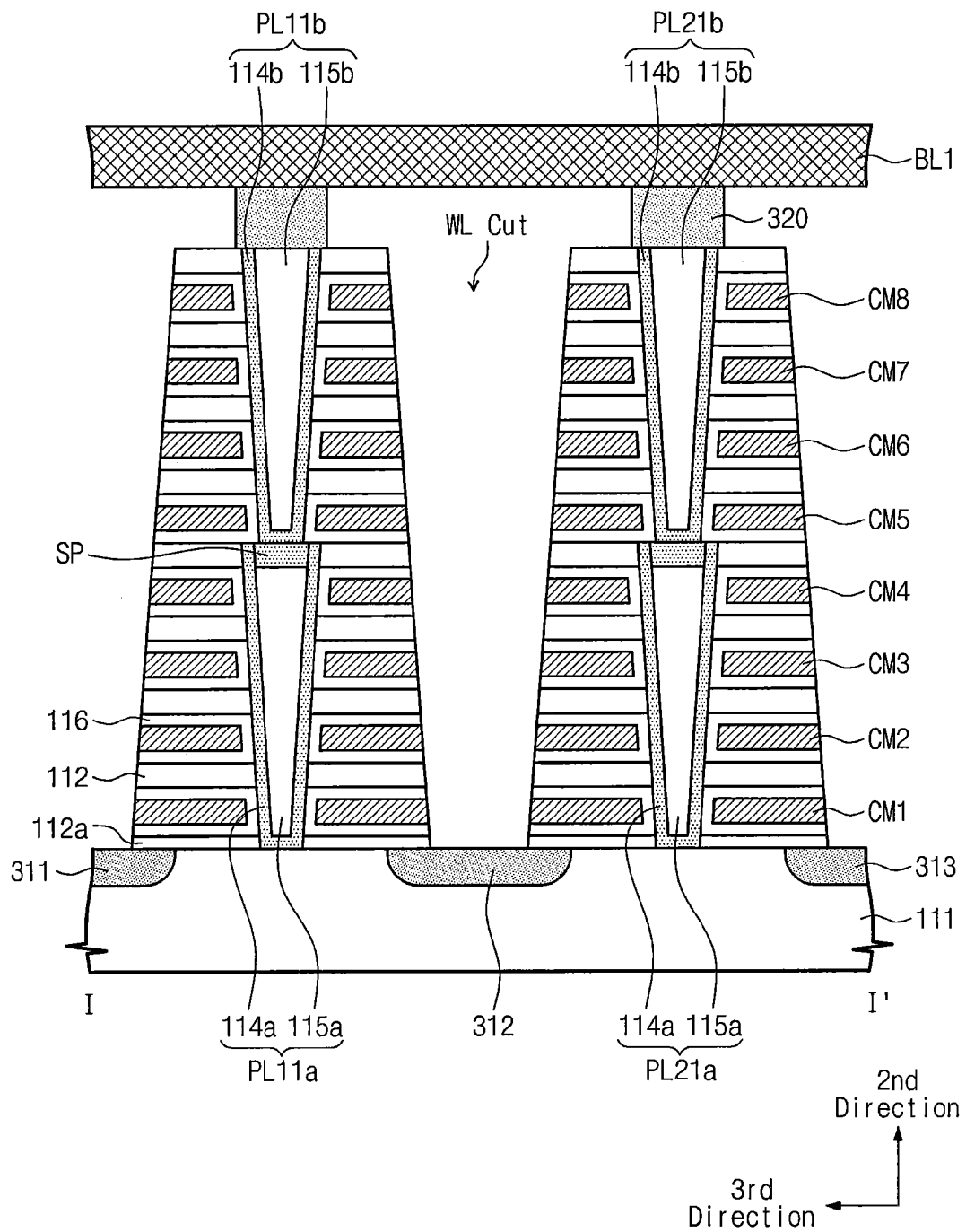
FIG. 31 is a cross-sectional view taken along a line I-I' in FIG. 3 according to another exemplary embodiment of the inventive concept.

FIG. 31 is a cross-sectional view taken along a line I-I' in FIG. 3 according to another exemplary embodiment of the inventive concept. Referring to FIGS. 3, 4, and 31, pillars PL11, PL12, PL21, and PL22 may include lower pillars PL11a, PL12a, PL21a, and PL22a and upper pillars PL11b, PL12b, PL21b, and PL22b.

The lower pillars PL11a, PL12a, PL21a, and PL22a may be provided on a substrate 111. The lower pillars PL11a, PL12a, PL21a, and PL22a may include lower channel films 114a and lower inner materials 115a. The lower channel films 114a may include a semiconductor material having the same conductive type as the substrate 111 or intrinsic semiconductor. The lower channel films 114a may act as a second-direction body. The lower inner materials 115a may include an insulation material.

The upper pillars PL11b, PL12b, PL21b, and PL22b may be provided on the lower pillars PL11a, PL12a, PL21a, and PL22a. The upper pillars PL11b, PL12b, PL21b, and PL22b may include upper channel films 114b and upper inner materials 115b. The upper channel films 114b may include a semiconductor material having the same conductive type as the substrate 111 or intrinsic semiconductor. The upper channel films 114b may act as a second-direction body. The upper inner materials 115b may include an insulation material.

The lower channel films 114a and the upper channel films 114b may be interconnected to form a second-direction body. In example embodiments, semiconductor pads SP may be provided on the lower pillars PL11a, PL12a, PL21a, and PL22a. The semiconductor pads SP may include a semiconductor material having the same conductive type as the substrate 111 or intrinsic semiconductor. The lower channel films 114a and the upper channel films 114b may be coupled via the semiconductor pads SP.

An equivalent circuit of a memory block BLKa may be identical to that BLKa1 in FIG. 7. Accordingly, the memory block BLKa may operate according to a method described with reference to the equivalent circuit BLKa1 in FIG. 7.

In this embodiment, among conductive materials CM1 to CM8 having the first to eighth heights, conductive materials adjacent to the semiconductor pads SP may constitute dummy word lines and dummy memory cells. For example, the fourth conductive material CM4, the fifth conductive material CM5, or the fourth and fifth conductive materials CM4 and CM5 may constitute dummy word lines and dummy memory cells.

At this time, an equivalent circuit of a memory block BLKa may be identical to that BLKa2 in FIG. 25. Accordingly, the memory block BLKa may operate according to a method described with reference to the equivalent circuit BLKa2 in FIG. 25.

Figure 32:
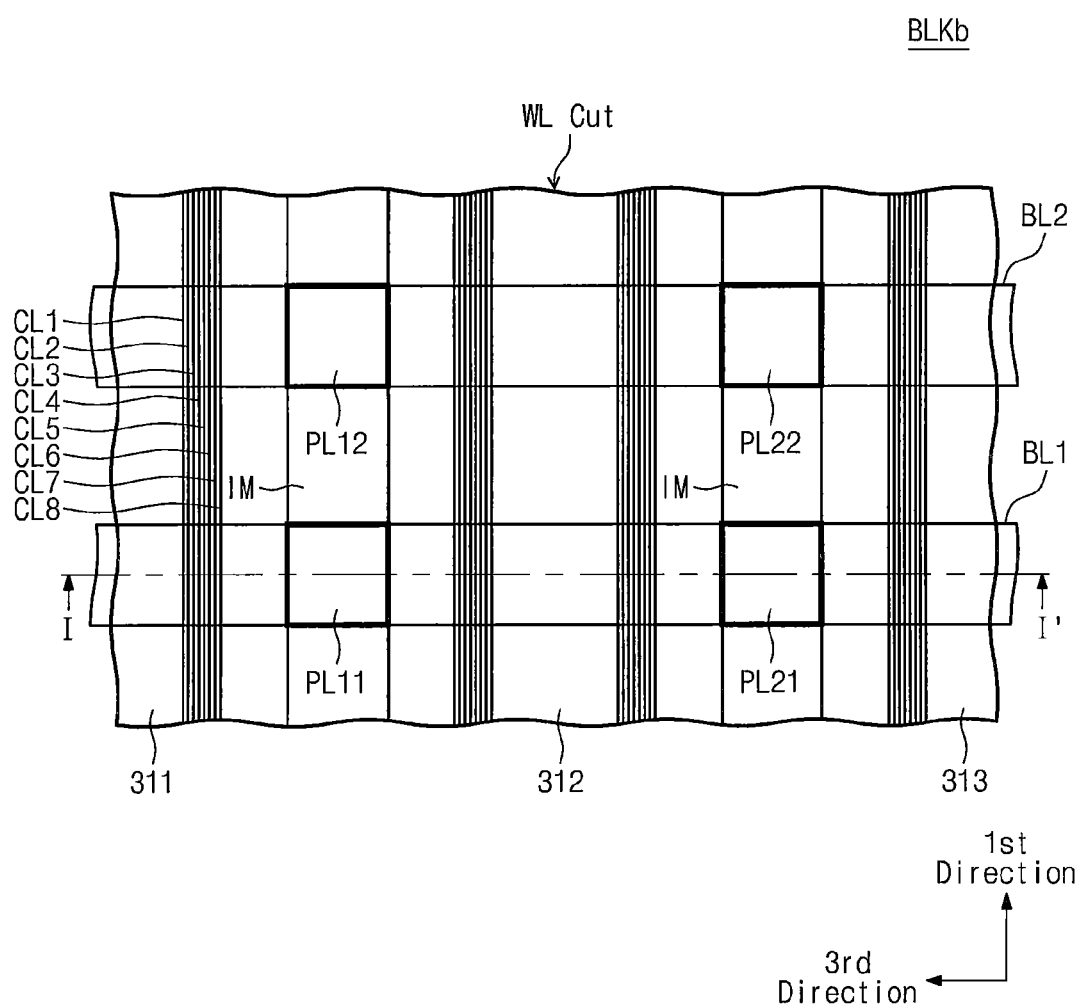
FIG. 32 is a plan view illustrating a part of one of the memory blocks in FIG. 2 according to another exemplary embodiment of the inventive concept.
Figure 33:
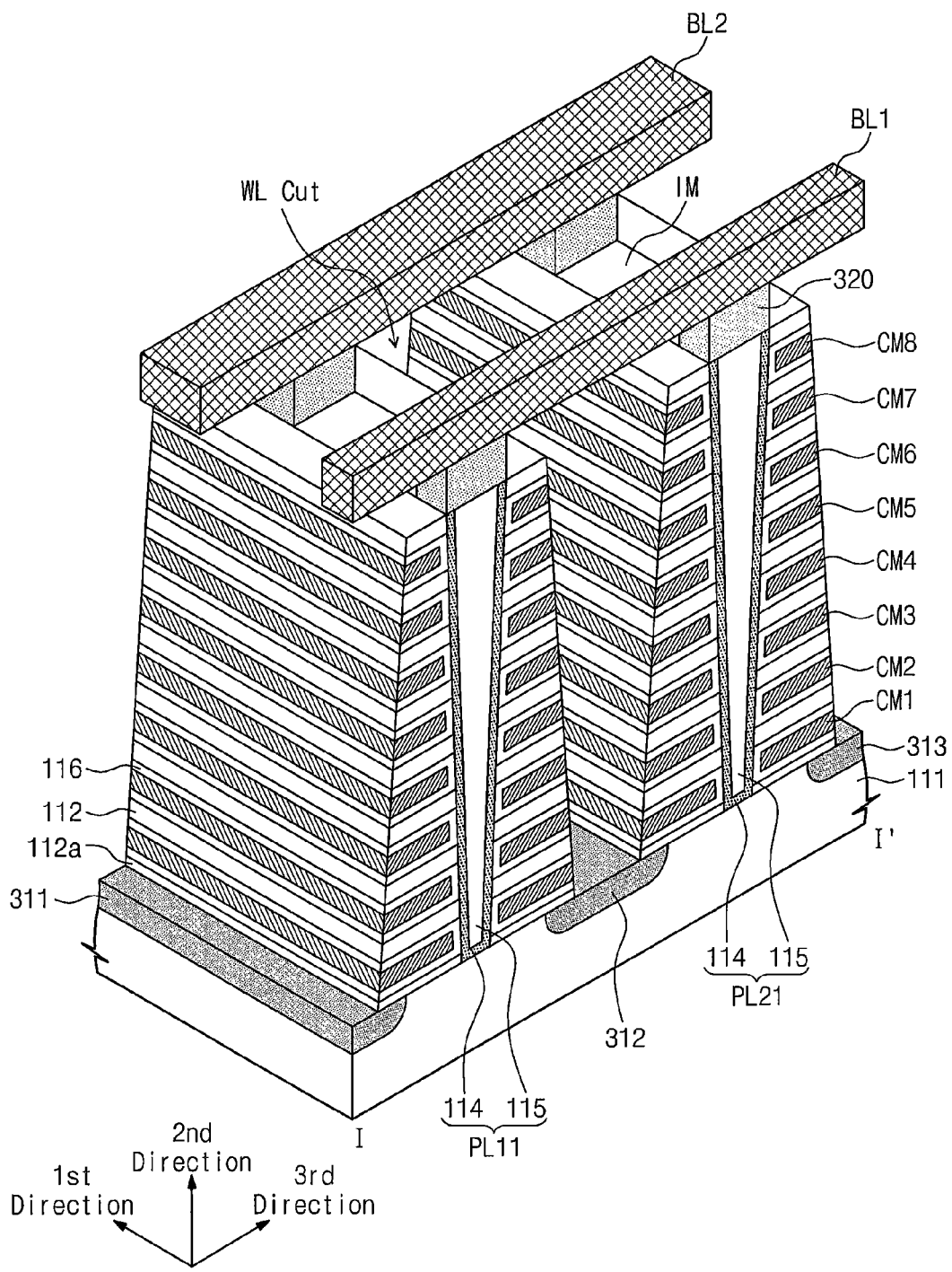
FIG. 33 is a perspective view illustrating a memory block taken along a line I-I' of FIG. 32.

FIG. 32 is a plane view illustrating a part of one of memory blocks in FIG. 2 according to another exemplary embodiment of the inventive concept. In example embodiments, conductive layers of a memory block BLKb are illustrated in FIG. 32. FIG. 33 is a perspective view illustrating a memory block taken along a line I-I' of FIG. 32. A cross-sectional view of a memory block BLKb taken along a line I-I' may be identical to that in FIG. 5. Accordingly, the memory block BLKb will be described with reference to FIGS. 5, 32, and 33.

As compared with a memory block BLKa described with reference to FIGS. 3 to 5, pillars PL11, PL12, PL21, and PL22 of the memory block BLKb may be formed to have a square shape. Insulation materials IM may be provided between pillars PL11 and PL12 or PL21 and PL22 of the same row. The insulation materials IM may be extended in the second direction to contact with a substrate 111.

Between the first and second doping regions 311 and 312, conductive materials CM1 and CM8 may be separated into two parts by the pillars PL11 and PL12 and the insulation materials IM. The conductive materials CM1 to CM8 between the pillars PL11 and PL12 and the first doping region 311 may constitute a row of cell strings with the pillars PL11 and PL12. The conductive materials CM1 to CM8 between the pillars PL11 and PL12 and the second doping region 312 may constitute another row of cell strings with the pillars PL11 and PL12.

Between the second and third doping regions 312 and 313, the conductive materials CM1 and CM8 may be separated into two parts by the pillars PL21 and PL22 and the insulation materials IM. The conductive materials CM1 to CM8 between the pillars PL21 and PL22 and the second doping region 312 may constitute another row of cell strings with the pillars PL11 and PL12. The conductive materials CM1 to CM8 between the pillars PL21 and PL22 and the third doping region 313 may constitute still another row of cell strings with the pillars PL21 and PL22.

That is, a row of pillars may constitute two rows of cell strings with separated conductive materials. An equivalent circuit of the memory block BLKb may correspond to one of equivalent circuits BLKa1 to BLKa7 described with reference to FIGS. 25 to 30 except that the number of rows of cell strings is doubled. That is, the memory block BLKb may operate according to a method described with reference to one of equivalent circuits BLKa1 to BLKa7 of FIGS. 7 and 25 to 30.

A cross-sectional view of a memory block BLKb in FIGS. 32 and 33 taken along a line I-I' may be identical to that in FIG. 31. That is, square-shaped pillars PL11, PL12, PL21, and PL22 may include lower pillars PL11a, PL12a, PL21a, and PL22a and upper pillars PL11b, PL12b, PL21b, and PL22b. At this time, an equivalent circuit of the memory block BLKb may correspond to an equivalent circuit BLKa2 described with reference to FIG. 25 except that the number of rows of cell strings is doubled. That is, the memory block BLKb may operate according to a method described with reference to the equivalent circuit BLKa2 in FIG. 25.

Figure 34:
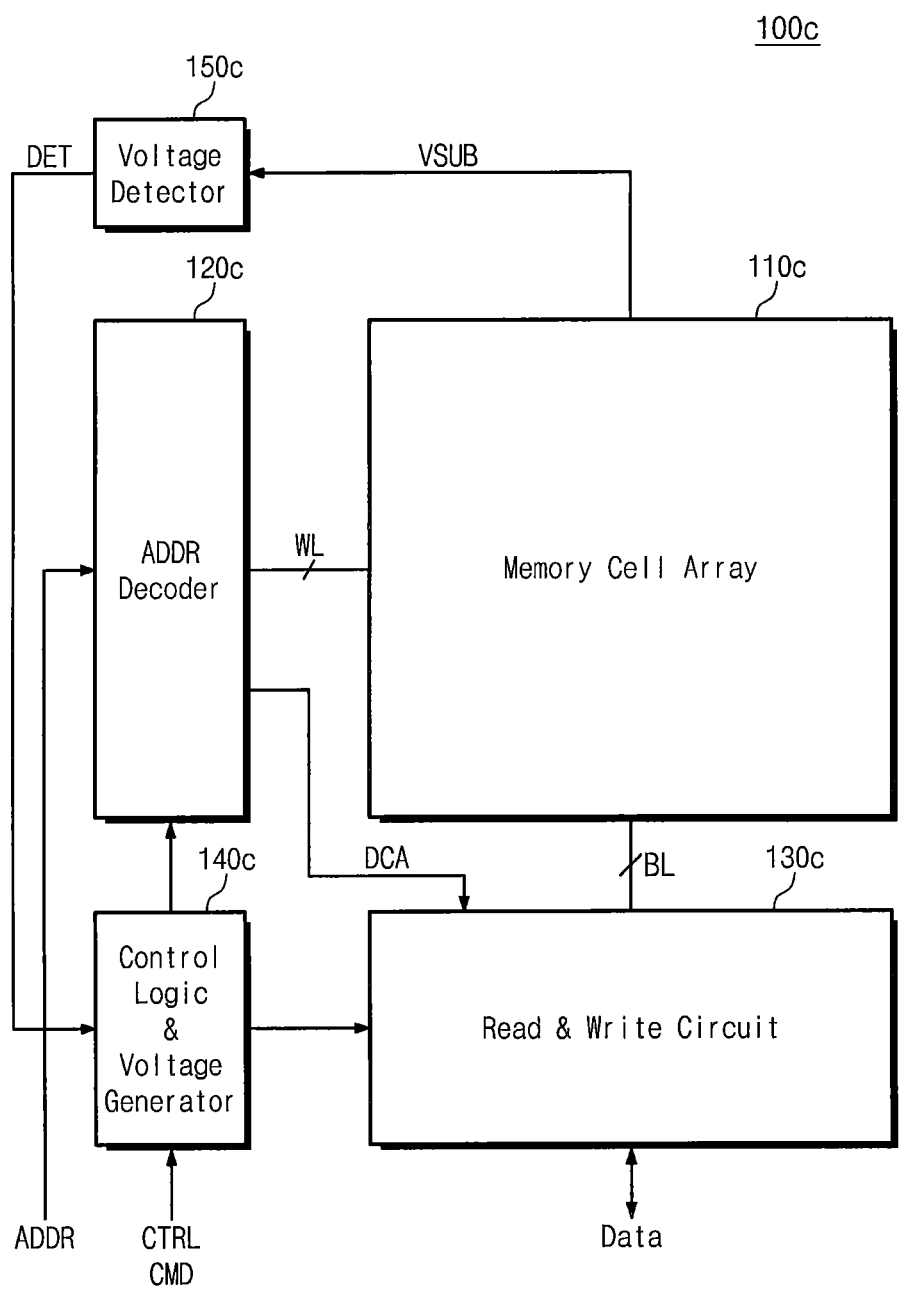
FIG. 34 is a block diagram schematically illustrating a nonvolatile memory device according to still another embodiment of the inventive concept.

FIG. 34 is a block diagram schematically illustrating a nonvolatile memory device according to still another embodiment of the inventive concept. Referring to FIG. 34, a nonvolatile memory device 100c may include a memory cell array 110c, an address decoder 120c, a read/write circuit 130c, a control logic and voltage generator block 140c, and a voltage detector 150c.

The memory cell array 110c may be connected to the address decoder 120c via word lines WL and to the read/write circuit 130c via bit lines BL. The memory cell array 110c may include a plurality of memory cells. In example embodiments, memory cells arranged in a row direction may be connected to the word lines WL, and memory cells arranged in a column direction may be connected to the bit lines BL. For example, memory cells arranged in a row direction may form a plurality of cell groups (e.g., strings). The plurality of cell groups may be connected to the bit lines BL, respectively. In example embodiments, each memory cell of the memory cell array 110c may store one or more bits of data.

The address decoder 120c may be coupled with the memory cell array 110c via the word lines WL. The address decoder 120c may be configured to operate responsive to the control of the control logic and voltage generator block 140c. The address decoder 120c may receive an address ADDR from an external device.

The address decoder 120c may be configured to decode a row address of the input address ADDR. The address decoder 120c may be configured to select a word line corresponding to a decoded row address of the word lines WL. The address decoder 120c may be configured to select the word lines WL. The address decoder 120c may provide selected and unselected word lines with voltages from the control logic and voltage generator block 140c.

The address decoder 120c may be configured to decode a column address of the input address ADDR. The address decoder 120c may provide the decoded column address DCA to the read/write circuit 130c. In example embodiments, the address decoder 120c may include components such as a row decoder, a column decoder, an address buffer, and the like.

The read/write circuit 130c may be coupled with the memory cell array 110c via the bit lines BL. The read/write circuit 130c may be configured to exchange data with an external device. The read/write circuit 130c may operate responsive to the control of the control logic and voltage generator block 140c. The read/write circuit 130c may select the bit lines BL in response to the decoded column address DCA provided from the address decoder 120c.

In example embodiments, the read/write circuit 130c may receive data from an external device to write it in the memory cell array 110c. The read/write circuit 130c may read data from the memory cell array 110c to output it to the external device. The read/write circuit 130c may read data from a first storage area of the memory cell array 110c to write it in a second storage area thereof. That is, the read/write circuit 130c may perform a copy-back operation.

In example embodiments, the read/write circuit 130c may include constituent elements such as a page buffer (or, a page register), a column selecting circuit, a data buffer, and the like. In other example embodiments, the read/write circuit 130c may include constituent elements such as a sense amplifier, a write driver, a column selecting circuit, a data buffer, and the like.

The control logic and voltage generator block 140c may be connected to the address decoder 120c and the read/write circuit 130c. The control logic and voltage generator block 140c may be configured to control an overall operation of the nonvolatile memory device 100c. The control logic and voltage generator block 140c may be configured to generate various voltages for the nonvolatile memory device 100c. The control logic and voltage generator block 140c may operate responsive to a control signal CTRL and a command CMD from an external device.

The voltage detector 150c may be configured to detect a voltage of the memory cell array 110c, for example, a voltage of a substrate at which the memory cell array 110c is formed. When a substrate voltage reaches a reference voltage, the voltage detector 150c may output a detection signal DET. In response to the detection signal DET, the control logic and voltage generator block 140c may control an erase operation of the nonvolatile memory device 100c.

Figure 35:
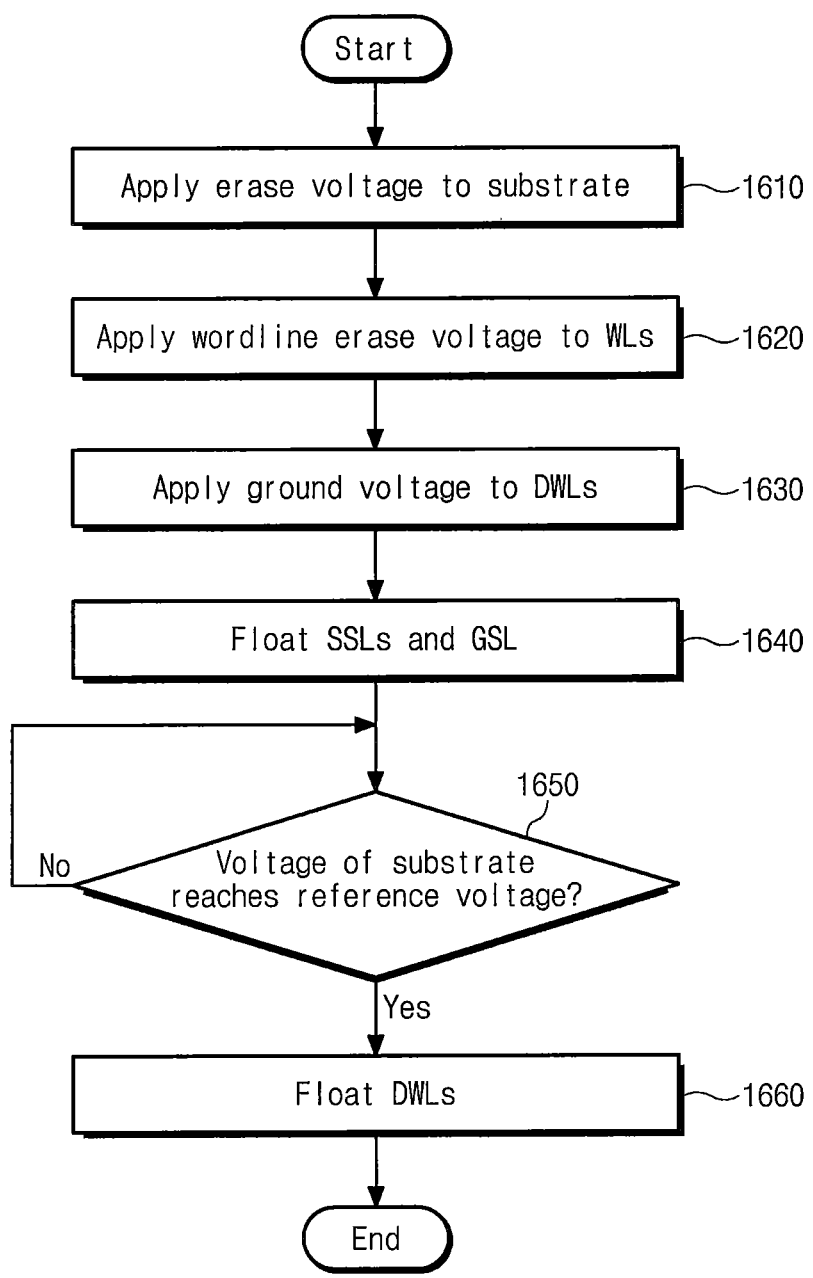
FIG. 35 is a flowchart illustrating an erase method according to another embodiment of the inventive concept.

FIG. 35 is a flowchart illustrating an erase method according to another embodiment of the inventive concept. Referring to FIGS. 5, 30, 34, and 35, in operation 1610, an erase voltage may be applied to a substrate 111. For example, a control logic and voltage generator block 140c may apply the erase voltage to the substrate 111 of a memory cell array 110c. The erase voltage may be a high voltage.

In operation 1620, a word line erase voltage may be applied to word lines WL1 to WL4. For example, an address decoder 120c may apply the word line erase voltage to the word lines WL1 to WL4. The word line erase voltage may be a ground voltage or a low voltage having a level similar to the ground voltage.

In operation 1630, a ground voltage VSS may be applied to dummy word lines DWL1 and DWL2. For example, the address decoder 120c may provide the dummy word lines DWL1 and DWL2 with the ground voltage.

In operation 1640, string selection lines SSL1 and SSL2 and a ground selection line GSL may be floated. For example, the address decoder 120c may float the string selection lines SSL1 and SSL2 and the ground selection line GSL.

In operation 1650, whether a voltage of the substrate 111 reaches a reference voltage may be determined. For example, a voltage detector 150c may determine whether a voltage of the substrate 111 reaches a reference voltage. The reference voltage may be the half of the erase voltage or a voltage having a level similar thereto. When a voltage of the substrate 111 reaches the reference voltage, the voltage detector 150c may output a detection signal DET.

In operation 1660, the dummy word lines DWL1 and DWL2 may be floated. In response to the detection signal DET, the control logic and voltage generator block 140c may control the address decoder 120c such that the dummy word lines DWL1 and DWL2 are floated.

Figure 37:
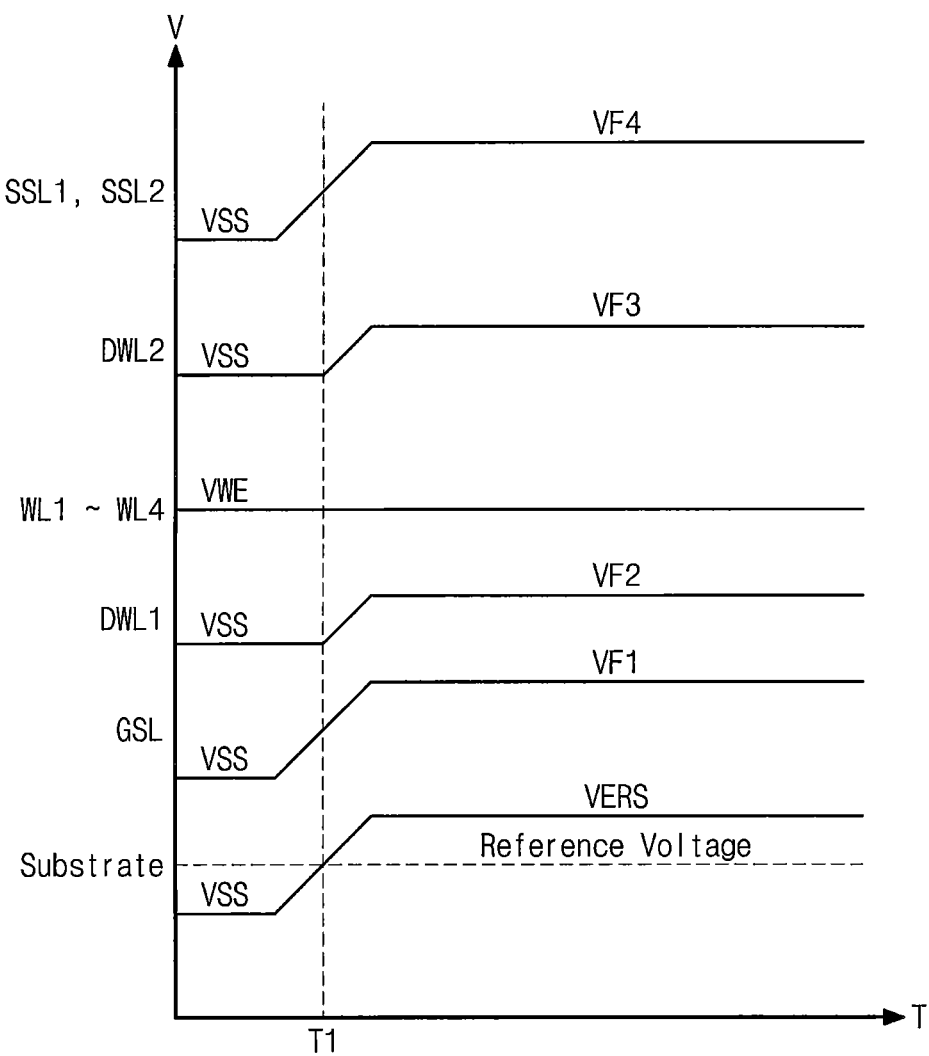
FIG. 37 is a timing diagram illustrating a voltage variation of a memory cell array according to a voltage condition in FIG. 36.

FIG. 36 is a table illustrating a voltage condition of a memory cell array at an erase operation. FIG. 37 is a timing diagram illustrating a voltage variation of a memory cell array according to a voltage condition in FIG. 36. Referring to FIGS. 5, 30, and 34 to 37, once an erase operation commences, string selection lines SSL1 and SSL2 and a ground selection line GSL may be floated, and a ground voltage VSS may be applied to dummy word lines DWL1 and DWL2. Further, a word line erase voltage VWE may be applied to word lines WL1 to WL4, and an erase voltage VERS may be applied to a substrate 111.

As the erase voltage VERS is applied to the substrate 111, a voltage of the substrate 111 may start to increase from the ground voltage VSS. The voltage of the substrate 111 may be transferred to channel films 114. Also, voltages of the floated selection lines GSL, SSL1, and SSL2 may start to increase due to the coupling.

If the voltage of the substrate 111 reaches a reference voltage, the dummy word lines DWL1 and DWL2 may be floated. Afterwards, voltages of the dummy word lines DWL1 and DWL2 may start to increase from the ground voltage VSS due to the coupling.

A voltage of the ground selection line GSL may rise up to a floating voltage VF1 by the coupling. Voltages of the dummy word lines DWL1 and DWL2 may rise up to floating voltages VF2 and VF3 by the coupling, respectively. Voltages of the string selection lines SSL1 and SSL2 may be increased up to a floating voltage VF4 by the coupling.

The dummy word lines DWL1 and DWL2 may be floated after the erase voltage VERS is applied to the substrate 111. Thus, the floating voltages VF2 and VF3 of the dummy word lines DWL1 and DWL2 may be lower in level than the floating voltage VF1 of the ground selection line GSL and the floating voltage VF4 of the string selection lines SSL1 and SSL2.

At an erase operation, the word line erase voltage VWE being a low voltage may be applied to the word lines WL1 to WL4. On the other hand, voltages of lines DWL1, DWL2, GSL, SSL1, and SSL2 may rise to a high voltage by the coupling effect.

An electric field may be vertically generated between the word lines WL1 to WL4 and the lines GSL and DWL1 and between the word lines WL1 to WL4 and the lines SSL1, SSL2, and DWL2. In this time, carriers at the channel films 114 may be accelerated, so that hot electrons or hot holes are generated.

The hot electrons or hot holes may be trapped by insulating films 116. For example, the hot electrons or hot holes may be trapped by portions, adjacent to the dummy word line DWL1 and the string selection lines SSL1 and SSL2, from among the insulating films 116, or by portions, adjacent to the dummy word line DWL2 and the string selection lines SSL1 and SSL2, from among the insulating films 116. If the hot electrons or hot holes are trapped, threshold voltages of dummy memory cells DMC1 and DMC2, ground selection transistors GST, or string selection transistors SST may vary. This may become a cause of read or program failure. Thus, the reliability of a nonvolatile memory device 100c may be lowered.

According to an embodiment of the inventive concept, the dummy word lines DWL1 and DWL2 may be floated after the erase voltage VERS is applied to the substrate 111 and a time elapses. Thus, voltages of the dummy word lines DWL1 and DWL2 may become lower than that when the dummy word lines DWL1 and DWL2 are floated from an initial stage of the erase operation. Since an electric field generated at the dummy word lines DWL1 and DWL2 is weak, the chance that hot electrons or holes are generated from the channel films 114 may be reduced. Also, the chance that hot electrons or holes are trapped by the insulating films 116 may be lowered. Thus, the reliability of the nonvolatile memory device 100c may be bettered.

In example embodiments, it is described an example that the dummy word lines DWL1 and DWL2 are controlled together. However, the dummy word lines DWL1 and DWL2 can be controlled independently. For example, the dummy word line DWL1 may be floated after the erase voltage VERS is applied and a time elapses, while the dummy word line DWL2 may be floated when and before the erase voltage VERS is applied. Likewise, the dummy word line DWL2 may be floated after the erase voltage VERS is applied and a time elapses, while the dummy word line DWL1 may be floated when and before the erase voltage VERS is applied.

In other example embodiments, the dummy word line DWL1 may be floated when a voltage of the substrate 111 reaches a first reference voltage, and the dummy word line DWL2 may be floated when a voltage of the substrate 111 reaches a second reference voltage.

Figure 38:
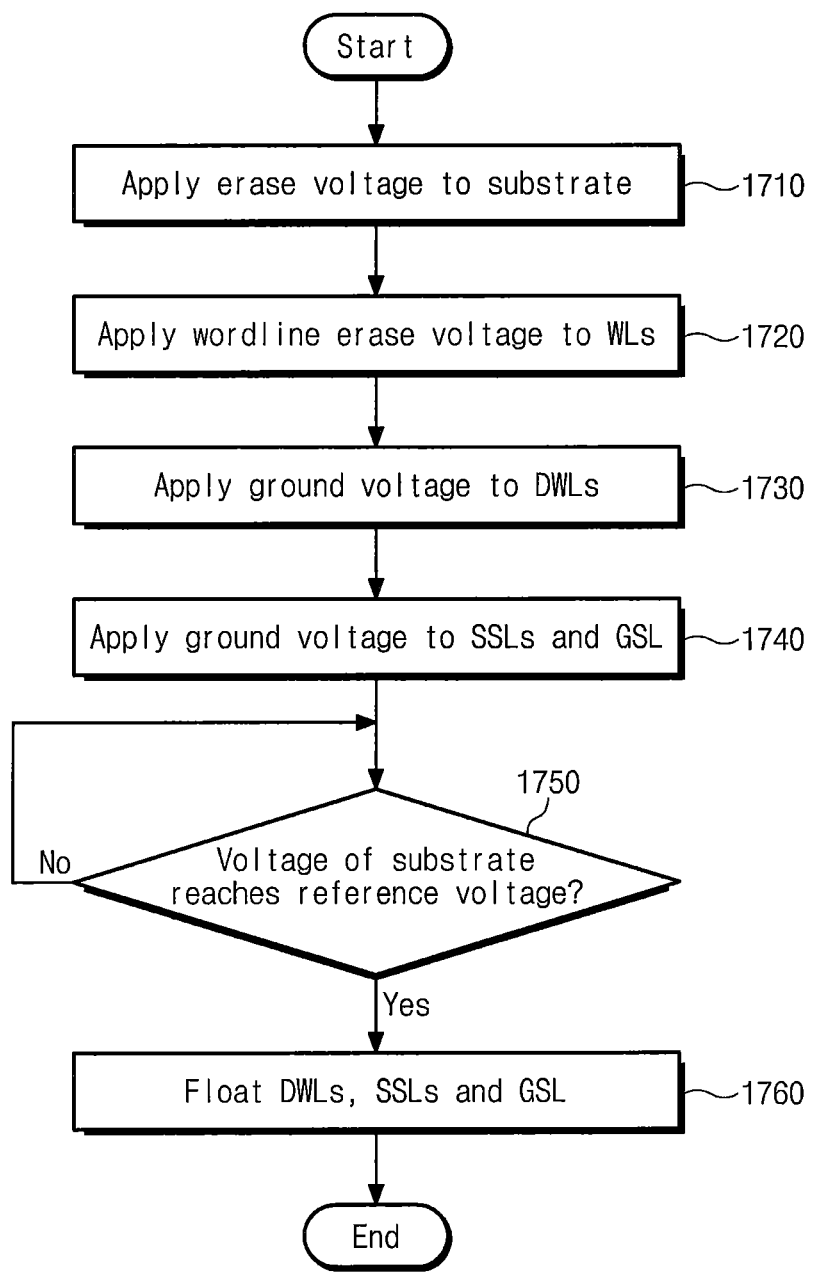
FIG. 38 is a flowchart illustrating an erase method according to another embodiment of the inventive concept.

FIG. 38 is a flowchart illustrating an erase method according to another embodiment of the inventive concept. Referring to FIGS. 5, 30, 34, and 38, in operation 1710, an erase voltage may be applied to a substrate 111. For example, a control logic and voltage generator block 140c may apply the erase voltage to the substrate 111 of a memory cell array 110c. The erase voltage may be a high voltage.

In operation 1720, a word line erase voltage may be applied to word lines WL1 to WL4. For example, an address decoder 120c may apply the word line erase voltage to the word lines WL1 to WL4. The word line erase voltage may be a ground voltage or a low voltage having a level similar to the ground voltage.

In operation 1730, a ground voltage may be applied to dummy word lines DWL1 and DWL2. For example, the address decoder 120c may provide the dummy word lines DWL1 and DWL2 with the ground voltage.

In operation 1740, the ground voltage may be applied to string selection lines SSL1 and SSL2 and a ground selection line GSL. For example, the address decoder 120c may apply the ground voltage VSS to the string selection lines SSL1 and SSL2 and the ground selection line GSL.

In operation 1750, whether a voltage of the substrate 111 reaches a reference voltage may be determined. For example, a voltage detector 150c may determine whether a voltage of the substrate 111 reaches a reference voltage. The reference voltage may be half of the erase voltage VERS or a voltage having a level similar thereto. When a voltage of the substrate 111 reaches the reference voltage, the voltage detector 150c may output a detection signal DET.

In operation 1760, the dummy word lines DWL1 and DWL2, the string selection lines SSL1 and SSL2, and the ground selection line GSL may be floated. In response to the detection signal DET, the control logic and voltage generator block 140c may control the address decoder 120c such that the dummy word lines DWL1 and DWL2, the string selection lines SSL1 and SSL2, and the ground selection line GSL are floated.

Figure 40:
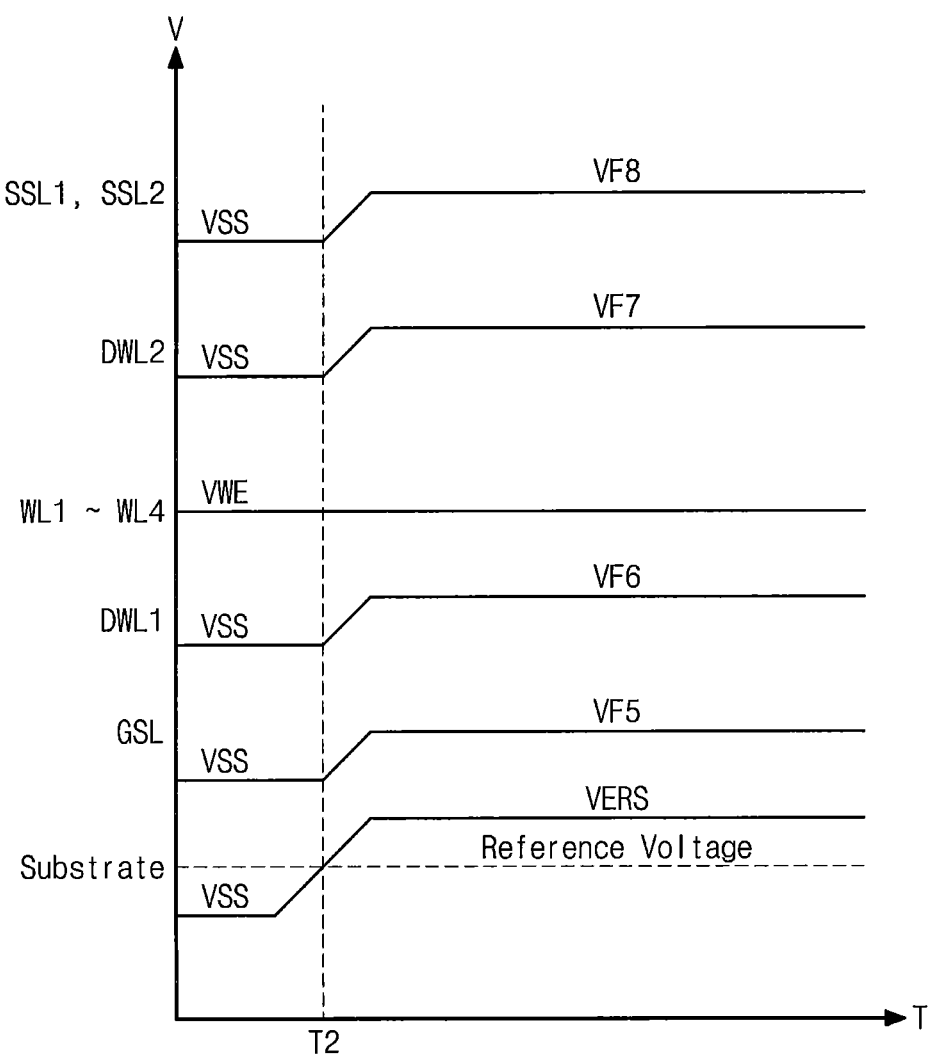
FIG. 40 is a timing diagram illustrating a voltage variation of a memory cell array according to a voltage condition in FIG. 39.

FIG. 39 is a table illustrating a voltage condition of a memory cell array at an erase operation. FIG. 40 is a timing diagram illustrating a voltage variation of a memory cell array according to a voltage condition in FIG. 39. Referring to FIGS. 5, 30, 34, and 38 to 40, once an erase operation commences, a ground voltage VSS may be applied to dummy word lines DWL1 and DWL2, the string selection lines SSL1 and SSL2, and a ground selection line GSL. Further, a word line erase voltage VWE may be applied to word lines WL1 to WL4, and an erase voltage VERS may be applied to a substrate 111.

As the erase voltage VERS is applied to the substrate 111, a voltage of the substrate 111 may start to increase from the ground voltage VSS. The voltage of the substrate 111 may be transferred to channel films 114.

If the voltage of the substrate 111 reaches a reference voltage, the dummy word lines DWL1 and DWL2, the string selection lines SSL1 and SSL2, and the ground selection line GSL may be floated. Afterwards, voltages of the lines DWL1, DWL2, SSL1, SSL2, and GSL may start to increase from the ground voltage VSS due to the coupling effect.

A voltage of the ground selection line GSL may rise up to a floating voltage VF5 by the coupling. Voltages of the dummy word lines DWL1 and DWL2 may rise up to floating voltages VF6 and VF7 by the coupling, respectively. Voltages of the string selection lines SSL1 and SSL2 may be increased up to a floating voltage VF8 by the coupling effect.

The dummy word lines DWL1 and DWL2, the string selection lines SSL1 and SSL2, and the ground selection line GSL may be floated after the erase voltage VERS is applied to the substrate 111. Thus, the floating voltages of the dummy word lines DWL1 and DWL2, the string selection lines SSL1 and SSL2, and the ground selection line GSL may be lower in level than floating voltages when the dummy word lines DWL1 and DWL2, the string selection lines SSL1 and SSL2, and the ground selection line GSL are floated at an initial stage of an erase operation.

According to an embodiment of the inventive concept, the dummy word lines DWL1 and DWL2, the string selection lines SSL1 and SSL2, and the ground selection line GSL may be floated after the erase voltage VERS is applied to the substrate 111 and a time elapses. Thus, voltages of the dummy word lines DWL1 and DWL2, the string selection lines SSL1 and SSL2, and the ground selection line GSL may become lower than that when the dummy word lines DWL1 and DWL2, the string selection lines SSL1 and SSL2, and the ground selection line GSL are floated from an initial stage of the erase operation. Since an electric field generated at the dummy word lines DWL1 and DWL2 is weak, the chance that hot electrons or holes are generated from the channel films 114 may be reduced. Also, the chance that hot electrons or holes are trapped by the insulating films 116 may be lowered.

Also, the string selection lines SSL1 and SSL2 and the ground selection line GSL may maintain a ground voltage until voltages of the channel films 114 increase by a voltage of the substrate 111. As a ground selection transistor GST or string selection transistors SST are turned on, there may be prevented a phenomenon that a voltage of the substrate 111 is not transferred to the channel films 114.

Thus, the reliability of the nonvolatile memory device 100c may be bettered.

In example embodiments, it is described an example that the dummy word lines DWL1 and DWL2 are controlled together. However, the dummy word lines DWL1 and DWL2 can be controlled independently. For example, the dummy word line DWL1 may be floated after the erase voltage VERS is applied and a time elapses, while the dummy word line DWL2 may be floated when and before the erase voltage VERS is applied. Likewise, the dummy word line DWL2 may be floated after the erase voltage VERS is applied and a time elapses, while the dummy word line DWL1 may be floated when and before the erase voltage VERS is applied.

In example embodiments, it is described an example that the string selection lines SSL1 and SSL2 and the ground selection lines GSL are controlled together. However, the dummy string selection lines SSL1 and SSL2 and the ground selection lines GSL can be controlled independently. For example, the ground selection line GSL may be floated after the erase voltage VERS is applied and a time elapses, while the string selection lines SSL1 and SSL2 may be floated when and before the erase voltage VERS is applied. Likewise, the string selection lines SSL1 and SSL2 may be floated after the erase voltage VERS is applied and a time elapses, while the ground selection line GSL may be floated when and before the erase voltage VERS is applied.

In example embodiments, the dummy word line DWL1 may be floated when a voltage of the substrate 111 reaches a first reference voltage, and the dummy word line DWL2 may be floated when a voltage of the substrate 111 reaches a second reference voltage.

In example embodiments, it is described an example that the dummy word lines DWL1 and DWL2, the string selection lines SSL1 and SSL2, and the ground selection line GSL are controlled together. However, the dummy word lines DWL1 and DWL2, the string selection lines SSL1 and SSL2, and the ground selection line GSL can be controlled independently.

The dummy word line DWL1 and the ground selection line GSL may be floated after the erase voltage VERS is applied and a time elapses, while the dummy word line DWL2 and the string selection lines SSL1 and SSL2 may be floated when and before the erase voltage VERS is applied. Likewise, the dummy word line DWL2 and the string selection lines SSL1 and SSL2 may be floated after the erase voltage VERS is applied and a time elapses, while the dummy word line DWL1 and the ground selection line GSL may be floated when and before the erase voltage VERS is applied.

The dummy word line DWL1 and the ground selection line GSL may be floated when a voltage of the substrate 111 reaches a first reference voltage, and the dummy word line DWL2 and the string selection lines SSL1 and SSL2 may be floated when a voltage of the substrate 111 reaches a second reference voltage.

In other example embodiments, the dummy word lines DWL1 and DWL2, the string selection lines SSL1 and SSL2, and the ground selection line GSL may be floated respectively when a voltage of the substrate 111 reaches different reference voltages.

FIG. 41 is a table illustrating a voltage condition of a memory cell array when a program operation is performed. Referring to FIGS. 5, 30, 34, and 41, once a program operation commences, a power supply voltage VCC may be applied to a selected string selection line, and a ground voltage VSS may be applied to an unselected string selection line.

A dummy pass voltage VPASSD may be applied to dummy word lines DWL1 and DWL2. The dummy pass voltage VPASSD may be a high voltage.

A program voltage VPGM may be applied to a selected word line after a pass voltage VPASS is applied. The pass voltage VPASS may be applied to an unselected word line.

A ground voltage VSS may be applied to a ground selection line GSL.

That is, the dummy word lines DWL1 and DWL2 and the selection lines GSL, SSL1, and SSL2 may be differentiated by voltages applied at a program operation. At a program operation, a low voltage such as a ground voltage VSS or a power supply voltage VCC may be applied to the selection lines GSL, SSL1, and SSL2, while the dummy pass voltage VPASSD being a high voltage is applied to the dummy word lines DWL1 and DWL2. The high voltage may be generated by pumping a power supply voltage VCC supplied to a nonvolatile memory device 100c, and may be higher than the power supply voltage VCC.

Figure 42:
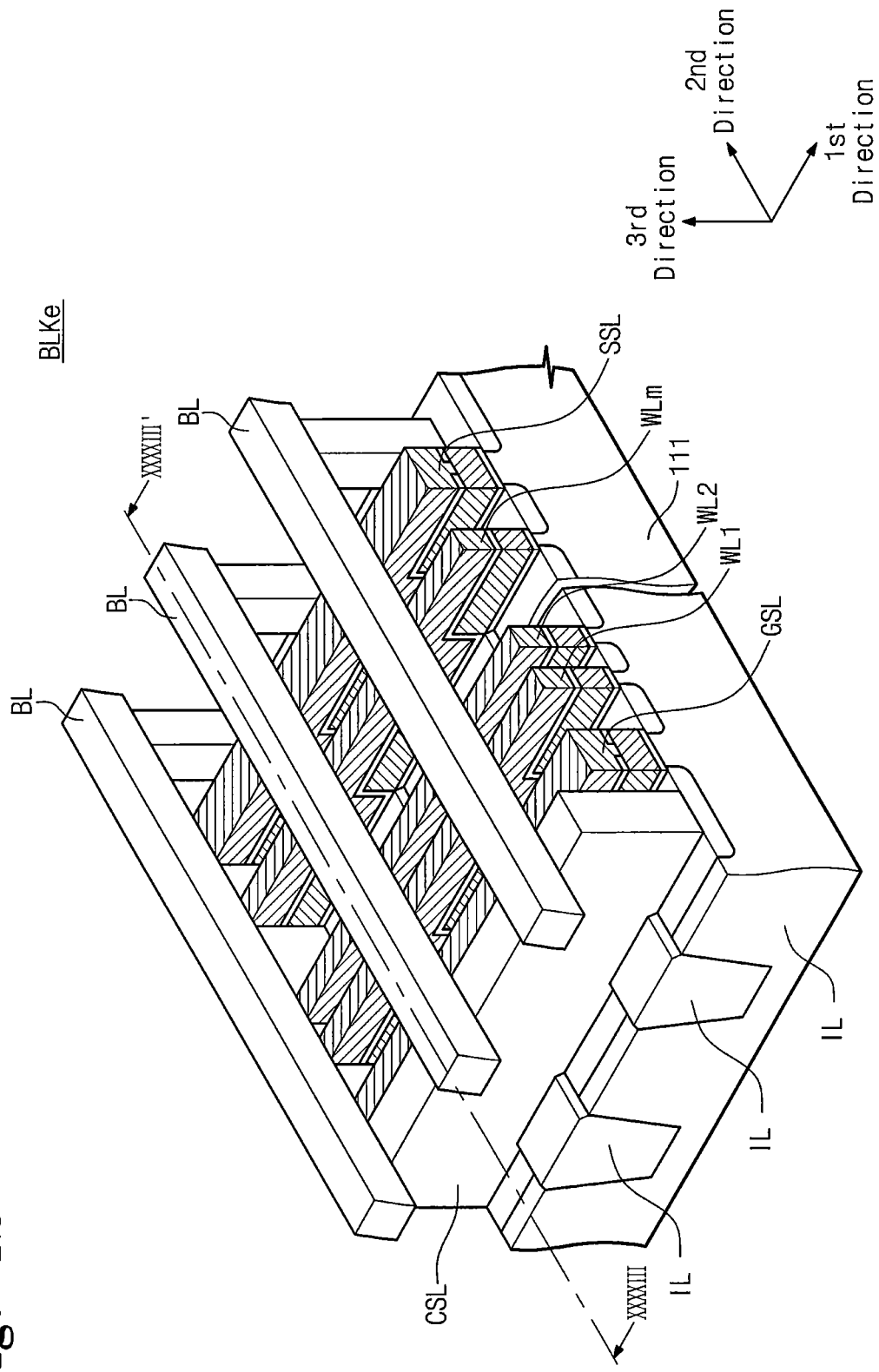
FIG. 42 is a perspective view of a part of a memory block in FIG. 2 according to still another embodiment of the inventive concept.
Figure 43:
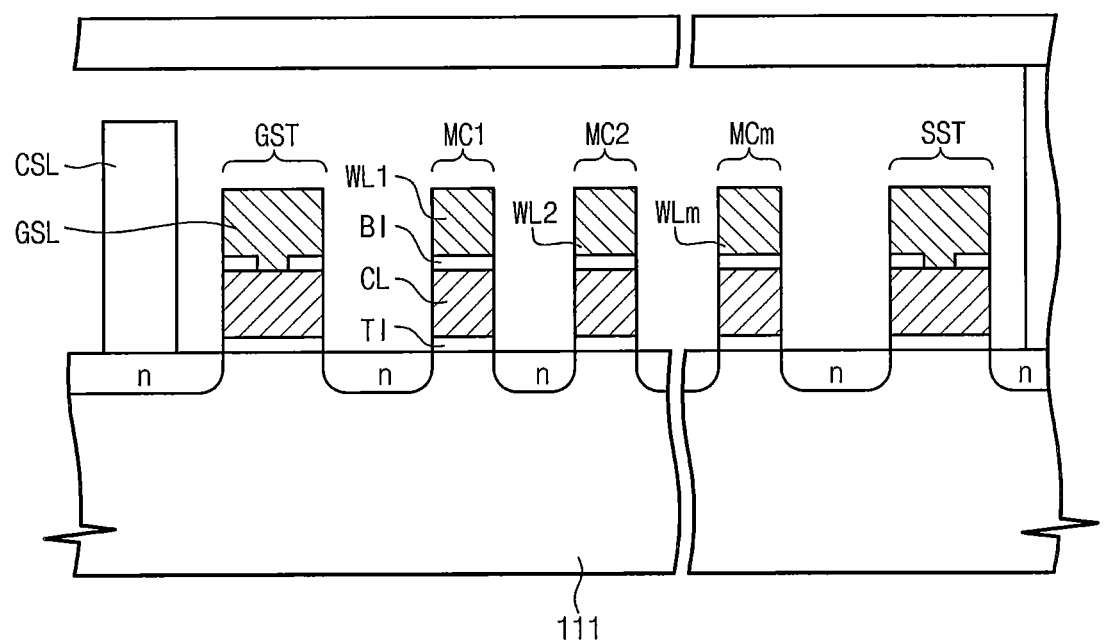
FIG. 43 is a cross-sectional view taken along a line XXXXIII-XXXXIII' in FIG. 42.

FIG. 42 is a perspective view of a part of a memory block in FIG. 2 according to still another embodiment of the inventive concept. FIG. 43 is a cross-sectional view taken along a line XXXXIII-XXXXIII' in FIG. 42. A planar type NAND flash memory is exemplarily illustrated in FIGS. 42 and 43.

Referring to FIGS. 42 and 43, a device isolation film IL may be formed at a substrate 111 of a memory block BLKe. There are exemplarily illustrated three active regions extending along a second direction and spaced apart along a first direction. However, the number of active regions is not limited thereto.

A tunnel insulating film TI may be formed on each of the active regions. In the active regions, the tunnel insulating films TI may be spaced apart along the second direction. For example, each tunnel insulating film TI may include an oxide film, such as, for example, a thermal oxide film.

Charge storage films CL may be provided on the tunnel insulating films TI, respectively. For example, the charge storage films CL may include a conductive material such as poly silicon. For example, the charge storage films CL may include a nitride film or a metal oxide film (e.g., aluminum oxide film, hafnium oxide film, etc.).

When the charge storage films CL include a conductive material such as poly silicon, they may act as a floating gate. That is, the charge storage films CL may store data by accumulating charges. If the charge storage films CL include an insulating material, the charge storage films CL may act as a charge trap layer. That is, the charge storage films CL may store data by trapping charges.

The tunnel insulating films TI and the charge storage films CL may be provided on the active regions along the first direction. Blocking insulating films BI may be provided along the first direction on an axis provided along the first direction. Each blocking insulating film BI may include a nitride film. Each blocking insulating film BI may include a high dielectric film (e.g., aluminum oxide film, hafnium oxide film, etc.) having a dielectric constant larger than that of the tunnel insulating film TI.

Polysilicon films may be provided on the tunnel insulating films TI. The polysilicon films may be extended along the first direction on the active regions. The polysilicon films may be spaced apart along the second direction.

In each active region, the tunnel insulating film TI, the charge storage film CL, the blocking insulating film BI, and the polysilicon film may form a gate structure. In example embodiments, the tunnel insulating film TI, the charge storage film CL, the blocking insulating film BI, and the polysilicon film in each active region may form a memory cell MC. In example embodiments, at a specific gate structure, a blocking insulating film BI may be punched to provide a connection between a polysilicon film and a charge storage film CL. Such a gate structure may form a selection transistor SST or GST.

In the event that a charge storage film CL includes an insulating material, a blocking insulating film BI of a gate structure of a selection transistor SST or GST may not be punched. That is, a charge storage film CL and a polysilicon film of a gate structure of a selection transistor SST or GST may be separated by a blocking insulating film BI.

In example embodiments, a polysilicon film of a gate structure of a memory cell may be extended along the first direction to form a word line WL. Further, a polysilicon film of a gate structure of a selection transistor SST or GST may be extended along the first direction to form a selection line SSL or GSL.

N-type junction regions may be formed between gate structures. At this time, a source and a drain of a selection transistor SST or GST may be formed together. A conductive material extending along the first direction may be formed on a source of a ground selection transistor GST. The conductive material may form a common source line CSL. For example, the common source line CSL may include polysilicon. For example, the common source line CSL may include a metal material.

A bit line contact BP may be provided on a drain of a string selection transistor SST to be connected to a bit line BL. That is, a drain of the string selection transistor SST may be connected to a corresponding bit line BL via the bit line contact BP. Bit lines may be provided on the same axis as active regions. Three bit lines are exemplarily illustrated.

Figure 44:
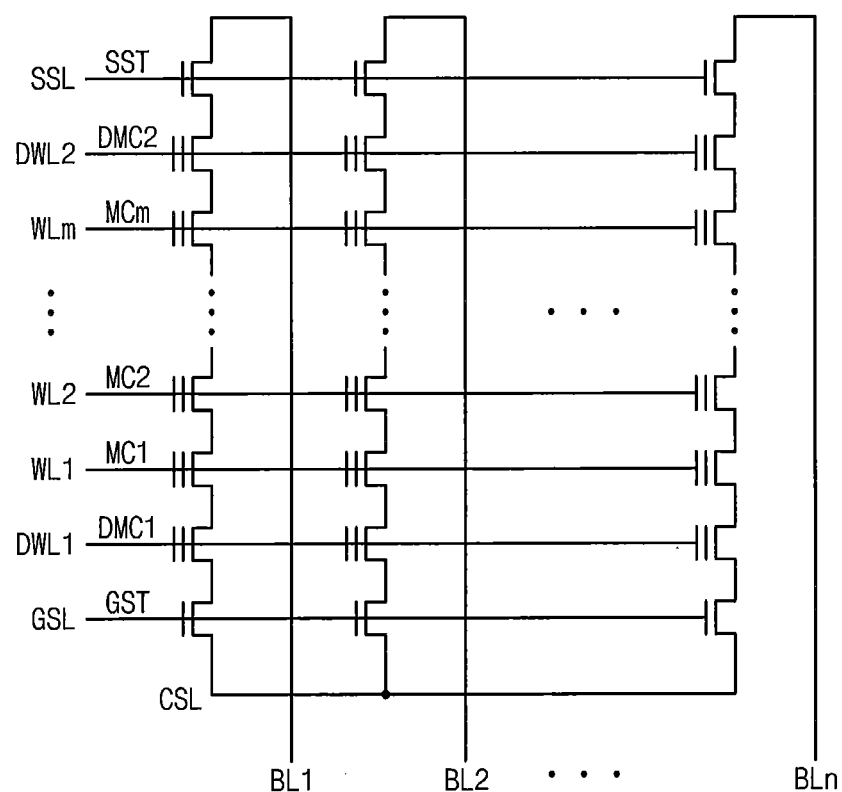
FIG. 44 is an equivalent circuit diagram of a memory block described in FIGS. 42 and 43.

FIG. 44 is an equivalent circuit diagram of a memory block described in FIGS. 42 and 43. Referring to FIGS. 42 to 44, memory cells MC1 to MCm provided along a row direction may be connected to word lines WL1 to WLm. Memory cells MC in the same row may be connected to the same word line WL.

Each of dummy memory cells DMC1 may be provided between memory cells MC1 to MCm and a ground selection transistor GST. The dummy memory cells DMC1 may be connected in common to a dummy word line DWL1. Each of dummy memory cells DMC2 may be provided between a string selection transistor SST and memory cells MC1 to MCm. The dummy memory cells DMC2 may be connected in common to a dummy word line DWL2.

Memory cells MC1 to MCm and dummy memory cells DMC1 and DMC2 provided along a column direction may correspond to bit lines BL1 to BLn. Memory cells MC1 to MCm and dummy memory cells DMC1 and DMC2 in the same column may correspond to the same bit line.

String selection transistors SST may be provided between dummy memory cells DMC2 and bit lines BL1 to BLn, respectively. The string selection transistors SST may be connected in common to a string selection line SSL.

Ground selection transistors GST may be provided between dummy memory cells DMC1 and a common source line CSL, respectively. The ground selection transistors GST may be connected in common to a ground selection line GSL.

Figure 45:
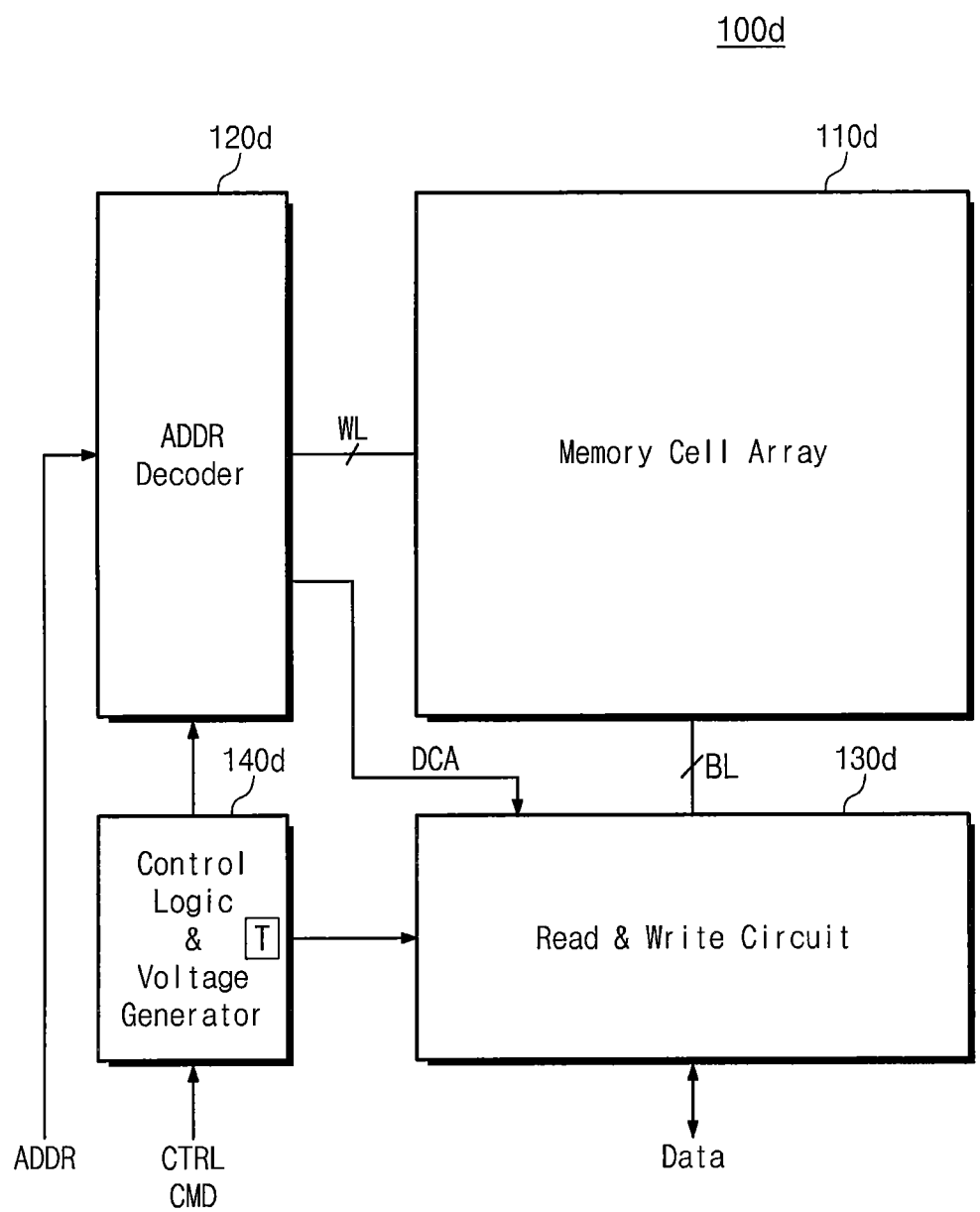
FIG. 45 is a block diagram schematically illustrating a nonvolatile memory device according to still another embodiment of the inventive concept.

FIG. 45 is a block diagram schematically illustrating a nonvolatile memory device according to still another embodiment of the inventive concept. Referring to FIG. 45, a nonvolatile memory device 100d may include a memory cell array 110d, an address decoder 120d, a read/write circuit 130d, and a control logic and voltage generator block 140d.

The control logic and voltage generator block 140d may include a timer T. The timer T may measure an elapsed time after an erase voltage VERS is applied to a substrate. The control logic and voltage generator block 140d may control an erase operation of the nonvolatile memory device 100d according to a measurement result of the timer T. For example, the control logic and voltage generator block 140d may float a dummy word line DWL1 or DWL2, a ground selection line GSL, or a string selection line SSL after the erase voltage VERS is applied to the substrate and a time elapses.

Figure 46:
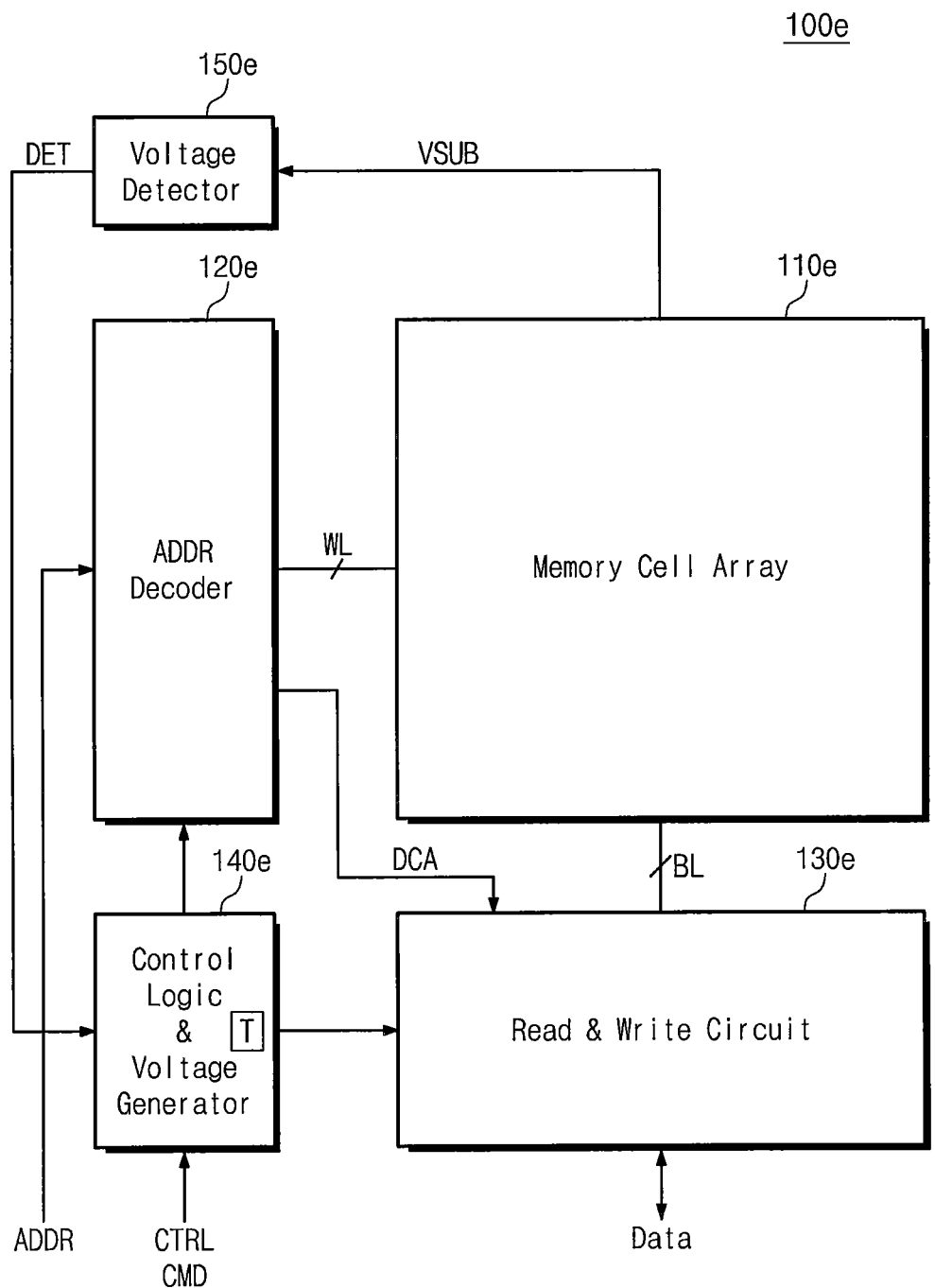
FIG. 46 is a block diagram schematically illustrating a nonvolatile memory device according to still another embodiment of the inventive concept.

FIG. 46 is a block diagram schematically illustrating a nonvolatile memory device according to still another embodiment of the inventive concept. Referring to FIG. 46, a nonvolatile memory device 100e may include a memory cell array 110e, an address decoder 120e, a read/write circuit 130e, a control logic and voltage generator block 140e, and a voltage detector 150e.

The control logic and voltage generator block 140e may include a timer T. The timer T may measure an elapsed time after an erase voltage VERS is applied to a substrate.

The control logic and voltage generator block 140e may control an erase operation of the nonvolatile memory device 100d according to a measurement result of the timer T or a detection result of the voltage detector 150e. For example, the control logic and voltage generator block 140e may float a dummy word line DWL1 or DWL2, a ground selection line GSL, or a string selection line SSL after the erase voltage VERS is applied to the substrate and a time elapses. For example, the control logic and voltage generator block 140e may float a dummy word line DWL1 or DWL2, a ground selection line GSL, or a string selection line SSL when a voltage of a substrate 111 of the memory cell array 110e reaches a target voltage. For example, the control logic and voltage generator block 140e may float a dummy word line DWL1 or DWL2, a ground selection line GSL, or a string selection line SSL when a voltage of the substrate 111 reaches a target voltage and a time elapses.

Figure 47:
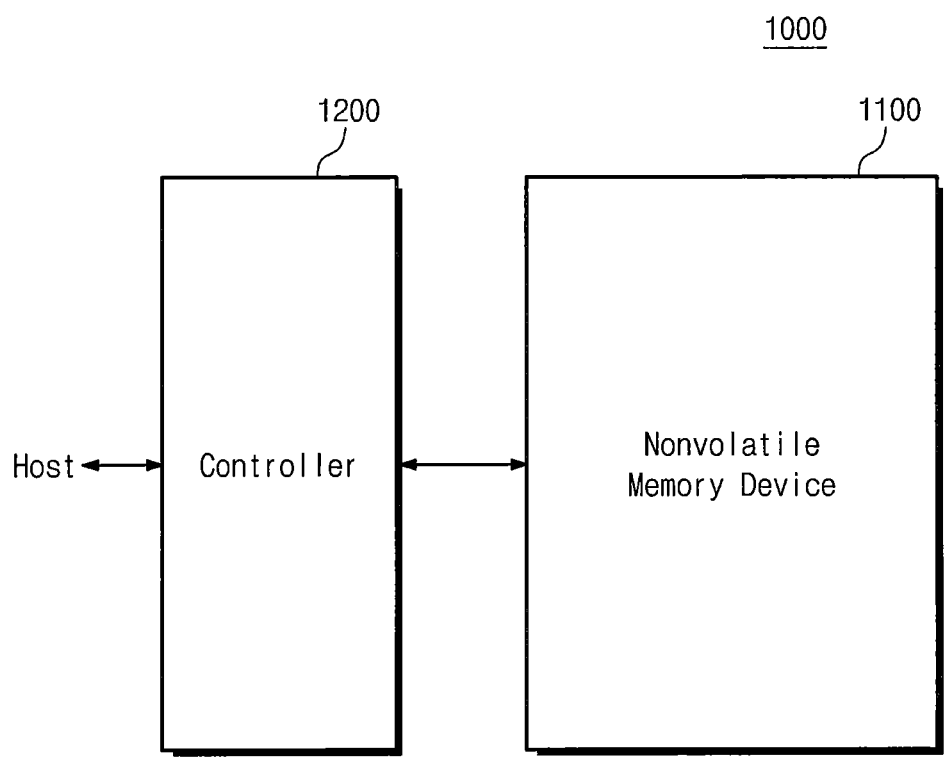
FIG. 47 is a block diagram schematically illustrating a memory system according to an embodiment of the inventive concept.

FIG. 47 is a block diagram schematically illustrating a memory system according to an embodiment of the inventive concept. Referring to FIG. 47, a memory system 1000 may include a nonvolatile memory device 1100 and a controller 1200.

The nonvolatile memory device 1100 may be substantially identical to one of nonvolatile memory devices 100, 100b, 100c, 100d and 100e according to some embodiments of the inventive concept. That is, the nonvolatile memory device 1100 may include a plurality of cell strings CS11, CS12, CS21, and CS22 provided on a substrate 111, and each of the plurality of cell strings CS11, CS12, CS21, and CS22 may include a plurality of cell transistors CT stacked in a direction perpendicular to the substrate 111. In response to applying of an erase voltage VERS, the nonvolatile memory device 1100 may control voltages of string selection lines SSL1 and SSL2 and a ground selection line GSL.

The controller 1200 may be connected with a host and the nonvolatile memory device 1100. In response to a request from the host, the controller 1200 may be configured to access the nonvolatile memory device 1100. For example, the controller 1200 may be configured to control a read operation, a write operation, an erase operation, and a background operation of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may be configured to provide the nonvolatile memory device 1100 with a control signal CTRL, a command CMD, and an address ADDR. The nonvolatile memory device 1100 may be configured to perform read, write, and erase operations in response to the control signal CTRL and the command CMD from the controller 1200.

In example embodiments, the controller 1200 may include constituent elements such as a RAM, a processing unit, a host interface, and a memory interface. The RAM may be used as at least one of a work memory of the processing unit, a cache memory between the nonvolatile memory device 1100 and the host, or a buffer memory between the nonvolatile memory device 1100 and the host. The processing unit may control an overall operation of the controller 1200.

The host interface may communicate with the nonvolatile memory device 1100 according to a specific communication protocol. Exemplarily, the controller 1200 may be configured to communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, or an IDE (Integrated Drive Electronics) protocol. The memory interface may interface with the nonvolatile memory device 1100. The memory interface may include a NAND interface or a NOR interface.

The memory system 1000 may be configured to further include an error detecting and correcting block. The error detecting and correcting block may be configured to detect and correct an error of data read from the nonvolatile memory device 1100 using ECC data (or, parity data). In example embodiments, the error detecting and correcting block may be provided as a constituent element of the controller 1200. In other example embodiments, the error detecting and correcting block may be provided as a constituent element of the nonvolatile memory device 1100.

The controller 1200 and the nonvolatile memory device 1100 may be integrated to one semiconductor device. The controller 1200 and the nonvolatile memory device 1100 may be integrated into one semiconductor device to form a memory card. For example, the controller 1200 and the nonvolatile memory device 1100 may be integrated into one semiconductor device to form a memory card such as a PC (or, PCMC1A) card, a Compact Flash (CF) card, a Smart-Media (SM) card, a memory stick, a multimedia card (MMC, RS-MMC, MMCmicro), an SD card (SD, miniSD, SDHC), a Universal Flash Storage (UFS) device, or the like.

The controller 1200 and the nonvolatile memory device 1100 may be integrated into one semiconductor device to form a Solid State Drive (SSD). The SSD may include a storage device which is configured to store data using semiconductor memories. In case that the memory system 1000 is used as the SSD, an operating speed of a host connected with the memory system 1000 may be remarkably improved.

The memory system 1000 may be used in a computer, portable computer, Ultra Mobile PC (UMPC), workstation, net-book, PDA, web tablet, a tablet computer, wireless phone, mobile phone, smart phone, e-book, PMP (portable multimedia player), DMB (Digital Multimedia Broadcasting) player, digital camera, digital audio recorder/player, digital picture/video recorder/player, smart television, portable game machine, navigation system, black box, 3-dimensional television, storage forming a data center, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In example embodiments, a nonvolatile memory device 1100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 48:
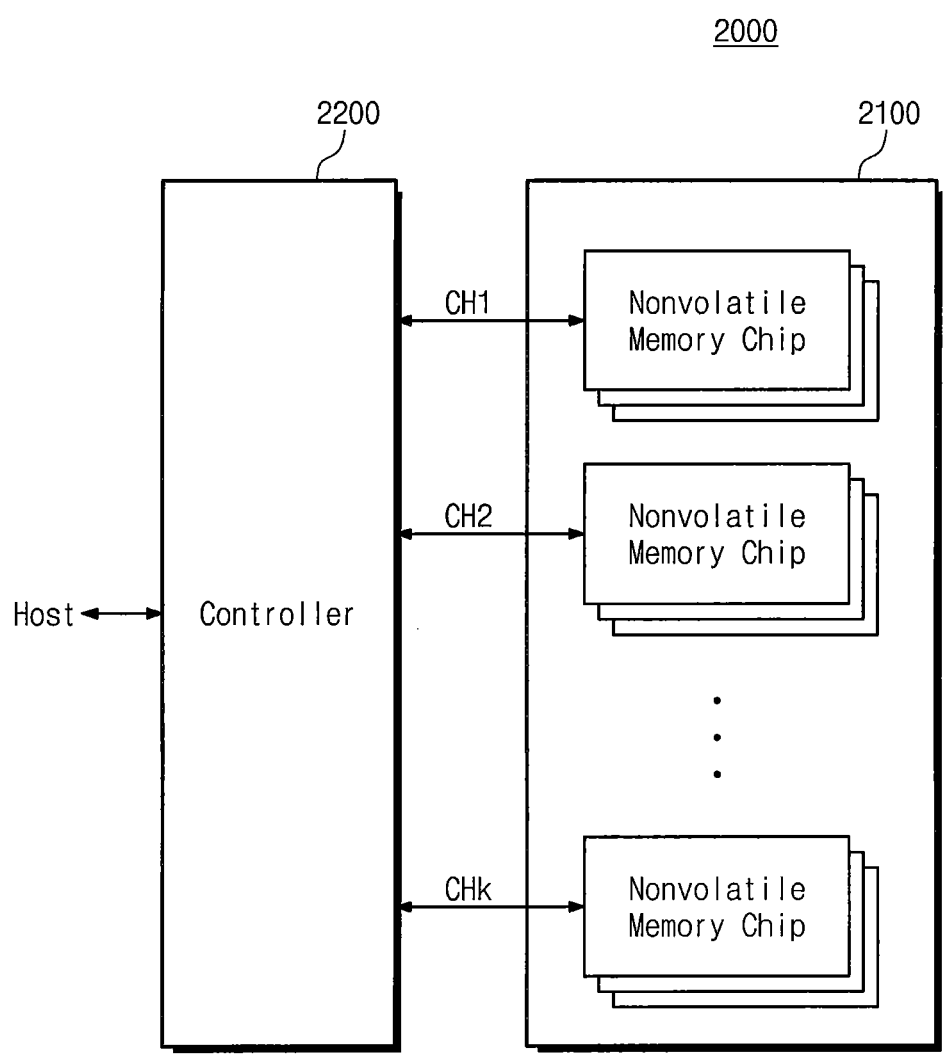
FIG. 48 is a block diagram illustrating an application of a memory system in FIG. 47.

FIG. 48 is a block diagram illustrating an application of a memory system in FIG. 47. Referring to FIG. 48, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In example embodiments, the plurality of nonvolatile memory chips may communicate with the controller 2200 via a plurality of channels CH1 to CHk.

Each of the nonvolatile memory chips may be substantially identical to one of nonvolatile memory devices 100, 100b, 100c, 100d, and 100e according to embodiments of the inventive concept. That is, each nonvolatile memory chip may include a plurality of cell strings CS11, CS12, CS21, and CS22 provided on a substrate 111, and each of the plurality of cell strings CS11, CS12, CS21, and CS22 may include a plurality of cell transistors CT stacked in a direction perpendicular to the substrate 111. In response to applying of an erase voltage VERS, each nonvolatile memory chip may control voltages of string selection lines SSL1 and SSL2 and a ground selection line GSL.

In FIG. 48, there is described the case that one channel is connected with a plurality of nonvolatile memory chips. However, the memory system 2000 can be modified such that one channel is connected with one nonvolatile memory chip.

Figure 49:
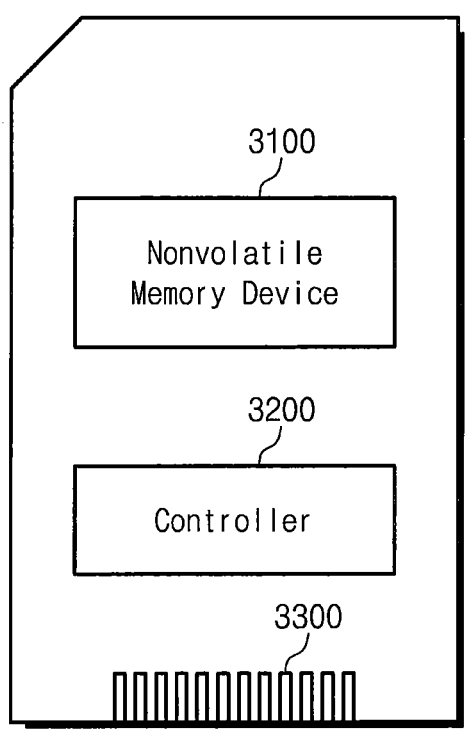
FIG. 49 is a diagram illustrating a memory card according to an embodiment of the inventive concept.

FIG. 49 is a diagram illustrating a memory card according to an embodiment of the inventive concept. Referring to FIG. 49, a memory card 3000 may include a nonvolatile memory device 3100, a controller 3200, and a connector 3300.

The connector 3300 may connect the memory card 3000 with a host electrically.

The memory card 3000 may be formed of memory cards such as a PC (PCMC1A) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 50:
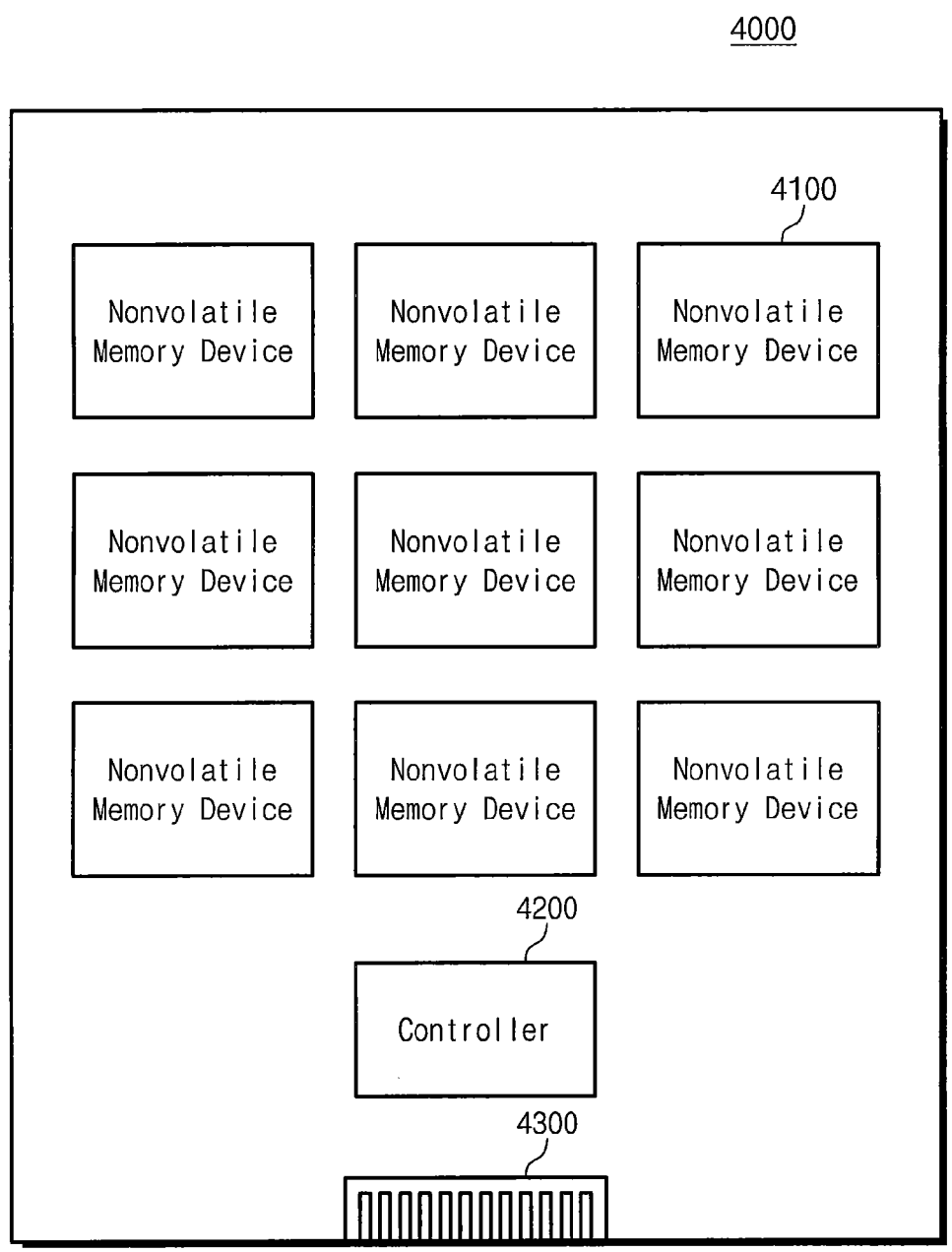
FIG. 50 is a diagram illustrating a solid state drive according to an embodiment of the inventive concept.

FIG. 50 is a diagram illustrating a solid state drive according to an embodiment of the inventive concept. Referring to FIG. 50, a solid state drive 4000 may include a plurality of nonvolatile memory devices 4100, a controller 4200, and a connector 4300.

The nonvolatile memory devices 4100 may be substantially identical to that described with reference to FIGS. 1, 13, 19, 34, 45 and/or 46.

The connector 4300 may connect the solid state drive 4000 with a host electrically.

Figure 51:
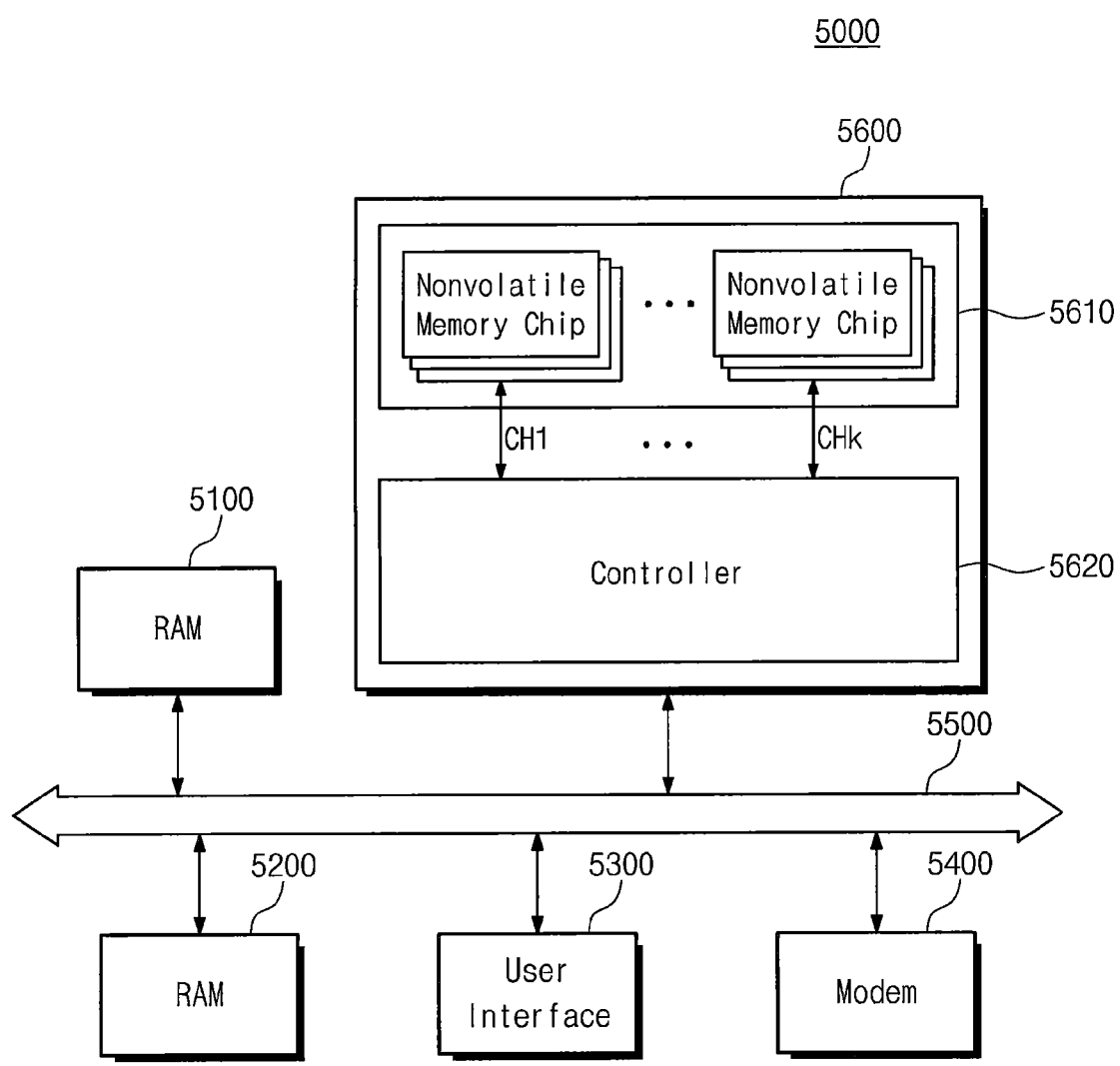
FIG. 51 is a block diagram illustrating a computing system according to an embodiment of the inventive concept.

FIG. 51 is a block diagram illustrating a computing system according to an embodiment of the inventive concept. Referring to FIG. 51, a computing system 5000 may include a central processing unit 5100, a RAM 5200, a user interface 5300, a modem 5400, a system bus 5500, and a memory system 5600.

The memory system 5600 may be connected electrically with the elements 5100 to 5400 via a system bus 5500. Data provided via the user interface 5300 or processed by the central processing unit 5100 may be stored in the memory system 5600.

The memory system 5600 may include a nonvolatile memory device 5610 and a controller 5620. The nonvolatile memory device 5610 may include a plurality of nonvolatile memory chips. The memory system 5600 may be a memory system 1000 or 2000 described with reference to FIG. 47 or 48.

In FIG. 51, there is illustrated the case that a nonvolatile memory device 5610 is connected to the system bus 5500 via a controller 5620. However, the nonvolatile memory device 5610 can be electrically connected directly to the system bus 5500.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a nonvolatile memory device including a ground select transistor, a first dummy memory cell, a plurality of memory cells, and a second dummy memory cell stacked sequentially along a direction perpendicular to a substrate, the method comprising:
applying an erase voltage to the substrate;
floating a ground select line that is connected to the ground select transistor responsive to the erase voltage reaching a first voltage;
floating a first dummy word line that is connected to the first dummy memory cell responsive to the erase voltage reaching a second voltage; and
floating a second dummy word line that is connected to the second dummy memory cell responsive to the erase voltage reaching a third voltage.

2. The method of claim 1, further comprising: before applying the erase voltage to the substrate,
applying a word line erase voltage to word lines that are connected to the plurality of memory cells; and
applying an initial voltage to the ground selection transistor, the first and second dummy memory cells.

3. The method of claim 1, wherein the ground select line, the first and second dummy word lines are floated after applying the erase voltage to the substrate.

4. The method of claim 3, wherein the first voltage is different from the second voltage.

5. The method of claim 3, wherein the first voltage is different from the third voltage.

6. The method of claim 1, wherein the nonvolatile memory device further includes a string select transistor that is connected between the second dummy memory cell and a bit line that is stacked sequentially along a direction perpendicular to the substrate, the method further comprising:
floating a string select line that is connected to the string select transistor when the erase voltage reaches a fourth voltage.

7. The method of claim 6, further comprising: before applying the erase voltage to the substrate,
applying a word line erase voltage to word lines that are connected to the plurality of memory cells; and
applying an initial voltage to the ground select transistor, the string select transistor, the first and second dummy memory cells.

8. The method of claim 7, wherein the first voltage is different from the fourth voltage.

9. The method of claim 7, wherein the fourth voltage is different from the second voltage.

10. The method of claim 7, wherein the fourth voltage is different from the third voltage.

11. A method of operating a nonvolatile memory device including a ground select transistor, a first dummy memory cell, a second dummy memory cell, and a plurality of memory cells stacked sequentially along a direction perpendicular to a substrate, the method comprising:
applying a word line erase voltage to word lines that are connected to the plurality of memory cells, respectively;
applying constant voltages to a ground select line that is connected to the ground select transistor, to a first dummy word line that is connected to the first dummy memory cell, and to a second dummy word line that is connected to the second dummy memory cell, respectively;
applying an erase voltage to the substrate;
floating the ground select line responsive to the erase voltage reaching a first voltage; and
floating the first dummy word line responsive to the erase voltage reaching a second voltage.

12. The method of claim 11, wherein the constant voltages applied to the ground select line and the first dummy word line are voltages sufficient to turn off the ground selection transistor and the first dummy memory cell, respectively.

13. The method of claim 11, wherein floating the ground select line and floating the first dummy word line are performed after applying the erase voltage to the substrate.

14. The method of claim 11, wherein the first voltage is different from the second voltage.

15. A method of operating a nonvolatile memory device including a ground select transistor, a first dummy memory cell, a plurality of memory cells, a second dummy memory cell, and a string select transistor stacked sequentially along a direction perpendicular to a substrate, the method comprising:
- applying a word line erase voltage to word lines that are connected to the plurality of memory cells, respectively;
- applying constant voltages to a ground select line that is connected to the ground select transistor, to a first dummy word line that is connected to the first dummy memory cell, to a second dummy word line that is connected to the second dummy memory cell, and to a string select line that is connected to the string select transistor respectively;
- applying an erase voltage to the substrate;
- floating the ground select line responsive to the erase voltage reaching a first voltage;
- floating the first dummy word line responsive to the erase voltage reaching a second voltage; and
- floating the second dummy word line responsive to the erase voltage reaching a third voltage.

16. The method of claim 15, wherein the constant voltages applied to the ground select line, the first and second dummy word lines are voltages that are sufficient to turn off the ground selection transistor, and the first and second dummy memory cells, respectively.

17. The method of claim 15, wherein floating the ground select line, floating the first dummy word line and floating the second dummy word line are performed after applying an erase voltage to the substrate.

18. The method of claim 15, wherein the first voltage is different from the second voltage or the third voltage.

19. The method of claim 15, wherein the nonvolatile memory device further includes a third dummy memory cell that is between the first dummy memory cell and the plurality of memory cells, and a fourth dummy memory cell that is between the plurality of memory cells and the second dummy memory cell stacked sequentially along a direction perpendicular to the substrate, the method further comprising:
- applying constant voltages to a third dummy word line that is connected to the third dummy memory cell and a fourth dummy word line that is connected to the fourth dummy memory cell.

20. The method of claim 19, wherein the constant voltages applied to the third dummy word line and the fourth dummy word line are maintained after applying the erase voltage to the substrate.

* * * * *